US012809253B2

(12) United States Patent
Aridomi

(10) Patent No.: US 12,809,253 B2
(45) Date of Patent: Nov. 24, 2026

(54) PHOTOSENSITIVE TRANSFER MATERIAL, LIGHT SHIELDING MATERIAL, LED ARRAY, AND ELECTRONIC APPARATUS

(71) Applicant: FUJIFILM Corporation, Tokyo (JP)

(72) Inventor: Takashi Aridomi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 855 days.

(21) Appl. No.: 17/874,757

(22) Filed: Jul. 27, 2022

(65) Prior Publication Data

US 2023/0097968 A1 Mar. 30, 2023

(30) Foreign Application Priority Data

Jul. 30, 2021 (JP) ................................. 2021-126196

(51) Int. Cl.

| | |
|---|---|
| ***G03F 7/00*** | (2006.01) |
| ***G02B 5/00*** | (2006.01) |
| ***G03F 7/027*** | (2006.01) |
| ***H10H 20/855*** | (2025.01) |
| ***H10P 72/70*** | (2026.01) |

(52) U.S. Cl.

CPC ........... *G03F 7/0007* (2013.01); *G02B 5/003* (2013.01); *G03F 7/027* (2013.01); *H10H 20/855* (2025.01); *H10P 72/74* (2026.01); *H10P 72/7432* (2026.01); *H10P 72/7442* (2026.01)

(58) Field of Classification Search

CPC ......... G03F 7/0007; G03F 7/027; G03F 7/028
See application file for complete search history.

(56) References Cited

U.S. PATENT DOCUMENTS 10,031,631 B2 * 7/2018 Kanna .................. C09D 123/06
10,146,129 B2 * 12/2018 Kim ..................... H10K 59/122
10,507,630 B2 * 12/2019 Kanna ..................... B32B 27/20
10,578,966 B2 * 3/2020 Takishita ................ G03F 7/105
10,649,590 B2 * 5/2020 Toyooka ............... B32B 27/365
2002/0045128 A1 4/2002 Nakamura et al.
2002/0109449 A1 8/2002 Reed
2005/0164118 A1 7/2005 Barholm-Hansen et al.
2008/0055521 A1 * 3/2008 Mizutani .............. G02B 5/3016
349/194
2016/0282716 A1 9/2016 Lee et al.
2017/0263663 A1 9/2017 Nagase et al.
2017/0298239 A1 10/2017 Yamanaka et al.
2019/0094693 A1 3/2019 Aridomi et al.
2020/0019054 A1 * 1/2020 Gondaira ................ G03F 7/004
(Continued)

FOREIGN PATENT DOCUMENTS

CN 109416509 A * 3/2019 ............. G03F 7/027
CN 110178083 A * 8/2019 ............. C09B 57/00
(Continued)

OTHER PUBLICATIONS

Machine translation or JP 2000-122273 (no date) (Year: 0000).*
(Continued)

*Primary Examiner* — Amanda C. Walke
(74) *Attorney, Agent, or Firm* — Sughrue Mion, PLLC

(57) ABSTRACT

A photosensitive transfer material including a temporary support and a transfer layer including a photosensitive layer, in which the photosensitive layer has infrared curing properties, and a transmittance of the photosensitive layer to light having a wavelength of 830 nm is 0.1% or more.

23 Claims, 1 Drawing Sheet

(56) References Cited

U.S. PATENT DOCUMENTS

| | | | | |
|---|---|---|---|---|
| 2020/0026190 | A1 | 1/2020 | Maruyama et al. | |
| 2021/0036263 | A1* | 2/2021 | Kim | H10K 50/86 |
| 2022/0064444 | A1* | 3/2022 | Nara | G03F 7/40 |
| 2022/0092285 | A1 | 3/2022 | Tong et al. | |
| 2023/0102758 | A1* | 3/2023 | Aridomi | G03F 7/0388 430/285.1 |

FOREIGN PATENT DOCUMENTS

| | | | | | |
|---|---|---|---|---|---|
| CN | 112034650 | A | | 12/2020 | |
| JP | 2000-122273 | A | | 4/2000 | |
| JP | 2005148236 | A | * | 6/2005 | |
| JP | 2006003436 | A | * | 1/2006 | |
| JP | 2008164842 | A | * | 7/2008 | |
| JP | 4156784 | B2 | | 9/2008 | |
| JP | 2012047948 | A | * | 3/2012 | G02B 5/206 |
| JP | 2013-242537 | A | | 12/2013 | |
| JP | 2016-188994 | A | | 11/2016 | |
| JP | 2017-003751 | A | | 1/2017 | |
| JP | 2019-179201 | A | | 10/2019 | |
| JP | 2019191518 | A | * | 10/2019 | |
| JP | 2020- 016879 | A | | 1/2020 | |
| JP | 2020091322 | A | * | 6/2020 | |
| JP | 2020164749 | A | * | 10/2020 | |
| JP | 6840141 | B2 | | 3/2021 | |
| JP | 6879204 | B2 | * | 6/2021 | G03F 7/0007 |
| JP | 2021128313 | A | * | 9/2021 | |
| JP | 2022026335 | A | * | 2/2022 | |
| KR | 2002-0066979 | A | | 8/2002 | |
| TW | 201539130 | A | * | 10/2015 | C08F 2/50 |
| TW | 201802599 | A | * | 1/2018 | G02B 5/20 |
| TW | 201809865 | A | * | 3/2018 | G02B 5/20 |
| TW | 202133701 | A | * | 9/2021 | H05K 3/241 |
| WO | 2014/069197 | A1 | | 5/2014 | |
| WO | 2016/027798 | A1 | | 2/2016 | |
| WO | 2016/052641 | A1 | | 4/2016 | |
| WO | 2019/022169 | A1 | | 1/2019 | |
| WO | WO-2019102771 | A1 | * | 5/2019 | G03F 7/023 |
| WO | WO-2019194136 | A1 | * | 10/2019 | |
| WO | WO-2020203502 | A1 | * | 10/2020 | H05K 3/06 |
| WO | WO-2020241537 | A1 | * | 12/2020 | C03C 17/008 |

OTHER PUBLICATIONS

Machine translation of JP2020-164749 (no date) (Year: 0000).*
Machine translation of JP 2006-003436 (no date) (Year: 0000).*
Office Action issued Jan. 7, 2025 in Japanese Application No. 2021-126196.
Communication dated Jun. 3, 2025, issued in Japanese Application No. 2021-126196.
Communication dated May 12, 2026, issued in Japanese Application No. 2025-026594.
Communication dated Nov. 18, 2025, issued in Japanese Application No. 2025-026594.

* cited by examiner

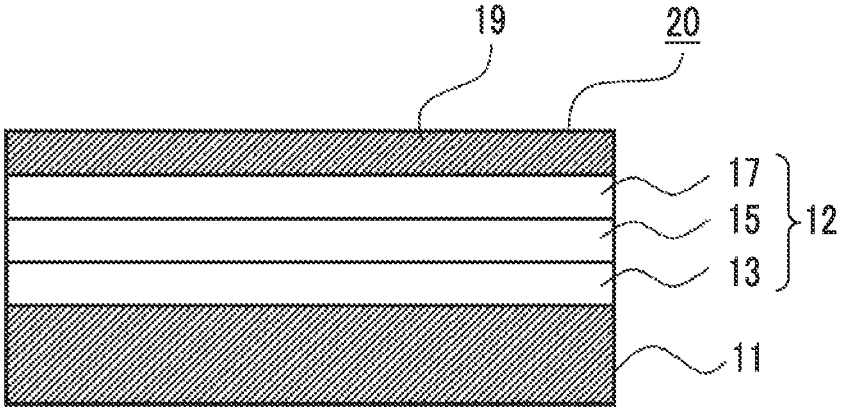
19
20
17
15
13
12
11

PHOTOSENSITIVE TRANSFER MATERIAL, LIGHT SHIELDING MATERIAL, LED ARRAY, AND ELECTRONIC APPARATUS

CROSS-REFERENCE TO RELATED APPLICATIONS

This application claims priority from Japanese Patent Application No. 2021-126196, filed Jul. 30, 2021, the disclosure of which is incorporated herein by reference in its entirety.

BACKGROUND OF THE INVENTION

1. Field of the Invention

The present disclosure relates to a photosensitive transfer material, a light shielding material, an LED array, and an electronic apparatus.

2. Description of the Related Art

From an aspect of low power consumption and environmental friendliness, a demand for light emitting diode (LED) has been increased explosively, and LED is widely adopted to a lighting device, a backlight of a liquid crystal display device, and a display device.

In addition, as a transfer film in the related art, a transfer film disclosed in JP6840141B is known.

JP6840141B discloses a transfer film including a temporary support and a photosensitive layer including solid contents of a photosensitive resin composition, the photosensitive resin composition containing a binder having a weight-average molecular weight of 4,000 to 25,000, a polymerization initiator having a content more than 0% by mass and less than 9% by mass with respect to a total solid content of the composition, a polymerizable monomer, and a pigment, in which the polymerizable monomer includes a difunctional polymerizable monomer (excluding nonaethylene glycol diacrylate), a ratio of a mass of the difunctional polymerizable monomer is 50% by mass or more with respect to a total mass of the polymerizable monomer, and the pigment is a black pigment.

Further, as a negative tone image recording material in the related art, a negative tone image recording material disclosed in JP4156784B is known.

JP4156784B discloses a negative tone image recording material for heat-mode, including (A) a cationic polymethine coloring agent having an oxidation potential of 0.45 V (vs. SCE) or less and having a positive charge for an infrared-absorbing chromophore, (b) an onium salt as a thermal radical generator, and (C) a radically polymerizable compound, in which the material is recordable by exposure with infrared ray irradiation.

SUMMARY OF THE INVENTION

In a case where a plurality of optical elements such as mini LED and micro LED are spread on a substrate, a light shielding layer is formed in order to suppress color mixing due to light. In the light shielding layer, the light shielding layer is patterned on a hole along a shape of a light emitting body of the optical element. Until now, the light shielding layer has been manufactured by a coating method such as ink jet, spin coating, and slit coating with black ink, but density unevenness due to a film thickness unevenness of a black ink layer has room for improvement in appearance. From the viewpoint of film thickness uniformity, it is also known that a light shielding layer is formed by forming a dry film of black ink and transferring the dry film (JP6840141B). However, in all light shielding materials, there is room for improvement in light leakage from a hole end part in a case the optical element such as LED emits light. As a result of various studies, the present inventor has found that the above-described light leakage is related to a rectangularity of the pattern of the light shielding layer.

An object to be achieved by one embodiment of the present invention is to provide a photosensitive transfer material with which a pattern having excellent rectangularity is obtained.

An object to be achieved by another embodiment of the present invention is to provide a light shielding material having a pattern having excellent rectangularity.

An object to be achieved by another embodiment of the present invention is to provide an LED array including the light shielding material and an electronic apparatus.

The methods for achieving the above-described objects include the following aspects.

<1> A photosensitive transfer material comprising:

a temporary support; and a transfer layer including a photosensitive layer, in which the photosensitive layer has infrared curing properties, and a transmittance of the photosensitive layer to light having a wavelength of 830 nm is 0.1% or more.

<2> The photosensitive transfer material according to <1>, in which an optical density of the photosensitive layer to light having a wavelength of 550 nm is 3.0 or more.

<3> The photosensitive transfer material according to <1> or <2>, in which the photosensitive layer includes a colorant.

<4> The photosensitive transfer material according to <3>, in which the colorant includes an organic pigment.

<5> The photosensitive transfer material according to any one of <1> to <4>, in which the photosensitive layer includes an infrared absorber and a polymerization initiator.

<6> The photosensitive transfer material according to <5>, in which the infrared absorber is an infrared absorbing dye.

<7> The photosensitive transfer material according to <5> or <6>, in which the infrared absorber is a polymethine coloring agent.

<8> The photosensitive transfer material according to any one of <5> to <7>, in which an oxidation potential of the infrared absorber is 0.45 V (vs. SCE) or less.

<9> The photosensitive transfer material according to any one of <5> to <8>, in which the polymerization initiator is an onium salt compound.

<10> The photosensitive transfer material according to <9>, in which the onium salt compound is at least one compound selected from the group consisting of a sulfonium salt compound and an iodonium salt compound.

<11> The photosensitive transfer material according to any one of <5> to <10>, in which the photosensitive layer further includes a polymerizable compound.

<12> The photosensitive transfer material according to <11>, in which the polymerizable compound includes a bifunctional polymerizable compound.

<13> The photosensitive transfer material according to <12>, in which a content of the bifunctional polymerizable compound is 50% by mass or more with respect to a total mass of the polymerizable compound.

<14> The photosensitive transfer material according to any one of <11> to <13>, in which the polymerizable compound includes a monomer having a bisphenol A skeleton.

<15> The photosensitive transfer material according to any one of <1> to <14>, in which the photosensitive layer includes a polymer having a crosslinkable group.

<16> The photosensitive transfer material according to any one of <1> to <15>, in which the photosensitive transfer material is a photosensitive transfer material for an LED array.

<17> A light shielding material comprising:

a resin layer having a first surface, a second surface which is a surface opposite to the first surface, and through-holes which extend from the first surface to the second surface, in which a transmittance of the resin layer to light having a wavelength of 830 nm is 0.1% or more.

<18> The light shielding material according to <17>, in which the through-holes are tiled in a thickness direction of the resin layer, and tilt angles formed by side surfaces of the through-holes and the first surface is 60° or more.

<19> The light shielding material according to <17> or <18>, in which an average value of sizes of the through-holes in the first surface is 50 μm or less.

<20> The light shielding material according to any one of <17> to <19>, in which an optical density of the resin layer to light having a wavelength of 550 nm is 3.0 or more.

<21> The light shielding material according to any one of <17> to <20>, in which the light shielding material is a light shielding material for an LED array.

<22> An electronic apparatus comprising:

the light shielding material according to any one of <17> to <20>.

<23> An LED array comprising:

the light shielding material according to <21>.

<24> An electronic apparatus comprising:

the LED array according to <23>.

According to one embodiment of the present invention, it is possible to provide a photosensitive transfer material with which a pattern having excellent rectangularity is obtained.

According to another embodiment of the present invention, it is possible to provide a light shielding material having a pattern having excellent rectangularity.

According to another embodiment of the present invention, it is possible to provide an LED array including the light shielding material and an electronic apparatus.

BRIEF DESCRIPTION OF THE DRAWINGS

FIG. 1 is a schematic view showing an example of a configuration of a photosensitive transfer material according to an embodiment of the present disclosure.

DESCRIPTION OF THE PREFERRED EMBODIMENTS

Hereinafter, the contents of the present disclosure will be described. Although the description will be made with reference to the accompanying drawings, the reference numerals may be omitted.

In addition, in the present specification, the numerical ranges shown using "to" indicate ranges including the numerical values described before and after "to" as the lower limit value and the upper limit value.

In addition, in the present specification, "(meth)acrylic" denotes either or both of acrylic and methacrylic, "(meth) acrylate" denotes either or both of acrylate and methacrylate, and "(meth)acryloyl" denotes either or both of acryloyl and methacryloyl.

Further, in the present specification, in a case where a plurality of substances corresponding to each component in a composition is present, the amount of each component in the composition means the total amount of the plurality of substances present in the composition, unless otherwise specified.

In the present specification, the term "step" includes not only the independent step but also a step in which intended purposes are achieved even in a case where the step cannot be precisely distinguished from other steps.

In a case where substitution or unsubstitution is not noted in regard to the notation of a "group" (atomic group) in the present specification, the "group" includes not only a group not having a substituent but also a group having a substituent. For example, an "alkyl group" not only includes an alkyl group not including a substituent (unsubstituted alkyl group), but also an alkyl group including a substituent (substituted alkyl group).

In the present specification, unless specified otherwise, "exposure" denotes not only exposure using light but also drawing using a corpuscular beam such as an electron beam or an ion beam. In addition, generally, examples of light used for the exposure include actinic rays or radiation such as a bright line spectrum of a mercury lamp, far ultraviolet rays typified by an excimer laser, extreme ultraviolet rays (EUV light), X-rays, and actinic ray (active energy ray) such as electron beam.

In addition, a chemical structural formula in the present specification may be described by a simplified structural formula in which hydrogen atoms are omitted.

In the present disclosure, "% by mass" has the same definition as that for "% by weight", and "part by mass" has the same definition as that for "part by weight".

In addition, in the present disclosure, a combination of two or more preferred aspects is a more preferred aspect.

In addition, the weight-average molecular weight (Mw) and the number-average molecular weight (Mn) in the present disclosure are molecular weights in terms of polystyrene used as a standard substance, which are detected by using a solvent tetrahydrofuran (THF), a differential refractometer, and a gel permeation chromatography (GPC) analyzer using TSKgel GMHxL, TSKgel G4000HxL, and TSKgel G2000HxL (all product names manufactured by Tosoh Corporation) as columns, unless otherwise specified.

In the present specification, a "total solid content" refers to a total mass of components obtained by removing a solvent from the whole composition of the composition. In addition, the "solid content" refers to components excluding the solvent as described above, and the components may be, for example, a solid or a liquid at 25° C.

Photosensitive Transfer Material

A photosensitive transfer material according to an embodiment of the present disclosure includes a temporary support and a transfer layer including a photosensitive layer, in which the photosensitive layer has infrared curing properties, and a transmittance of the photosensitive layer to light having a wavelength of 830 nm is 0.1% or more.

The photosensitive transfer material according to the embodiment of the present disclosure can be suitably used as a photosensitive transfer material for an LED array.

In the related art, a light shielding material, particularly a light shielding material used for an LED array or the like has poor light transparency and it is considered that an exposure light does not reach a deep portion of the resist, and curing properties, particularly the effect of the deep portion is not sufficient, so that there are many cases where there is a problem with a rectangularity of a pattern such as a through-hole.

In the photosensitive transfer material according to the embodiment of the present disclosure, since the above-described photosensitive layer has infrared curing properties and the transmittance of the photosensitive layer to light having a wavelength of 830 nm is 0.1% or more, the photosensitive transfer material according to the embodiment of the present disclosure has appropriate transparency to the light having a wavelength of 830 nm, so that it is presumed that curing properties are improved. In addition, compared to exposure with short-wave light such as a high pressure mercury lamp, the wavelength of light is longer, so that the refraction of light is suppressed. As a result, since it is considered that the exposure is more faithfully performed by the pattern, it is presumed that the obtained pattern is excellent in rectangularity.

Transmittance to Light Having Wavelength of 830 nm

In the photosensitive transfer material according to the embodiment of the present disclosure, the transmittance of the above-described photosensitive layer to light having a wavelength of 830 nm is 0.1% or more, and from the viewpoint of dense black appearance (suppression of reflected glare by reflected light from the outside, for example, suppression of reflected glare of fluorescent lamp), patterning properties (particularly, linearity and suppression of development residue), and rectangularity of the obtained pattern, the transmittance is preferably 0.15% to 30% and more preferably 0.20% to 20%.

Optical Density in Light Having Wavelength of 550 nm

In the photosensitive transfer material according to the embodiment of the present disclosure, from the viewpoint of dense black appearance, patterning properties, and rectangularity of the obtained pattern, an optical density of the above-described photosensitive layer in light having a wavelength of 550 nm is preferably 1.5 or more, more preferably 2.5 or more, still more preferably 3.0 or more, and particularly preferably 3.0 to 5.0.

In the present disclosure, the transmittance at each of the above-described wavelengths is measured using a spectrophotometer (UV-1800 manufactured by Shimadzu Corporation).

In the present disclosure, the above-described optical density is measured using a transmission densitometer (BMT-1 manufactured by SAKATA INX CORPORATION).

The photosensitive transfer material according to the embodiment of the present disclosure includes a transfer layer including a temporary support and a photosensitive layer.

In addition to the photosensitive layer, examples of the transfer layer include the photosensitive layer, the thermoplastic resin layer, the water-soluble resin layer, and the functional layer.

From the viewpoint of dense black appearance, patterning properties, and rectangularity of the obtained pattern, the photosensitive layer preferably includes a pigment, and more preferably includes an organic pigment.

In addition, from the viewpoint of pattern formability, dense black appearance, patterning properties, and rectangularity of the obtained pattern, the photosensitive layer preferably includes an infrared absorber and a polymerization initiator, more preferably includes a colorant, a polymerizable compound, an infrared absorber, and a polymerization initiator, and still more preferably a colorant, an alkali-soluble resin, a polymerizable compound, an infrared absorber, and a polymerization initiator.

In the photosensitive transfer material, the temporary support and the photosensitive layer may be directly laminated without interposing another layer, or may be laminated through another layer. In addition, another layer may be laminated on a surface of the photosensitive layer opposite to a surface facing the temporary support.

Examples of the layer other than the temporary support and the photosensitive layer include a thermoplastic resin layer, a water-soluble resin layer, a functional layer, and a protective film.

Examples of the embodiment of the photosensitive transfer material according to the present disclosure are shown below, but the present invention is not limited thereto.

(1) "temporary support/photosensitive layer/protective film"

(2) "temporary support/thermoplastic resin layer/photosensitive layer/protective film"

(3) "temporary support/functional layer/photosensitive layer/protective film"

(4) "temporary support/thermoplastic resin layer/functional layer/photosensitive layer/protective film"

In each of the above-described configurations, the photosensitive layer is preferably a negative tone photosensitive layer.

In the photosensitive transfer material, in a case of a configuration in which other layers are further provided on a side opposite to the temporary support side of the photosensitive layer, the total thickness of the other layers provided on the side opposite to the temporary support side of the photosensitive layer is preferably 0.1% to 30% and more preferably 0.1% to 20% with respect to the layer thickness of the photosensitive layer.

Hereinafter, the photosensitive transfer material will be described with an example.

A photosensitive transfer material 20 shown in FIG. 1 has a temporary support 11, a transfer layer 12 including a thermoplastic resin layer 13, a functional layer 15, and a photosensitive layer 17, and a protective film 19 in this order.

The photosensitive transfer material 20 shown in FIG. 1 has a form in which the protective film 19 is disposed, but the protective film 19 may not be disposed.

In addition, the photosensitive transfer material 20 shown in FIG. 1 has a form in which the thermoplastic resin layer 13 and the functional layer 15 are arranged, but the thermoplastic resin layer 13 and the functional layer 15 may not be arranged.

Hereinafter, each element constituting the photosensitive transfer material will be described.

Temporary Support

The photosensitive transfer material used in the present disclosure includes a temporary support.

The temporary support is a support which supports the photosensitive layer or a: laminate including the photosensitive layer, and can be peeled off.

From the viewpoint that, in a case where the photosensitive layer is exposed in a patterned manner, the photosensitive layer can be exposed through the temporary support, the temporary support preferably has light-transmitting property. In the present specification, the "has light-transmitting property" means that a transmittance of light having a wavelength used for the pattern exposure is 50% or more.

In the temporary support, from the viewpoint of improving exposure sensitivity of the photosensitive layer, the transmittance of light having a wavelength used for the pattern exposure (more preferably, a wavelength of 365 nm) is preferably 60% or more and more preferably 70% or more.

The transmittance of a layer including the photosensitive transfer material is a ratio of an intensity of emitted light emitted through the layer to an intensity of incidence ray in a case where light is incident in a direction perpendicular to a main surface of the layer (thickness direction), and is measured using MCPD Series manufactured by OTSUKA ELECTRONICS Co., Ltd.

Examples of a material constituting the temporary support include a glass substrate, a resin film, and paper, and from the viewpoint of strength, flexibility, and light-transmitting property, a resin film is preferable.

Examples of the resin film include a polyethylene terephthalate (PET) film, a cellulose triacetate film, a polystyrene film, a polyimide film, and a polycarbonate film. Among these, a PET film is preferable, and a biaxially stretched PET film is more preferable.

A thickness (layer thickness) of the temporary support is not particularly limited, but from the viewpoint of strength as a support, flexibility required for bonding to a substrate for forming a circuit wiring, and light-transmitting property required in the first exposing step, the thickness may be selected according to the material.

The thickness of the temporary support is preferably in a range of 5 μm to 100 μm, and from the viewpoint of ease of handling and general-purpose properties, more preferably in a range of 10 μm to 50 μm, still more preferably in a range of 10 μm to 35 μm, and particularly preferably in a range of 10 μm to 20 μm.

In addition, from the viewpoint of resolution and linearity in a case of exposing through the temporary support, the thickness of the temporary support is preferably 50 μm or less and more preferably 25 μm or less.

In addition, it is preferable that the film used as the temporary support does not have deformation such as wrinkles, scratches, and defects.

From the viewpoint of pattern formability during pattern exposure through the temporary support and transparency of the temporary support, it is preferable that the number of fine particles, foreign substances, defects, and deposits included in the temporary support is small. The number of fine particles, foreign substances, and defects having a diameter of 1 μm or more is preferably 50 pieces/10 $mm^2$ or less, more preferably 10 pieces/10 $mm^2$ or less, still more preferably 3 pieces/10 $mm^2$ or less, and particularly preferably 0 pieces/10 $mm^2$.

Preferred aspects of the temporary support are described in, for example, paragraphs 0017 and 0018 of JP2014-85643A, paragraphs 0019 to 0026 of JP2016-27363A, paragraphs 0041 to 0057 of WO2012/081680A, paragraphs 0029 to 0040 of WO2018/179370A, and paragraphs 0012 to 0032 of JP2019-101405A, and the contents of these publications are incorporated in the present specification.

Photosensitive Layer

The photosensitive transfer material according to the embodiment of the present disclosure includes an infrared curable photosensitive layer.

The photosensitive layer is a layer having infrared curing properties, that is, a layer which can be cured by infrared rays having at least a part of wavelengths in an infrared wavelength region (wavelength of more than 780 nm and 1 mm or less, preferably wavelength of more than 780 nm and 1,200 nm or less). Specifically, the photosensitive layer is a layer which can be cured by exposure using an IR-LD (wavelength: 830 nm) or a YAG laser (wavelength: 1,064 nm). In general, infrared laser has a low irradiation energy, so that it is preferable to expose the photosensitive layer using a high-power laser.

The photosensitive layer is preferably a negative tone photosensitive layer in which solubility of the exposed portion in a developer is reduced by exposure and the non-exposed portion is removed by development.

Hereinafter, each component will be described in order.

Colorant

From the viewpoint of dense black appearance, patterning properties, and rectangularity of the obtained pattern, the photosensitive layer preferably includes a colorant, and more preferably includes a pigment.

In addition, the above-described colorant is preferably a colorant different from an infrared absorber described later.

The colorant is not particularly limited, and a known pigment or a known dye can be used.

The pigment may be appropriately selected according to a desired hue, and can be selected from a black pigment, a white pigment, and a chromatic pigment other than black and white. Among these, from the viewpoint of dense black appearance, patterning properties, and rectangularity of the obtained pattern, it is preferable to include at least on pigment selected from the group consisting of a red pigment, a blue pigment, and a green pigment, it is more preferable to include a red pigment and a blue pigment, and it is particularly preferable to include a red organic pigment and a blue organic pigment.

Examples of the organic pigment include a phthalocyanine pigment, a dioxazine pigment, a quinacridone pigment, an anthraquinone pigment, a perylene pigment, an azo pigment, a diketopyrrolopyrrole pigment, a pyrolopyrrole pigment, an isoindoline pigment, a quinophthalone pigment, a triarylmethane pigment, a xanthene pigment, a methine pigment, and a quinoline pigment.

In addition, examples of the red pigment include C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294, 295, 296, and 297.

Examples of the blue pigment include C. I. Pigment Blue 1, 2, 15, 15:1, 15:2, 15:3, 15:4, 15:6, 16, 22, 29, 60, 64, 66, 79, 80, 87, and 88.

Examples of the green pigment include Color Index Pigment Green 7, 10, 36, 37, 58, 59. In addition, as another green pigment, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 may be further contained. Specific examples of such a halogenated zinc phthalocyanine pigment include compounds described in WO2015/118720A.

In a case where the red pigment and the blue pigment are used in combination, from the viewpoint of dense black appearance, patterning properties, and rectangularity of the obtained pattern, a mass ratio of a content of the red pigment and a content of the blue pigment in the photosensitive layer is preferably content of red pigment: content of blue pigment=3:1 to 1:3, more preferably 2:1 to 1:2, and particularly preferably 1.5:1 to 1:1.5.

From the viewpoint of dispersion stability, an average primary particle diameter of the pigment is preferably 0.005 μm to 1 μm, more preferably 0.01 μm to 0.5 μm, and particularly preferably 0.01 μm to 0.2 μm.

The average primary particle diameter of the pigment can be measured using a transmission electron microscope (TEM). As the transmission electron microscope, for example, a transmission electron microscope HT7700 manufactured by Hitachi High-Tech Corporation. can be used.

A maximum length (Dmax: a maximum length between two points on a contour of the particle image) and a length vertical to the maximum length (DV-max: in a case where an image is sandwiched between two straight lines parallel to the maximum length, the shortest length that vertically connects the two straight lines) of the particle image obtained using the transmission electron microscope are measured, and a geometric mean value thereof (Dmax×DV-max)½ is taken as a particle diameter. By measuring particle diameters of 100 or more particles by the method, the arithmetic average value thereof is defined as the average primary particle diameter of the pigment.

From the viewpoint of dense black appearance, patterning properties, and rectangularity of the obtained pattern, a content of the colorant is preferably 10% by mass to 70% by mass, more preferably 15% by mass to 60% by mass, and particularly preferably 15% by mass to 50% by mass with respect to the total mass of the photosensitive layer.

In a case where the photosensitive layer includes the pigment and the photosensitive layer is formed of a photosensitive resin composition, the pigment is preferably introduced into the photosensitive resin composition in a form of a pigment dispersion liquid.

The dispersion liquid may be prepared by adding a mixture obtained by previously mixing the pigment and a pigment dispersing agent to an organic solvent (or vehicle) and dispersing it with a disperser. The pigment dispersing agent may be selected according to the pigment and the solvent, and for example, a commercially available dispersing agent can be used. The vehicle refers to a part of a medium in which the pigment is dispersed in a case of being used as the pigment dispersion liquid, is liquid, and includes a binder component which maintains the pigment in a dispersed state and a solvent component (organic solvent) which dissolves and dilutes the binder component.

The disperser is not particularly limited, and examples thereof include known dispersers such as a kneader, a roll mill, an attritor, a super mill, a dissolver, a homomixer, and a sand mill. Further, the pigment may be finely pulverized by a mechanical grinding using frictional force. For the disperser and fine pulverization, the description of "Encyclopedia of Pigments" (First Edition, published by Asakura Shoten, 2000, p. 438, p. 310) can be referred to.

Infrared Absorber

From the viewpoint of dense black appearance, patterning properties, and rectangularity of the obtained pattern, the photosensitive layer preferably includes an infrared absorber.

The infrared absorber is not particularly limited, and examples thereof include pigments and dyes.

As the dye used as the infrared absorber, it is possible to use a commercially available dye and a known dye, for example, described in publications of "Dye Handbooks" (edited by the Society of Synthetic Organic Chemistry, Japan and published in 1970) and the like. Specific examples thereof include dyes such as an azo dye, a metal complex salt azo dye, a pyrazolone azo dye, a naphthoquinone dye, an anthraquinone dye, a phthalocyanine dye, a carbonium dye, a quinoneimine dye, a methine dye, a cyanine dye, a squarylium coloring agent, a pyrylium salt, and a metal thiolate complex.

Among these, from the viewpoint of dense black appearance, patterning properties, and rectangularity of the obtained pattern, an infrared absorbing dye is preferable, a polymethine coloring agent is more preferable, and a cyanine coloring agent is particularly preferable.

From the viewpoint of dense black appearance, patterning properties, and rectangularity of the obtained pattern, an oxidation potential of the infrared absorber is preferably 0.45 V (vs SCE) or less, more preferably 0.40 V (vs SCE) or less, still more preferably 0.35 V (vs SCE) or less.

In addition, although there is no specific lower limit to the oxidation potential of the infrared absorber, from the viewpoint of stability in a case of being used in combination with the polymerization initiator, 0.10 V (vs SCE) or more is preferable, and 0.15 V (vs SCE) or more is more preferable.

As such an infrared absorber, in order to reduce the oxidation potential, it is preferable to have an electron donating substituent in a chromophore of the infrared absorber, and examples of a preferred electron donating substituent include a substituent having a Hammett $\sigma_{para}$ value of −0.10 or less. Examples of a suitable substituent having $\sigma_{para}$ value of −0.10 include alkyl groups ($\sigma_{para}$ value is approximately −0.12 to −0.20) such as a methyl group, an ethyl group, and a propyl group, a hydroxy group ($\sigma_{para}$ value is −0.37), alkoxy groups ($\sigma_{para}$ value is approximately −0.24 to −0.45) such as a methoxy group, an ethoxy group, a propyloxy group, and a butoxy group, aryloxy groups ($\sigma_{para}$ value is approximately −0.32) such as a phenoxy group and a toluyloxy group, and (substituted) amino groups ($\sigma_{para}$ value is −0.50 to −0.35) such as an amino group, a methylamino group, an ethylamino group, a butylamino group, a dimethylamino group, a diethylamino group, a phenylamino group, a diphenylamino group, and an alkoxy group, a (substituted) amino group, or the like, which has a large electron donating property, is particularly preferable.

In addition, from the viewpoint of expanding a conjugated system of the chromophore and reducing the oxidation potential, examples of a preferred substituent also include a substituent having an aromatic group linked by a heteroatom. Examples of the heteroatom linking the aromatic group include nitrogen, oxygen, phosphorus, sulfur, and selenium, and particularly preferred examples of the heteroatom include sulfur. Examples of the aromatic group to be linked include hydrocarbon aromatic groups such as a phenyl group, a naphthyl group, and an anthranyl group, and heterocyclic groups such as a furyl group, a thienyl group, a pyrazolyl group, a triazolyl group, an indolyl group, and a benzothiazolyl group, and a heterocyclic group is particularly preferable. A substituent may be present on these aromatic group, and examples of a preferred substituent include the above-described substituents having a Hammett $\sigma_{para}$ value of −0.10 or less.

As the chromophore of the infrared absorber, from the viewpoint of absorption wavelength suitability, solubility, stability, potential characteristics, and the like, a polymethine coloring agent such as a cyanine coloring agent is preferable. Among these, a cyanine coloring agent is preferable, and from the viewpoint of absorption wavelength suitability and potential suitability, a heptamethine cyanine coloring agent having an indolenine skeleton, a benzoindolenine skeleton, a benzothiazole skeleton, a benzoxazole skeleton, or a benzselenazole skeleton is particularly preferable. In addition, these polymethine coloring agents are preferably a cationic coloring agent in which the chromophore has a positive charge.

Preferred examples of a coloring agent among the coloring agents having a chromophore as described above include a compound represented by Formula (D1) or Formula (D2).

(D1)

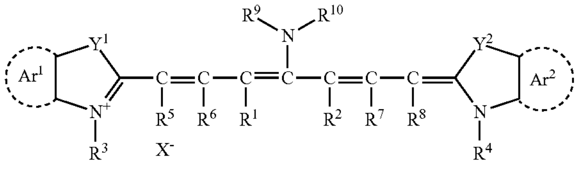

In Formula (D1), $R^1$ and $R^2$ each independently represent a hydrogen atom or a hydrocarbon group having 1 to 12 carbon atoms (number of carbon atoms), $R^1$ and $R^2$ may be bonded to each other to form a ring structure, and a ring to be formed is preferably a 5-membered ring or a 6-membered ring.

$Ar^1$ and $Ar^2$ each independently represent an aromatic hydrocarbon ring which may have a substituent. Examples of a preferred aromatic hydrocarbon ring include a benzene ring and a naphthalene ring. In addition, examples of a preferred substituent include a hydrocarbon group having 12 or less carbon atoms, a halogen atom, and an alkoxy group having 12 or less carbon atoms.

$Y^1$ and $Y^2$ each independently represent a sulfur atom or a dialkylmethylene group having 12 or less carbon atoms.

$R^3$ and $R^4$ each independently represent a hydrocarbon group having 20 or less carbon atoms, which may have a substituent. Examples of a preferred substituent include an alkoxy group having 12 or less carbon atoms, a carboxy group, and a sulfo group.

$R^5$ to $R^8$ each independently represent a hydrogen atom or a hydrocarbon group having 12 or less carbon atoms. From the viewpoint of availability of raw materials, a hydrogen atom is preferable.

$R^9$ and $R^{10}$ each independently represent an aromatic hydrocarbon group having 6 to 10 carbon atoms, which may have a substituent, an alkyl group having 1 to 8 carbon atoms, or a hydrogen atom, or $R^9$ and $R^{10}$ may be bonded to each other to form a ring having the following structure.

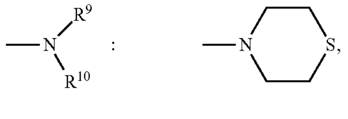

-continued

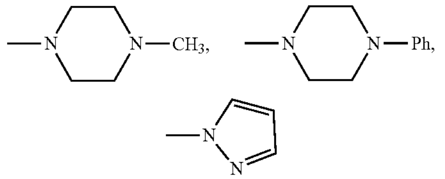

Among these, an aromatic hydrocarbon group such as a phenyl group is preferable.

In addition, $X^-$ represents a counter anion. However, in a case where any of $R^1$ to $R^8$ is substituted with a sulfo group, $X^-$ is not necessary. From the viewpoint of storage stability of a coating liquid, $X^-$ is preferably a halide ion, a perchlorate ion, a tetrafluoroborate ion, a hexafluorophosphate ion, or a sulfonic acid ion, and particularly preferably a perchlorate ion, a hexafluorophosphate ion, or a aryl sulfonic acid ion.

(D2)

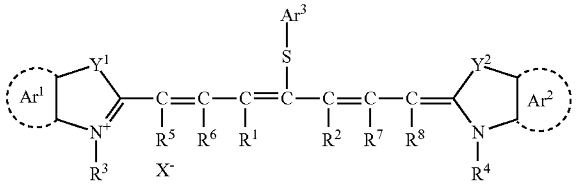

$R^1$ to $R^8$, $Ar^1$, $Ar^2$, $Y^1$, and $Y^2$ in Formula (D2) are the same as $R^1$ to $R^8$, $Ar^1$, $Ar^2$, $Y^1$, and $Y^2$ in Formula (D1) described above, respectively.

$Ar^3$ represents a monocyclic or polycyclic heterocyclic group having at least one atom of a nitrogen atom, an oxygen atom, or a sulfur atom, and a heterocyclic group selected from the group consisting of thiazole-based, benzothiazole-based, naphthozole-based, naphtho-7',6',4,5-thiazole-based, oxazole-based, benzoxazole-based, naphthoxazole-based, selenazole-based, benzoselenazole-based, naphthoselazole-based, thiazoline-based, 2-quinoline-based, 4-quinoline-based, 1-isoquinoline-based, 3-isoquinoline-based, benzoimidazole-based, 3,3-dialkylbenzoindolenine-based, 2-pyridine-based, 4-pyridine-based, 3,3-dialkylbenzo[e]indol-based, tetrazole-based, triazole-based, pyrimidine-based, and thiadiazole-based is preferable. Examples of a particularly preferred heterocyclic group include groups having the following structures.

$Ar^3$:

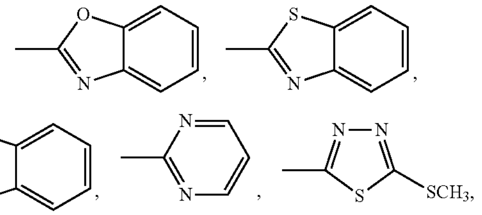

-continued

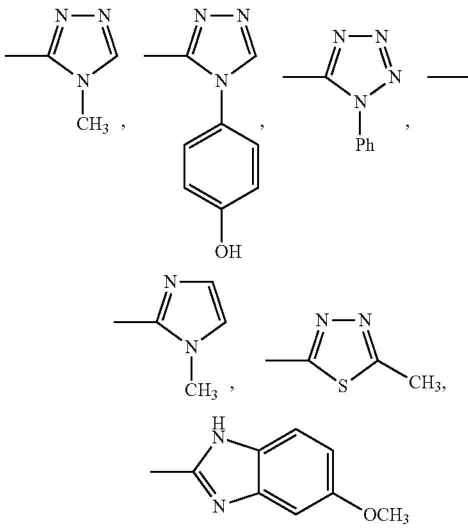

Among the coloring agents having a chromophore as described above, the compound represented by Formula (D1) is particularly preferable.

The oxidation potential of the infrared absorber in the present disclosure refers to an oxidation potential in which a value, which is measured by a potentiometry using a hydrogen electrode, a glass electrode, a quinhydrone electrode, or the like as an indicator electrode and using a saturated calomel electrode or a silver-silver chloride electrode as a reference electrode in a polar solvent such as acetonitrile and methanol, is converted to a value in terms of a normal calomel electrode.

In the present disclosure, specific examples of the infrared absorber which can be suitably used (IR-4 to IR-12) are shown below together with the oxidation potential thereof, but the present disclosure is not limited thereto. As conditions of the following measurement of the oxidation potential of the infrared absorber, a value, which is measured using a rotating disc electrode of Pt as the indicator electrode and using an Ag/AgCl (silver-silver chloride) counter electrode as the reference electrode in a polar solvent (0.1 M (=0.1 mol/L) $Et_4NClO_4$/acetonitrile (MeCN)) (Et represents an ethyl group), is converted to a value in terms of a normal calomel electrode as the reference electrode.

| Infrared absorber | Structure | Oxidation potiential (V vs. SCE) |
|---|---|---|
| IR-4 | 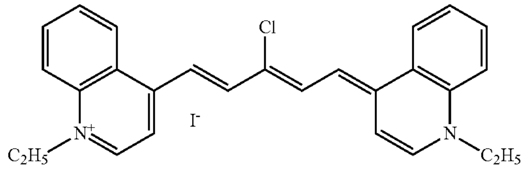 [SMILES: CCN1C=C\C(=C/C=C(Cl)/C=C/c2cc[n+](CC)c3ccccc23)c2ccccc21 ; [I-]] | 0.27 |
| IR-5 | 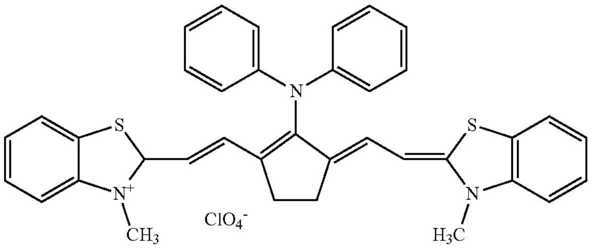 | 0.27 |
| IR-6 | 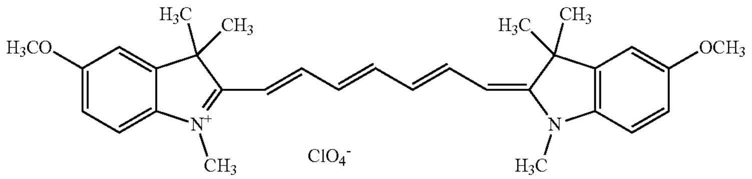 | 0.30 |
| IR-7 | 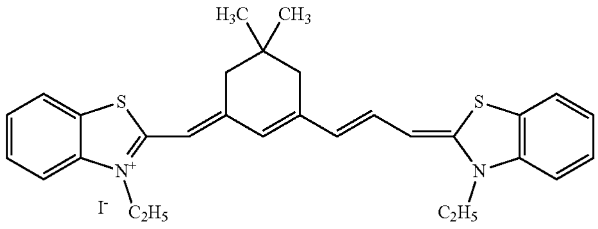 [SMILES: CCN1/C(=C/C=C/C2=CC(=C/c3sc4ccccc4[n+]3CC)/CC(C)(C)C2)Sc2ccccc21 ; [I-]] | 0.30 |

-continued

| Infrared absorber | Structure | Oxidation potiential (V vs. SCE) |
|---|---|---|
| IR-8 | 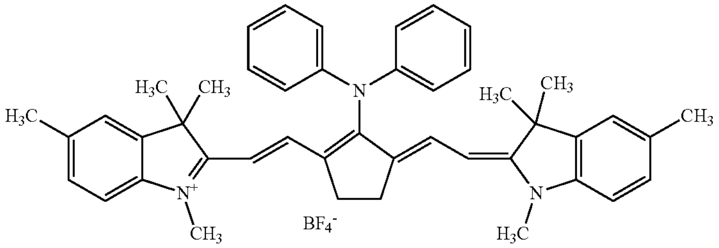 | 0.35 |
| IR-9 | 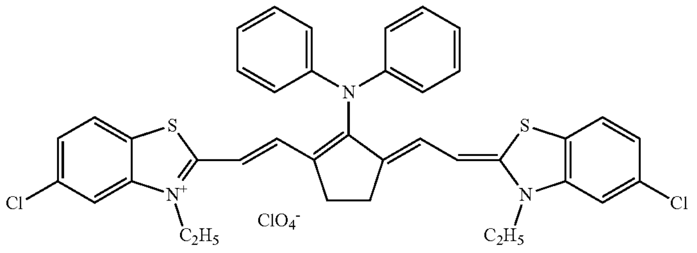 | 0.35 |
| IR-10 | 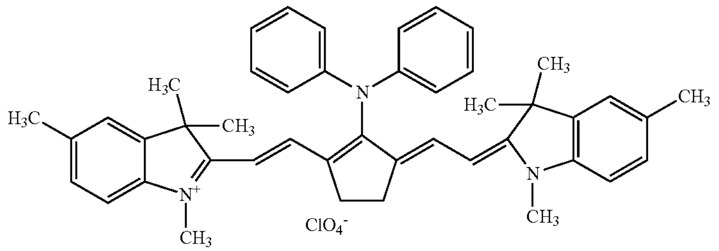 | 0.35 |
| IR-11 | 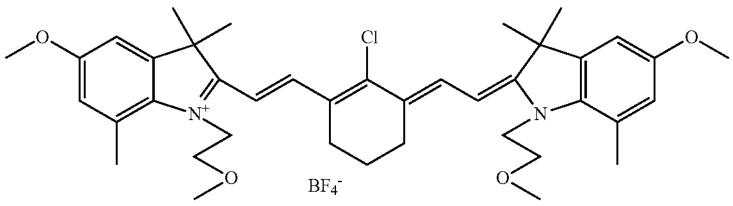 | 0.40 |
| IR-12 | 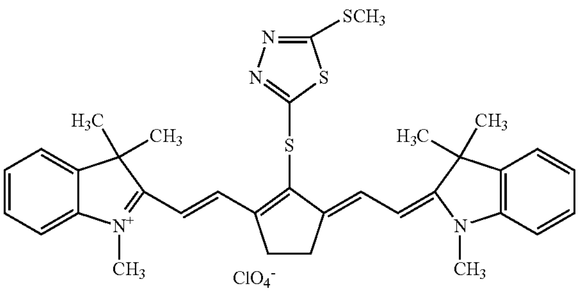 | 0.44 |

The infrared absorber may be used alone or in combination of two or more kinds thereof.

From the viewpoint of dense black appearance, patterning properties, and rectangularity of the obtained pattern, a content of the polymerizable compound in the photosensitive layer is preferably 0.01% by mass to 20% by mass, more preferably 0.05% by mass to 10% by mass, and particularly preferably 0.1% by mass to 5% by mass with respect to the total mass of the photosensitive layer.

Photopolymerization Initiator

The photosensitive layer preferably contains a photopolymerization initiator.

The photopolymerization initiator is a compound which initiates the polymerization of the ethylenically unsaturated compound by receiving actinic ray such as ultraviolet rays, visible rays, and X-rays. The photopolymerization initiator is not particularly limited, and a known photopolymerization initiator can be used. In addition, the photopolymerization initiator in the present disclosure also includes a sensitizer.

Examples of the photopolymerization initiator include a photoradical polymerization initiator and a photocationic polymerization initiator, and a photoradical polymerization initiator is preferable.

Examples of the photoradical polymerization initiator include a photopolymerization initiator having an oxime ester structure, a photopolymerization initiator having an α-aminoalkylphenone structure, a photopolymerization initiator having an α-hydroxyalkylphenone structure, a photopolymerization initiator having an acylphosphine oxide structure, a photopolymerization initiator having an N-phenylglycine structure, and a biimidazole compound.

From the viewpoint of dense black appearance, patterning properties, and rectangularity of the obtained pattern, the polymerization initiator is preferably an onium salt compound.

As the onium salt compound, from the viewpoint of dense black appearance, patterning properties, and rectangularity of the obtained pattern, at least one compound selected from the group consisting of a sulfonium salt compound and an iodonium salt compound is preferable, and an iodonium salt compound is more preferable.

Examples of the onium salt compound include a diazonium salt compound, an iodonium salt compound, a sulfonium salt compound, an ammonium salt compound, and a pyridinium salt compound. In the present disclosure, it is assumed that these onium salt compounds function as an ionic radical polymerization initiator rather than an acid generator.

An onium salt compound suitably used is an onium salt compound represented by Formulae (III) to (V).

$$Ar^{11}—I^{+}—Ar^{12} \quad Z^{11-} \qquad (III)$$

$$Ar^{11}—I^{+}—Ar^{12} \quad Z^{21-} \qquad (IV)$$

(V)

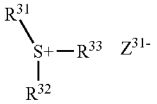

In Formula (III), $Ar^{11}$ and $Ar^{12}$ each independently represent an aryl group having 20 or less carbon atoms, which may have a substituent. As a preferred substituent in a case where this aryl group has a substituent, a halogen atom, a nitro group, an alkyl group having 12 or less carbon atoms, an alkoxy group having 12 or less carbon atoms, or an aryloxy group having 12 or less carbon atoms is preferable.

$Z^{11-}$ is preferably a counter ion selected from the group consisting of a halide ion, a perchlorate ion, a tetrafluoroborate ion, a hexafluorophosphate ion, and a sulfonic acid ion, and a perchlorate ion, a hexafluorophosphate ion, or a aryl sulfonic acid ion is preferable.

In Formula (IV), $Ar^{21}$ represents an aryl group having 20 or less carbon atoms, which may have a substituent. Examples of a preferred substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms.

$Z^{21-}$ represents a counter ion same as $Z^{11-}$.

In Formula (V), $R^{31}$ to $R^{33}$ each independently represent a hydrocarbon group having 20 or less carbon atoms, which may have a substituent. Examples of a preferred substituent include a halogen atom, a nitro group, an alkyl group having 12 or less carbon atoms, an alkoxy group having 12 or less carbon atoms, and an aryloxy group having 12 or less carbon atoms.

$Z^{31-}$ represents a counter ion same as $Z^{11-}$.

Specific examples of the onium salt compound represented by Formula (III) ([OI-1] to [OI-10]), the onium salt compound represented by Formula (IV) ([ON-1] to [ON-5]), and the onium salt compound represented by Formula (V) ([OS-1] to [OS-6]), which are suitably used in the present disclosure, are shown below.

[OI-1]

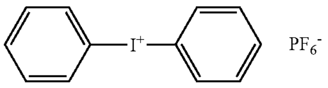

[OI-2]

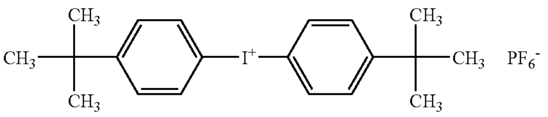

[OI-3]

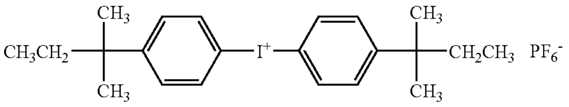

[OI-4]

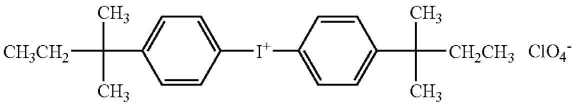

-continued
[OI-5]
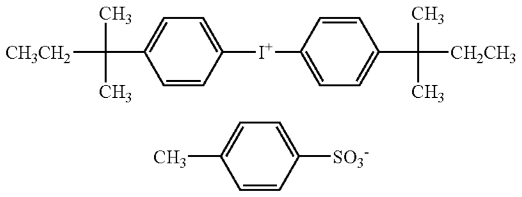
[OI-6]
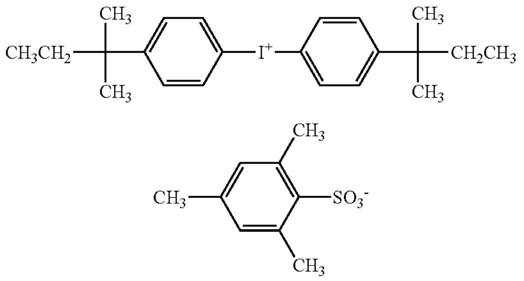
[OI-7]
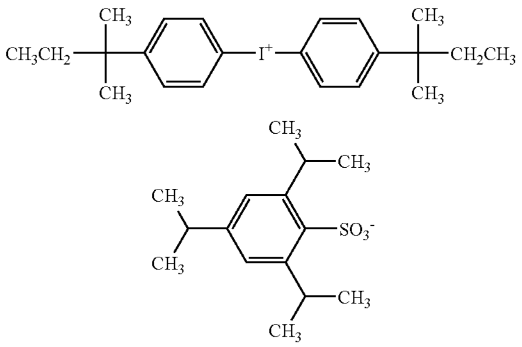
[OI-8]
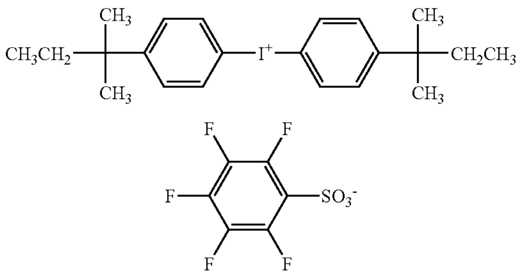
[OI-9]
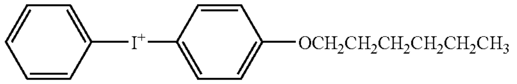
[OI-10]
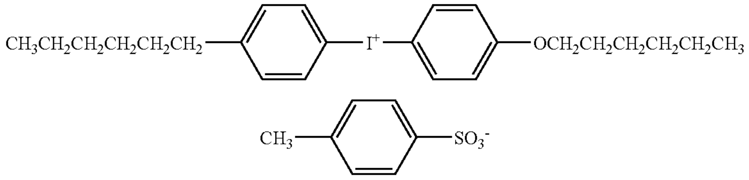
[ON-1]
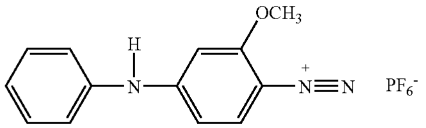
[ON-2]
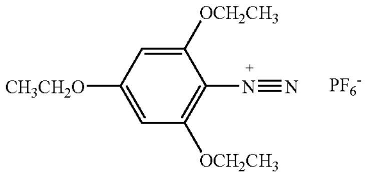
[ON-3]
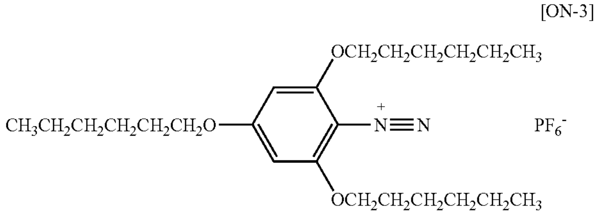
[ON-4]
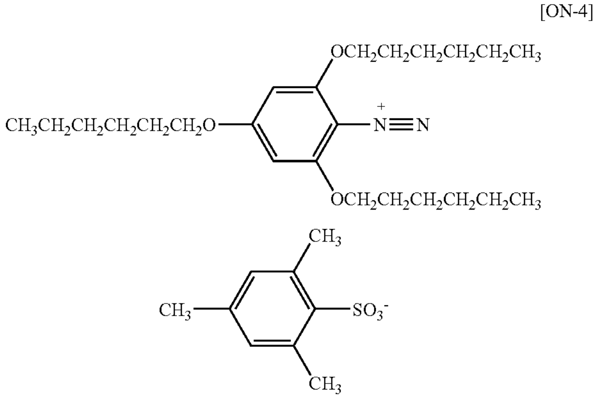

-continued

[ON-5]

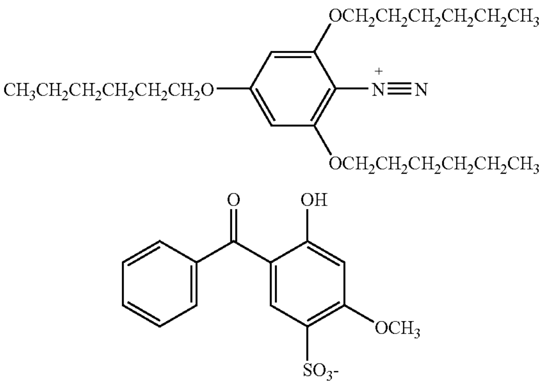

[OS-1]

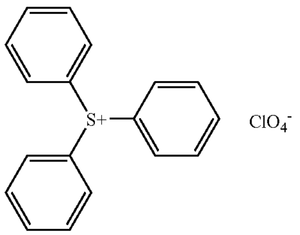

[OS-2]

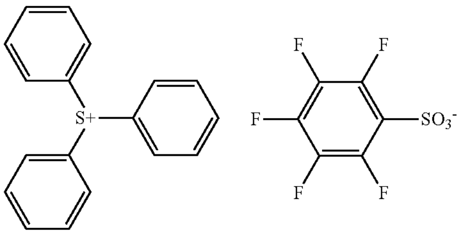

[OS-3]

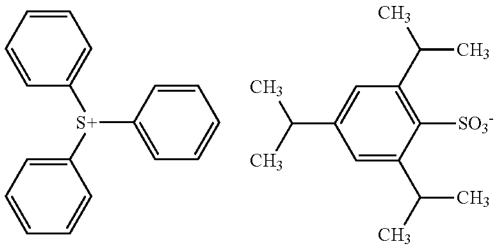

[OS-4]

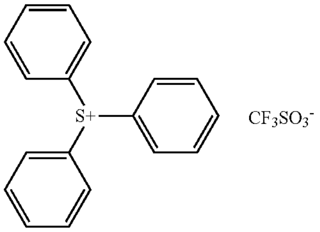

[OS-5]

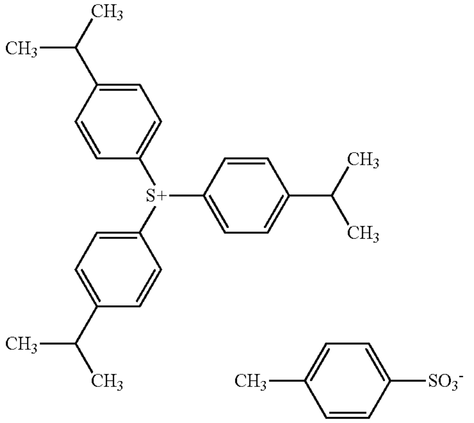

[OS-6]

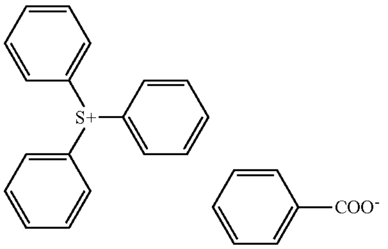

In addition, preferred examples of the biimidazole compound include a hexaaryl biimidazole compound.

Examples of the biimidazole compound include a 2-(o-chlorophenyl)-4,5-diphenylimidazole dimer, a 2-(o-chlorophenyl)-4,5-di(methoxyphenyl) imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer.

As the photopolymerization initiator, the photosensitive layer may contain one kind of biimidazole compound alone or two or more kinds thereof.

From the viewpoint of line width variation suppression, line width change with placing time, cross-sectional shape of the resin pattern, and sensitivity, a content of the above-described biimidazole compound is preferably 1% by mass or more, more preferably 2% by mass or more, still more preferably 3% by mass to 10% by mass, and particularly preferably 5% by mass to 10% by mass with respect to the total mass of the above-described photosensitive layer.

From the viewpoint of line width variation suppression, line width change with placing time, cross-sectional shape of the resin pattern, and sensitivity, the photopolymerization initiator preferably includes a benzophenone compound and more preferably includes a dialkylaminobenzophenone compound.

Examples of the benzophenone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or tetramethyl ester of benzophenone tetracarboxylic acid, 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-phenylbenzophenone, isophthalophenone, and 4-benzoyl-4'-methylphenylsulfide.

As the photopolymerization initiator, the photosensitive layer may contain one kind of benzophenone compound alone or two or more kinds thereof.

From the viewpoint of line width variation suppression, line width change with placing time, cross-sectional shape of the resin pattern, and sensitivity, a content of the above-described benzophenone compound is preferably 0.05% by mass to 5% by mass, more preferably 0.1% by mass to 2% by mass, still more preferably 0.2% by mass to 1.5% by mass, and particularly preferably 0.4% by mass to 0.8% by mass with respect to the total mass of the above-described photosensitive layer.

In addition, in a case where the biimidazole compound and the benzophenone compound are included as the photopolymerization initiator, from the viewpoint of line width variation suppression, line width change with placing time, cross-sectional shape of the resin pattern, and sensitivity, it is preferable that the content of the above-described benzophenone compound is smaller than the content of the above-described biimidazole compound.

As the photoradical polymerization initiator, for example, polymerization initiators described in paragraphs 0031 to 0042 of JP2011-95716A and paragraphs 0064 to 0081 of: JP2015-14783A may be used.

Examples of the photoradical polymerization initiator include dimethylaminobenzoate (DBE, CAS No. 10287-53-3), benzoin methyl ether, anisyl (p,p'-dimethoxybenzyl), TAZ-110 (product name; manufactured by Midori Kagaku Co., Ltd.), benzophenone, TAZ-111 (product name; manufactured by Midori Kagaku Co., Ltd.), Irgacure OXE01, OXE02, OXE03, and OXE04 (manufactured by BASF SE), Omnirad 651 and 369 (product name; manufactured by IGM Resins B.V.), and 2,2'-bis(2-chlorophenyl)-4,4',5,5'-tetraphenyl-1,2'-biimidazole (manufactured by Tokyo Chemical Industry Co., Ltd.).

Examples of a commercially available product of the photoradical polymerization initiator include 1-[4-(phenylthio)phenyl]-1,2-octanedione-2-(O-benzoyloxime) (product name: IRGACURE (registered trademark) OXE01, manufactured by BASF SE), 1-[9-ethyl-6-(2-methylbenzoyl)-9H-carbazol-3-yllethanone-1-(O-acetyloxime) (product name: IRGACURE OXE02, manufactured by BASF SE), IRGACURE OXE03 (manufactured by BASF SE), 2-(dimethylamino)-2-[(4-methylphenyl)methyl]-1-[4-(4-morpholinyl) phenyl]-1-butanone (product name: Omnirad 379EG, manufactured by IGM Resins B.V.), 2-methyl-1-(4-methylthiophenyl)-2-morpholinopropan-1-one (product name: Omnirad 907, manufactured by IGM Resins B.V.), 2-hydroxy-1-{4-[4-(2-hydroxy-2-methylpropionyl)benzyl]phenyl}-2-methylpropan-1-one (product name: Omnirad 127, manufactured by IGM Resins B.V.), 2-benzyl-2-dimethylamino-1-(4-morpholinophenyl) butanone-1 (product name: Omnirad 369, manufactured by IGM Resins B.V.), 2-hydroxy-2-methyl-1-phenylpropan-1-one (product name: Omnirad 1173, manufactured by IGM Resins B.V.), 1-hydroxy cyclohexyl phenyl ketone (product name: Omnirad 184, manufactured by IGM Resins B.V.), 2,2-dimethoxy-1,2-diphenylethan-1-one (product name: Omnirad 651, manufactured by IGM Resins B.V.), 2,4,6-trimethylbenzoyl-diphenylphosphine oxide (product name: Omnirad TPO H, manufactured by IGM Resins B.V.), bis(2,4,6-trimethylbenzoyl)phenylphosphine oxide (product name: Omnirad 819, manufactured IGM Resins B.V.), oxime ester-based photopolymerization initiator (product name: Lunar 6, manufactured by DKSH Management Ltd.), 2,2'-bis(2-chlorophenyl)-4,4',5,5'-tetraphenylbisimidazole (2-(2-chlorophenyl)-4,5-diphenylimidazole dimer) (product name: B-CIM, manufactured by Hampford Research Inc.), and 2-(o-chlorophenyl)-4,5-diphenylimidazole dimer (product name: BCTB, manufactured by Tokyo Chemical Industry Co., Ltd.).

The photocationic polymerization initiator (photoacid generator) is a compound which receives actinic ray to generate an acid. The photocationic polymerization initiator is preferably a compound which is sensitive to actinic ray having a wavelength of 300 nm or more, preferably 300 to 450 nm, and generates an acid, and a chemical structure thereof is not limited. In addition, a photocationic polymerization initiator which is not directly sensitive to actinic ray having a wavelength of 300 nm or more can also be preferably used in combination with a sensitizer as long as it is a compound which is sensitive to actinic ray having a wavelength of 300 nm or more and generates an acid by being used in combination with the sensitizer.

As the photocationic polymerization initiator, a photocationic polymerization initiator which generates an acid having a pKa of 4 or less is preferable, a photocationic polymerization initiator which generates an acid having a pKa of 3 or less is more preferable, and a photocationic polymerization initiator which generates an acid having a pKa of 2 or less is particularly preferable. The lower limit value of the pKa is not particularly limited, but is preferably −10.0 or more.

Examples of the photocationic polymerization initiator include an ionic photocationic polymerization initiator and a nonionic photocationic polymerization initiator. Examples of the ionic photocationic polymerization initiator include onium salt compounds such as diaryliodonium salts and triarylsulfonium salts, and quaternary ammonium salts.

As the ionic photocationic polymerization initiator, ionic photocationic polymerization initiators described in paragraphs 0114 to 0133 of JP2014-85643A may be used.

Examples of the nonionic photocationic polymerization initiator include trichloromethyl-s-triazines, a diazomethane compound, an imide sulfonate compound, and an oxime sulfonate compound. As the trichloromethyl-s-triazines, the diazomethane compound, and the imide sulfonate compound, compounds described in paragraphs 0083 to 0088 of JP2011-221494A may be used. In addition, as the oxime sulfonate compound, compounds described in paragraphs 0084 to 0088 of WO2018/179640A may be used.

The sensitizer is not particularly limited, and a known sensitizer, dye, or pigment can be used.

Examples of the sensitizer include a dialkylaminobenzophenone compound, a pyrazoline compound, an anthracene compound, a coumarin compound, a xanthone compound, a thioxanthone compound, an acridone compound, an oxazole compound, a benzoxazole compound, a thiazole compound, a benzothiazole compound, a triazole compound (for example, 1,2,4-triazole), stilbene compound, a triazine compound, a thiophene compound, a naphthalimide compound, a triarylamine compound, and an aminoacridine compound.

The photosensitive layer may contain one kind of photopolymerization initiator alone or two or more kinds thereof.

A content of the photopolymerization initiator in the photosensitive layer is not particularly limited, but is preferably 0.1% by mass or more and more preferably 0.5% by mass or more with respect to the total mass of the photosensitive layer. The upper limit is not particularly limited, but is preferably 10% by mass or less and more preferably 8% by mass or less with respect to the total mass of the photosensitive layer.

Alkali-Soluble Resin

The photosensitive layer preferably includes an alkali-soluble resin.

In the present specification, "alkali-soluble" means that the solubility in 100 g of aqueous solution of 1% by mass sodium carbonate at 22° C. is 0.1 g or more.

Examples of the alkali-soluble resin include a (meth) acrylic resin, a styrene resin, an epoxy resin, an amide resin, an amido epoxy resin, an alkyd resin, a phenol resin, an ester resin, a urethane resin, an epoxy acrylate resin obtained by a reaction of an epoxy resin and a (meth)acrylic acid, and acid-modified epoxy acrylate resin obtained by a reaction of an epoxy acrylate resin and acid anhydride.

From the viewpoint of excellent alkali developability and film formability, examples of one suitable aspect of the alkali-soluble resin include a (meth)acrylic resin.

In the present specification, the (meth)acrylic resin means a resin having a constitutional unit derived from a (meth) acrylic compound.

The content of the constitutional unit derived from a (meth)acrylic compound is preferably 50% by mass or more, more preferably 70% by mass or more, and still more preferably 90% by mass or more with respect to all constitutional units of the (meth)acrylic resin.

The (meth)acrylic resin may be composed of only the constitutional unit derived from a (meth)acrylic compound, or may have a constitutional unit derived from a polymerizable monomer other than the (meth)acrylic compound. That is, the upper limit of the content of the constitutional unit derived from a (meth)acrylic compound is 100% by mass or less with respect to all constitutional units of the (meth)acrylic resin.

Examples of the (meth)acrylic compound include (meth) acrylic acid, (meth)acrylic acid ester, (meth)acrylamide, and (meth)acrylonitrile.

Examples of the (meth)acrylic acid ester include (meth) acrylic acid alkyl ester, (meth)acrylic acid tetrahydrofurfuryl ester, (meth)acrylic acid dimethylaminoethyl ester, (meth) acrylic acid diethylaminoethyl ester, (meth)acrylic acid glycidyl ester, (meth)acrylic acid benzyl ester, 2,2,2-trifluoroethyl (meth)acrylate, and 2,2,3,3-tetrafluoropropyl (meth) acrylate, and (meth)acrylic acid alkyl ester is preferable.

Examples of the (meth)acrylamide include acrylamides such as diacetone acrylamide.

Examples of the (meth)acrylic acid alkyl ester include (meth)acrylic acid alkyl esters having an alkyl group having 1 to 12 carbon atoms, such as methyl (meth)acrylate, ethyl (meth)acrylate, propyl (meth)acrylate, butyl (meth)acrylate, pentyl(meth)acrylate, hexyl(meth)acrylate, heptyl(meth) acrylate, octyl (meth)acrylate, 2-ethylhexyl (meth)acrylate, nonyl(meth)acrylate, decyl(meth)acrylate, undecyl(meth) acrylate, and dodecyl (meth)acrylate.

As the (meth)acrylic acid ester, (meth)acrylic acid alkyl ester having an alkyl group having 1 to 4 carbon atoms is preferable, and methyl (meth)acrylate or ethyl (meth)acrylate is more preferable.

The (meth)acrylic resin may have a constitutional unit other than the constitutional unit derived from a (meth) acrylic compound.

The polymerizable monomer forming the above-described constitutional unit is not particularly limited as long as it is a compound other than the (meth)acrylic compound, which can be copolymerized with the (meth)acrylic compound, and examples thereof include styrene compounds which may have a substituent at an α-position or an aromatic ring, such as styrene, vinyltoluene, and α-methylstyrene, vinyl alcohol esters such as acrylonitrile and vinyl-n-butyl ether, maleic acid monoesters such as maleic acid, maleic acid anhydride, monomethyl maleate, monoethyl maleate, and monoisopropyl maleate, fumaric acid, cinnamic acid, α-cyanocinnamic acid, itaconic acid, and crotonic acid.

These polymerizable monomers may be used alone or in combination of two or more kinds thereof.

In addition, from the viewpoint of improving alkali developability, the (meth)acrylic resin preferably has a constitutional unit having an acid group. Examples of the acid group include a carboxy group, a sulfo group, a phosphoric acid group, and a phosphonic acid group.

Among these, the (meth)acrylic resin more preferably has a constitutional unit having a carboxy group, and still more preferably has a constitutional unit derived from the above-described (meth)acrylic acid.

From the viewpoint of excellent developability, the content of the constitutional unit having an acid group (preferably, the constitutional unit derived from (meth)acrylic acid) in the (meth)acrylic resin is preferably 10% by mass or more with respect to the total mass of the (meth)acrylic resin. In addition, the upper limit value thereof is not particularly limited, but from the viewpoint of excellent alkali resistance, is preferably 50% by mass or less and more preferably 40% by mass or less.

In addition, it is more preferable that the (meth)acrylic resin has a constitutional unit derived from the above-described (meth)acrylic acid alkyl ester.

The content of the constitutional unit derived from (meth) acrylic acid alkyl ester in the (meth)acrylic resin is preferably 50% by mass to 90% by mass, more preferably 60% by mass to 90% by mass, and still more preferably 65% by mass to 90% by mass with respect to all constitutional units of the (meth)acrylic resin.

As the (meth)acrylic resin, a resin having both the constitutional unit derived from (meth)acrylic acid and the constitutional unit derived from (meth)acrylic acid alkyl ester is preferable, and a resin composed only of the constitutional unit derived from (meth)acrylic acid and the constitutional unit derived from (meth)acrylic acid alkyl ester is more preferable.

In addition, as the (meth)acrylic resin, an acrylic resin which has a constitutional unit derived from methacrylic acid, a constitutional unit derived from methyl methacrylate, and a constitutional unit derived from ethyl acrylate is also preferable.

In addition, from the viewpoint that the effects in the present disclosure are more excellent, the (meth)acrylic resin preferably has at least one selected from the group consisting of a constitutional unit derived from methacrylic acid and a constitutional unit derived from methacrylic acid alkyl ester, and preferably has both the constitutional unit derived from methacrylic acid and the constitutional unit derived from methacrylic acid alkyl ester.

From the viewpoint that the effects in the present disclosure are more excellent, the total content of the constitutional unit derived from methacrylic acid and the constitutional unit derived from methacrylic acid alkyl ester in the (meth)acrylic resin is preferably 40% by mass or more and more preferably 60% by mass or more with respect to all constitutional units of the (meth)acrylic resin. The upper limit is not particularly limited, and may be 100% by mass or less, preferably 80% by mass or less.

In addition, from the viewpoint that the effects in the present disclosure are more excellent, it is also preferable that the (meth)acrylic resin has at least one selected from the group consisting of a constitutional unit derived from methacrylic acid and a constitutional unit derived from methacrylic acid alkyl ester, and has at least one selected from the group consisting of a constitutional unit derived from acrylic acid and a constitutional unit derived from acrylic acid alkyl ester.

From the viewpoint that the effects in the present disclosure are more excellent, the total content of the constitutional unit derived from methacrylic acid and the constitutional unit derived from methacrylic acid alkyl ester is preferably 60/40 to 80/20 in terms of mass ratio with respect to the total content of the constitutional unit derived from acrylic acid and the constitutional unit derived from acrylic acid alkyl ester.

From the viewpoint of excellent developability of the photosensitive layer after transfer, the (meth)acrylic resin preferably has an ester group at the terminal.

The terminal portion of the (meth)acrylic resin is composed of a site derived from a polymerization initiator used in the synthesis. The (meth)acrylic resin having an ester group at the terminal can be synthesized by using a polymerization initiator which generates a radical having an ester group.

In addition, from the viewpoint of developability, the alkali-soluble resin is preferably an alkali-soluble resin having an acid value of 60 mgKOH/g or more.

In addition, from the viewpoint that it is easy to form a strong film by thermally crosslinking with a crosslinking component by heating, for example, the alkali-soluble resin is more preferably a resin (so-called a carboxy group-containing resin) having an acid value of 60 mgKOH/g or more and having a carboxy group, and still more preferably a (meth)acrylic resin (so-called a carboxy group-containing (meth)acrylic resin) having an acid value of 60 mgKOH/g or more and having a carboxy group.

In a case where the alkali-soluble resin is a resin having a carboxy group, for example, the three-dimensional crosslinking density can be increased by adding a thermal crosslinking compound such as a blocked isocyanate compound and thermally crosslinking. In addition, in a case where the carboxy group of the resin having a carboxy group is anhydrous and hydrophobized, wet heat resistance can be improved.

The carboxy group-containing (meth)acrylic resin having an acid value of 60 mgKOH/g or more is not particularly limited as long as the above-described conditions of acid value are satisfied, and a known (meth)acrylic resin can be appropriately selected.

For example, a carboxy group-containing acrylic resin having an acid value of 60 mgKOH/g or more among polymers described in paragraph 0025 of JP2011-095716A, a carboxy group-containing acrylic resin having an acid value of 60 mgKOH/g or more among polymers described in paragraphs 0033 to 0052 of JP2010-237589A, and the like can be preferably used.

Examples of other suitable aspects of the alkali-soluble resin include a styrene-acrylic copolymer. In the present specification, the styrene-acrylic copolymer refers to a resin having a constitutional unit derived from a styrene compound and a constitutional unit derived from a (meth)acrylic compound, and the total content of the constitutional unit derived from a styrene compound and the constitutional unit derived from a (meth)acrylic compound is preferably 30% by mass or more and more preferably 50% by mass or more with respect to all constitutional units of the copolymer.

In addition, the content of the constitutional unit derived from a styrene compound is preferably 1% by mass or more, more preferably 5% by mass or more, and still more preferably 5% by mass to 80% by mass with respect to the all constitutional units of the above-described copolymer.

In addition, the content of the constitutional unit derived from the above-described (meth)acrylic compound is preferably 5% by mass or more, more preferably 10% by mass or more, and still more preferably 20% by mass to 95% by mass with respect to the all constitutional units of the above-described copolymer.

From the viewpoint that the effects in the present disclosure are more excellent, the alkali-soluble resin preferably has an aromatic ring structure, and more preferably has a constitutional unit having an aromatic ring structure.

Examples of a monomer forming the constitutional unit having an aromatic ring structure include styrene compounds such as styrene, tert-butoxystyrene, methylstyrene, and «-methylstyrene, and benzyl (meth)acrylate.

Among these, a styrene compound is preferable, and styrene is more preferable.

In addition, from the viewpoint that the effects in the present disclosure are more excellent, the alkali-soluble resin more preferably has a constitutional unit represented by Formula(S) (constitutional unit derived from styrene).

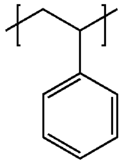
(S)

In a case where the alkali-soluble resin has the constitutional unit having an aromatic ring structure, from the viewpoint that the effects in the present disclosure are more excellent, the content of the constitutional unit having an aromatic ring structure is preferably 5% by mass to 90% by mass, more preferably 10% by mass to 70% by mass, and still more preferably 20% by mass to 60% by mass with respect to the all constitutional units of the alkali-soluble resin.

In addition, from the viewpoint that the effects in the present disclosure are more excellent, the content of the constitutional unit having an aromatic ring structure in the alkali-soluble resin is preferably 5 mol % to 70 mol %, more preferably 10 mol % to 60 mol %, and still more preferably 20 mol % to 60 mol % with respect to all constitutional units of the alkali-soluble resin.

Further, from the viewpoint that the effects in the present disclosure are more excellent, the content of the constitutional unit represented by Formula(S) in the alkali-soluble resin is preferably 5 mol % to 70 mol %, more preferably 10 mol % to 60 mol %, still more preferably 20 mol % to 60 mol %, and particularly preferably 20 mol % to 50 mol % with respect to all constitutional units of the alkali-soluble resin.

In the present specification, in a case where the content of a "constitutional unit" is defined by a molar ratio, the "constitutional unit" is synonymous with the "monomer unit". In addition, in the present specification, the "monomer unit" may be modified after polymerization by a polymer reaction or the like. The same applies to the following.

From the viewpoint that the effects in the present disclosure are more excellent, the alkali-soluble resin preferably has an aliphatic hydrocarbon ring structure. That is, the alkali-soluble resin preferably has a constitutional unit having an aliphatic hydrocarbon ring structure. Among these, the alkali-soluble resin more preferably has a ring structure in which two or more aliphatic hydrocarbon rings are fused.

Examples of a ring constituting the aliphatic hydrocarbon ring structure in the constitutional unit having an aliphatic hydrocarbon ring structure include a tricyclodecane ring, a cyclohexane ring, a cyclopentane ring, a norbornane ring, and an isophorone ring.

Among these, from the viewpoint that the effects in the present disclosure are more excellent, a ring in which two or more aliphatic hydrocarbon rings are fused is preferable, and a tetrahydrodicyclopentadiene ring (tricyclo[5.2.1.0$^{2,6}$]decane ring) is more preferable.

Examples of a monomer forming the constitutional unit having an aliphatic hydrocarbon ring structure include dicyclopentanyl (meth)acrylate, cyclohexyl (meth)acrylate, and isobornyl (meth)acrylate.

In addition, from the viewpoint that the effects in the present disclosure are more excellent, the alkali-soluble resin more preferably has a constitutional unit represented by Formula (Cy), and more preferably has the constitutional unit represented by Formula(S) and: the constitutional unit represented by Formula (Cy).

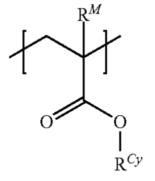

(Cy)

In Formula (Cy), $R^M$ represents a hydrogen atom or a methyl group, and $R^{Cy}$ represents a monovalent group having an aliphatic hydrocarbon ring structure.

$R^M$ in Formula (Cy) is preferably a methyl group.

From the viewpoint that the effects in the present disclosure are more excellent, $R^{Cy}$ in Formula (Cy) is preferably a monovalent group having an aliphatic hydrocarbon ring structure having 5 to 20 carbon atoms, more preferably a monovalent group having an aliphatic hydrocarbon ring structure having 6 to 16 carbon atoms, and still more preferably a monovalent group having an aliphatic hydrocarbon ring structure having 8 to 14 carbon atoms.

The aliphatic hydrocarbon ring structure in $R^{Cy}$ of Formula (Cy) may be a monocyclic structure or a polycyclic structure.

In addition, from the viewpoint that the effects in the present disclosure are more excellent, the aliphatic hydrocarbon ring structure in RX of Formula (Cy) is preferably a cyclopentane ring structure, a cyclohexane ring structure, a tetrahydrodicyclopentadiene ring structure, a norbornane ring structure, or an isophorone ring structure, more preferably a cyclohexane ring structure or a tetrahydrodicyclopentadiene ring structure, and still more preferably a tetrahydrodicyclopentadiene ring structure.

Further, from the viewpoint that the effects in the present disclosure are more excellent, the aliphatic hydrocarbon ring structure in $R^{Cy}$ of Formula (Cy) is preferably a ring structure in which two or more aliphatic hydrocarbon rings are fused, and more preferably a ring in which two to four aliphatic hydrocarbon rings are fused.

Further, from the viewpoint that the effects in the present disclosure are more excellent, $R^{Cy}$ in Formula (Cy) is preferably a group in which the oxygen atom in —C(=O)O— of Formula (Cy) and the aliphatic hydrocarbon ring structure are directly bonded, that is, an aliphatic hydrocarbon ring group, more preferably a cyclohexyl group or a dicyclopentanyl group, and still more preferably a dicyclopentanyl group.

The alkali-soluble resin may have one constitutional unit having an aliphatic hydrocarbon ring structure alone, or two or more kinds thereof.

In a case where the alkali-soluble resin has the constitutional unit having an aliphatic hydrocarbon ring structure, from the viewpoint that the effects in the present disclosure are more excellent, the content of the constitutional unit having an aliphatic hydrocarbon ring structure is preferably 5% by mass to 90% by mass, more preferably 10% by mass to 80% by mass, and still more preferably 20% by mass to 70% by mass with respect to the all constitutional units of the alkali-soluble resin.

In addition, from the viewpoint that the effects in the present disclosure are more excellent, the content of the constitutional unit having an aliphatic hydrocarbon ring structure in the alkali-soluble resin is preferably 5 mol % to 70 mol %, more preferably 10 mol % to 60 mol %, and still more preferably 20 mol % to 50 mol % with respect to all constitutional units of the alkali-soluble resin.

Further, from the viewpoint that the effects in the present disclosure are more excellent, the content of the constitutional unit represented by Formula (Cy) in the alkali-soluble resin is preferably 5 mol % to 70 mol %, more preferably 10 mol % to 60 mol %, and still more preferably 20 mol % to 50 mol % with respect to all constitutional units of the alkali-soluble resin.

In a case where the alkali-soluble resin includes the constitutional unit having an aromatic ring structure and the constitutional unit having an aliphatic hydrocarbon ring structure, from the viewpoint that the effects in the present disclosure are more excellent, the total content of the constitutional unit having an aromatic ring structure and the constitutional unit having an aliphatic hydrocarbon ring structure is preferably 10% by mass to 90% by mass, more preferably 20% by mass to 80% by mass, and particularly preferably 40% by mass to 75% by mass with respect to all constitutional units of the alkali-soluble resin.

In addition, from the viewpoint that the effects in the present disclosure are more excellent, the total content of the constitutional unit having an aromatic ring structure and the constitutional unit having an aliphatic hydrocarbon ring structure in the alkali-soluble resin is preferably 10 mol % to 80 mol %, more preferably 20 mol % to 70 mol %, and still more preferably 40 mol % to 60 mol % with respect to all constitutional units of the alkali-soluble resin.

Further, from the viewpoint that the effects in the present disclosure are more excellent, the total content of the constitutional unit represented by Formula(S) and the constitutional unit represented by Formula (Cy) in the alkali-soluble resin is preferably 10 mol % to 80 mol %, more: preferably 20 mol % to 70 mol %, and still more preferably 40 mol % to 60 mol % with respect to all constitutional units of the alkali-soluble resin.

In addition, from the viewpoint that the effects in the present disclosure are more excellent, a molar amount nS of the constitutional unit represented by Formula(S) and a molar amount nCy of the constitutional unit represented by Formula (Cy) in the alkali-soluble resin preferably satisfy the relationship shown in the following expression (SCy), more preferably satisfy the following expression (SCy-1), and still more preferably satisfy the following expression (SCy-2).

$0.2 \le nS/(nS+nCy) \le 0.8$ Expression (SCy)

$0.30 \le nS/(nS+nCy) \le 0.75$ Expression (SCy-1)

$0.40 \le nS/(nS+nCy) \le 0.70$ Expression (SCy-2)

From the viewpoint that the effects in the present disclosure are more excellent, the alkali-soluble resin preferably has a constitutional unit having an acid group.

Examples of the above-described acid group include a carboxy group, a sulfo group, a phosphonic acid group, and a phosphoric acid group, and a carboxy group is preferable.

As the above-described constitutional unit having an acid group, constitutional units derived from (meth)acrylic acid, which are shown below, is preferable, and a constitutional unit derived from methacrylic acid is more preferable.

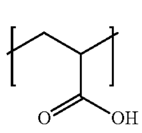

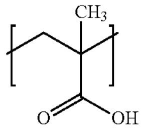

The alkali-soluble resin may have one constitutional unit having an acid group alone, or two or more kinds thereof.

In a case where the alkali-soluble resin has the constitutional unit having an acid group, from the viewpoint that the effects in the present disclosure are more excellent, the content of the constitutional unit having an acid group is preferably 5% by mass to 50% by mass, more preferably 5% by mass to 40% by mass, and still more preferably 10% by mass to 30% by mass with respect to the all constitutional units of the alkali-soluble resin.

In addition, from the viewpoint that the effects in the present disclosure are more excellent, the content of the constitutional unit having an acid group in the alkali-soluble resin is preferably 5 mol % to 70 mol %, more preferably 10 mol % to 50 mol %, and still more preferably 20 mol % to 40 mol % with respect to all constitutional units of the alkali-soluble resin.

Further, from the viewpoint that the effects in the present disclosure are more excellent, the content of the constitutional unit derived from (meth)acrylic acid in the alkali-soluble resin is preferably 5 mol % to 70 mol %, more preferably 10 mol % to 50 mol %, and still more preferably 20 mol % to 40 mol % with respect to all constitutional units of the alkali-soluble resin.

From the viewpoint that the effects in the present disclosure are more excellent, the alkali-soluble resin preferably has a crosslinkable group, and more preferably has a constitutional unit having a crosslinkable group.

In addition, from the viewpoint of strength of the obtained pattern, dense black appearance, patterning properties, and rectangularity of the obtained pattern, as the alkali-soluble resin, the photosensitive layer preferably includes a polymer having a crosslinkable group, and more preferably includes a polymer having a constitutional unit having a crosslinkable group.

As the crosslinkable group, a radically polymerizable group is preferable, and an ethylenically unsaturated group is more preferable. In addition, in a case where the alkali-soluble resin has an ethylenically unsaturated group, the alkali-soluble resin preferably has a constitutional unit having an ethylenically unsaturated group in a side chain.

In the present specification, the "main chain" represents a relatively longest binding chain in a molecule of a polymer compound constituting a resin, and the "side chain" represents an atomic group branched from the main chain.

As the ethylenically unsaturated group, an allyl group or a (meth)acryloxy group is more preferable.

Examples of the constitutional unit having a crosslinkable group include those shown below, but the constitutional unit having a crosslinkable group is not limited thereto.

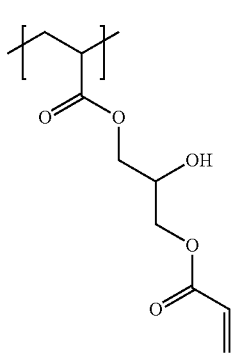

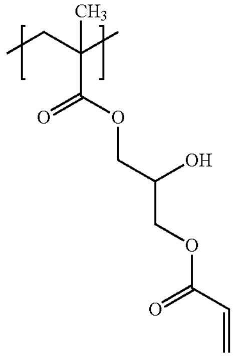

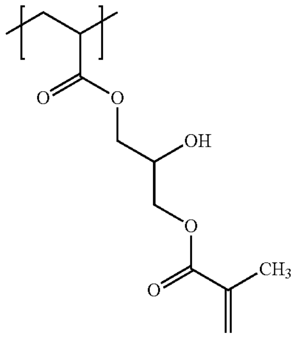

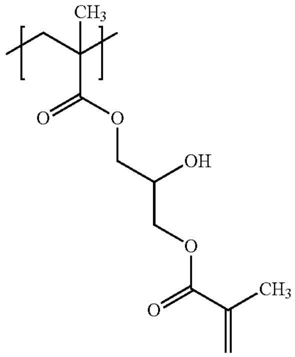

The alkali-soluble resin may have one constitutional unit having a crosslinkable group alone, or two or more kinds thereof.

In a case where the alkali-soluble resin has the constitutional unit having a crosslinkable group, from the viewpoint that the effects in the present disclosure are more excellent, the content of the constitutional unit having a crosslinkable group is preferably 5% by mass to 70% by mass, more preferably 10% by mass to 50% by mass, and still more preferably 20% by mass to 40% by mass with respect to the all constitutional units of the alkali-soluble resin.

In addition, from the viewpoint that the effects in the present disclosure are more excellent, the content of the constitutional unit having a crosslinkable group in the alkali-soluble resin is preferably 5 mol % to 70 mol %, more preferably 10 mol % to 60 mol %, and still more preferably 20 mol % to 50 mol % with respect to all constitutional units of the alkali-soluble resin.

Examples of a method for introducing the crosslinkable group into the alkali-soluble resin include a method of reacting a compound such as an epoxy compound, a blocked isocyanate compound, an isocyanate compound, a vinyl sulfone compound, an aldehyde compound, a methylol compound, and a carboxylic acid anhydride with a functional group such as a hydroxy group, a carboxy group, a primary amino group, a secondary amino group, an acetoacetyl group, and a sulfo group.

Preferred examples of the method for introducing the crosslinkable group into the alkali-soluble resin include a method in which a polymer having a carboxy group is synthesized by a polymerization reaction, and then a glycidyl (meth)acrylate is reacted with a part of the carboxy group of the obtained resin by a polymer reaction, thereby introducing a (meth)acryloxy group into the polymer. By this method, a alkali-soluble resin having a (meth)acryloxy group in the side chain can be obtained.

The above-described polymerization reaction is preferably carried out under a temperature condition of 70° C. to 100° C., and more preferably carried out under a temperature condition of 80° C. to 90° C. As a polymerization initiator used in the above-described polymerization reaction, an azo-based initiator is preferable, and for example, V-601 (product name) or V-65 (product name) manufactured by FUJIFILM Wako Pure Chemical Corporation is more preferable. The above-described polymer reaction is preferably carried out under a temperature condition of 80° C. to 110° C. In the above-described polymer reaction, it is preferable to use a catalyst such as an ammonium salt.

As the alkali-soluble resin, from the viewpoint that the effects in the present disclosure are more excellent, resins shown below are more preferable. Content ratios (a to d) and weight-average molecular weights Mw of each of the constitutional units shown below can be: appropriately changed according to the purpose.

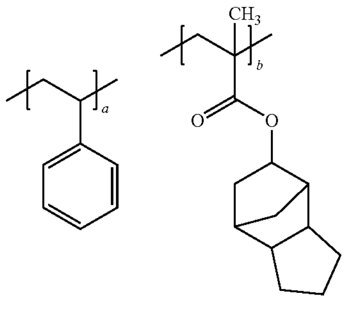

-continued

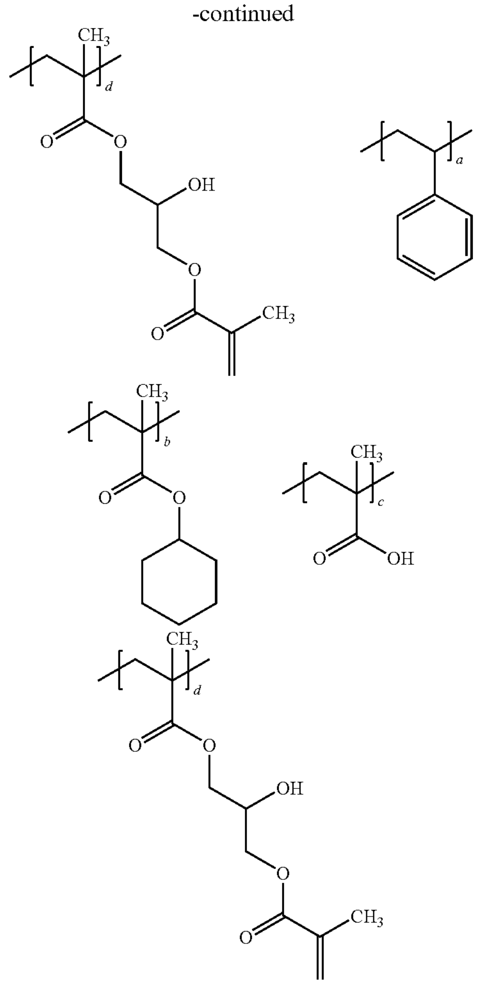

In addition, the alkali-soluble resin may include a polymer (hereinafter, also referred to as a "polymer X") having a constitutional unit having a carboxylic acid anhydride structure.

The carboxylic acid anhydride structure may be either a chain carboxylic acid anhydride structure or a cyclic carboxylic acid anhydride structure, and a cyclic carboxylic acid anhydride structure is preferable.

The ring of the cyclic carboxylic acid anhydride structure is preferably a 5-to 7-membered ring, more preferably a 5-membered ring or a 6-membered ring, and still more preferably a 5-membered ring.

The constitutional unit having a carboxylic acid anhydride structure is preferably a constitutional unit containing a divalent group obtained by removing two hydrogen atoms from a compound represented by Formula P-1 in a main chain, or a constitutional unit in which a monovalent group obtained by removing one hydrogen atom from a compound represented by Formula P-1 is bonded to the main chain directly or through a divalent linking group.

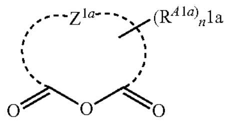

P-1

In Formula P-1, $R^{A1a}$ represents a substituent, $n^{1a}$ pieces of $R^{A1a}$'s may be the same or different, $Z^{1a}$ represents a divalent group forming a ring including —C(=O)—O—C(=O)—, and $n^{1a}$ represents an integer of 0 or more.

Examples of the substituent represented by $R^{A1a}$ include an alkyl group.

$Z^{1a}$ is preferably an alkylene group having 2 to 4 carbon atoms, more preferably an alkylene group having 2 or 3 carbon atoms, and still more preferably an alkylene group having 2 carbon atoms.

$n^{1a}$ represents an integer of 0 or more. In a case where $Z^{1a}$ represents an alkylene group having 2 to 4 carbon atoms, $n^{1a}$ is preferably an integer of 0 to 4, more preferably an integer of 0 to 2, and still more preferably 0.

In a case where $n^{1a}$ represents an integer of 2 or more, a plurality of $R^{A1a}$'s existing may be the same or different. In addition, the plurality of $R^{A1a}$'s existing may be bonded to each other to form a ring, but it is preferable that they are not bonded to each other to form a ring.

As the constitutional unit having a carboxylic acid anhydride structure, a constitutional unit derived from an unsaturated carboxylic acid anhydride is preferable, a constitutional unit derived from an unsaturated cyclic carboxylic acid anhydride is more preferable, a constitutional unit derived from an unsaturated aliphatic carboxylic acid anhydride is still more preferable, a constitutional unit derived from maleic anhydride or itaconic anhydride is particularly preferable, and a constitutional unit derived from maleic acid anhydride is most preferable.

Hereinafter, specific examples of the constitutional unit having a carboxylic acid anhydride structure will be described, but the constitutional unit having a carboxylic acid anhydride structure is not limited to these specific examples. In the following constitutional units, Rx represents a hydrogen atom, a methyl group, a $CH_2OH$ group, or a $CF_3$ group, and Me represents a methyl group.

Formula a2-1

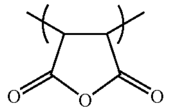

Formula a2-2

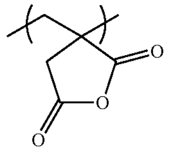

Formula a2-3

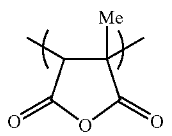

Formula a2-4

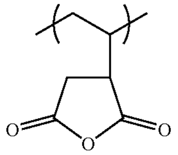

-continued

Formula a2-5

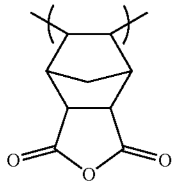

Formula a2-6

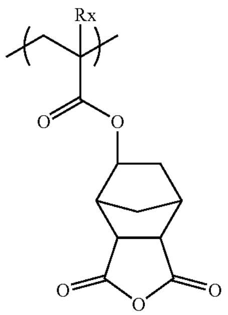

Formula a2-7

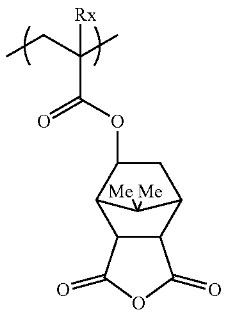

Formula a2-8

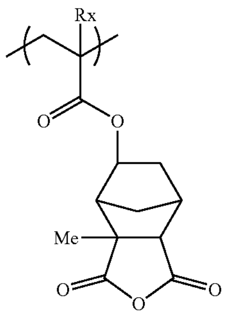

Formula a2-9

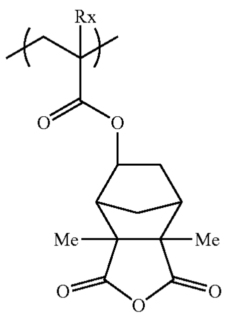

-continued
Formula a2-10
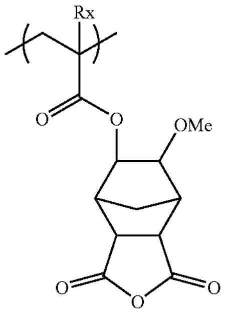
Formula a2-11
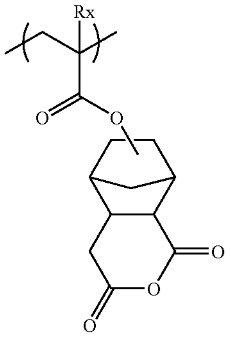
Formula a2-12
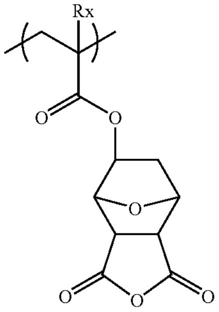
Formula a2-13
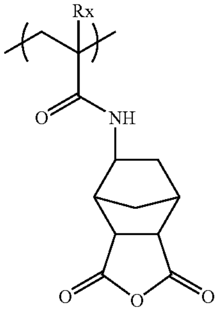
Formula a2-14
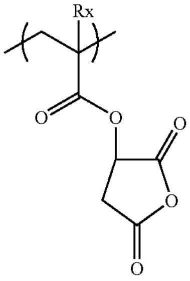
-continued
Formula a2-15
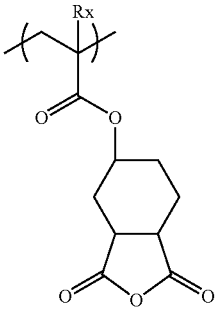
Formula a2-16
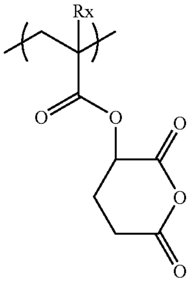
Formula a2-17
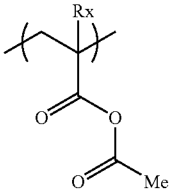
Formula a2-18
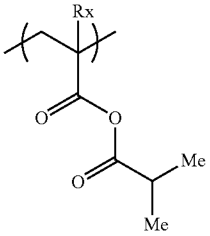
Formula a2-19
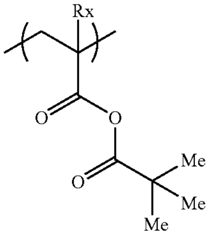
Formula a2-20
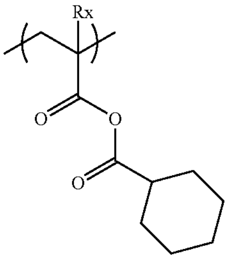

-continued

Formula a2-21

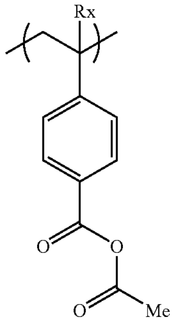

The polymer X may have one constitutional unit having a carboxylic acid anhydride structure alone, or two or more kinds thereof.

The total content of the constitutional unit having a carboxylic acid anhydride structure is preferably 0 mol % to 60 mol %, more preferably 5 mol % to 40 mol %, and still more preferably 10 mol % to 35 mol % with respect to all constitutional units of the polymer X.

The photosensitive layer may include only one kind of the polymer X, or may include two or more kinds thereof.

In a case where the photosensitive layer includes the polymer X, from the viewpoint that the effects in the present disclosure are more excellent, the content of the polymer X is preferably 0.1% by mass to 30% by mass, more preferably 0.2% by mass to 20% by mass, still more preferably 0.5% by mass to 20% by mass, and particularly preferably 1% by mass to 20% by mass with respect to the total mass of the photosensitive layer.

From the viewpoint that the effects in the present disclosure are more excellent, a weight-average molecular weight (Mw) of the alkali-soluble resin is preferably 5,000 or more, more preferably 10,000 or more, still more preferably 10,000 to 100,000, and particularly preferably 20,000 to 80,000.

An acid value of the alkali-soluble resin is preferably 10 mgKOH/g to 200 mgKOH/g and more preferably 60 mgKOH/g to 200 mgKOH/g.

The acid value of the alkali-soluble resin is a value measured according to the method described in JIS K0070: 1992.

The photosensitive layer may include only one kind of the alkali-soluble resin, or may include two or more kinds thereof.

From the viewpoint that the effects in the present disclosure are more excellent, a content of the alkali-soluble resin is preferably 10% by mass to 90% by mass, more preferably 20% by mass to 80% by mass, and still more preferably 30% by mass to 70% by mass with respect to the total mass of the photosensitive layer.

Polymerizable Compound

The photosensitive layer preferably includes a polymerizable compound.

In the present specification, the "polymerizable compound" means a compound which is polymerized by an action of the photopolymerization initiator which will be described later, and is different from the above-described alkali-soluble resin.

As the polymerizable compound, an ethylenically unsaturated compound is preferable.

As the ethylenically unsaturated group, a (meth)acryloxy group is preferable.

The ethylenically unsaturated compound in the present specification is a compound other than the above-described alkali-soluble resin, and preferably has a molecular weight of less than 5,000.

In addition, examples of a preferred aspect of the ethylenically unsaturated compound used in the second embodiment include the preferred aspect of the ethylenically unsaturated compound used in the first embodiment described above.

Examples of one suitable aspect of the ethylenically unsaturated compound include a compound represented by Formula (M) (simply referred to as a "compound M").

$$Q^2\text{-}R^1\text{-}Q^1 \quad \text{Formula (M)}$$

In Formula (M), $Q^1$ and $Q^2$ each independently represent a (meth)acryloyloxy group, and $R^1$ represents a divalent linking group having a chain structure.

From the viewpoint of easiness of synthesis, $Q^1$ and $Q^2$ in Formula (M) preferably have the same group.

In addition, from the viewpoint of reactivity, $Q^1$ and $Q^2$ in Formula (M) are preferably acryloyloxy groups.

From the viewpoint that the effects in the present disclosure are more excellent, $R^1$ in Formula (M) is preferably an alkylene group, an alkyleneoxyalkylene group ($-L^1-O-L^1-$), or a polyalkyleneoxyalkylene group ($-(L^1-O)_p-L^1-$), more preferably a hydrocarbon group having 2 to 20 carbon atoms or a polyalkyleneoxyalkylene group, still more preferably an alkylene group having 4 to 20 carbon atoms, and particularly preferably a linear alkylene group having 6 to 18 carbon atoms.

It is sufficient that the above-described hydrocarbon group has a chain structure at least in part, and a portion other than the chain structure is not particularly limited. For example, the portion may be a branched chain, a cyclic or a linear alkylene group having 1 to 5 carbon atoms, an arylene group, an ether bond, or a combination thereof, and an alkylene group or a group in which two or more alkylene groups and one or more arylene groups are combined is preferable, an alkylene group is more preferable, and a linear alkylene group is still more preferable.

The above-described $L^1$'s each independently represent an alkylene group, and an ethylene group, a propylene group, or a butylene group is preferable and an ethylene group or a 1,2-propylene group is more preferable. p represents an integer of 2 or more, and is preferably an integer of 2 to 10.

In addition, from the viewpoint that the effects in the present disclosure are more excellent, the number of atoms in the shortest linking chain which links $Q^1$ and $Q^2$ in the compound M is preferably 3 to 50, more preferably 4 to 40, still more preferably 6 to 20, and particularly preferably 8 to 12.

In the present specification, the "number of atoms in the shortest linking chain which links $Q^1$ and $Q^2$" is the shortest number of atoms linking from an atom in $R^1$ linked to $Q^1$ to an atom in $R^1$ linked to $Q^2$.

Specific examples of the compound M include 1,3-butanediol di(meth)acrylate, tetramethylene glycol di(meth)acrylate, neopentyl glycol di(meth)acrylate, 1,6-hexanediol di(meth)acrylate, 1,7-heptanediol di(meth)acrylate, 1,8-octanediol di(meth)acrylate, 1,9-nonanediol di(meth)acrylate, 1,10-decanediol di(meth)acrylate, 1,4-cyclohexanediol di(meth)acrylate, tricyclodecane dimethanol di(meth)acrylate, hydrogenated bisphenol A di(meth)acrylate, hydrogenated bisphenol F di(meth)acrylate, polyethylene glycol di(meth)acrylate, polypropylene glycol di(meth)acrylate, poly(ethylene glycol/propylene glycol)di(meth)acrylate, and polybutylene glycol di(meth)acrylate. The above-described ester monomers can also be used as a mixture.

Among the above-described compounds, from the viewpoint that the effects in the present disclosure are more excellent, at least one compound selected from the group consisting of 1,6-hexanediol di(meth)acrylate, 1,9-nonanediol di(meth)acrylate, 1,10-decanediol di(meth)acrylate, and neopentyl glycol di(meth)acrylate is preferable, at least one compound selected from the group consisting of 1,6-hexanediol di(meth)acrylate, 1,9-nonanediol di(meth)acrylate, and 1,10-decanediol di(meth)acrylate is more preferable, and at least one compound selected from the group consisting of 1,9-nonanediol di(meth)acrylate and 1,10-decanediol di(meth)acrylate is still more preferable.

In addition, examples of one suitable aspect of the ethylenically unsaturated compound include a bi-or higher functional ethylenically unsaturated compound.

In the present specification, the "bi-or higher functional ethylenically unsaturated compound" means a compound having two or more ethylenically unsaturated groups in one molecule.

As the ethylenically unsaturated group in the ethylenically unsaturated compound, a (meth)acryloyl group is preferable.

As the ethylenically unsaturated compound, a (meth) acrylate compound is preferable.

The bifunctional ethylenically unsaturated compound is not particularly limited and can be appropriately selected from a known compound.

Examples of the bifunctional ethylenically unsaturated compound other than the above-described compound M include tricyclodecane dimethanol di(meth)acrylate.

Examples of a commercially available product of the bifunctional ethylenically unsaturated compound include tricyclodecane dimethanol diacrylate (product name: NK ESTER A-DCP, manufactured by Shin-Nakamura Chemical Co., Ltd.), tricyclodecane dimethanol dimethacrylate (product name: NK ESTER DCP, manufactured by Shin-Nakamura Chemical Co., Ltd.), 1,9-nonanediol diacrylate (product name: NK ESTER A-NOD-N, manufactured by Shin-Nakamura Chemical Co., Ltd.), and 1,6-hexanediol diacrylate (product name: NK ESTER A-HD-N, manufactured by Shin-Nakamura Chemical Co., Ltd.).

The tri-or higher functional ethylenically unsaturated compound is not particularly limited and can be appropriately selected from a known compound.

Examples of the tri-or higher functional ethylenically unsaturated compound include dipentaerythritol (tri/tetra/penta/hexa)(meth)acrylate, pentaerythritol (tri/tetra)(meth) acrylate, trimethylolpropane tri(meth)acrylate, ditrimethylolpropane tetra(meth)acrylate, isocyanuric acid (meth) acrylate, and a (meth)acrylate compound of a glycerin tri(meth)acrylate skeleton.

Here, the "(tri/tetra/penta/hexa)(meth)acrylate" has a concept including tri(meth)acrylate, tetra(meth)acrylate, penta (meth)acrylate, and hexa(meth)acrylate, and the "(tri/tetra) (meth)acrylate" has a concept including tri(meth)acrylate and tetra(meth)acrylate.

Examples of the ethylenically unsaturated compound also include a caprolactone-modified compound of a (meth) acrylate compound (KAYARAD (registered trademark) DPCA-20 manufactured by Nippon Kayaku Co., Ltd., A-9300-1CL manufactured by Shin-Nakamura Chemical Co., Ltd., or the like), an alkylene oxide-modified compound of a (meth)acrylate compound (KAYARAD (registered trademark) RP-1040 manufactured by Nippon Kayaku Co., Ltd., ATM-35E or A-9300 manufactured by Shin-Nakamura Chemical Co., Ltd., EBECRYL (registered trademark) 135 manufactured by Daicel-Allnex Ltd., or the like), and ethoxylated glycerin triacrylate (NK ESTER A-GLY-9E manufactured by Shin-Nakamura Chemical Co., Ltd., or the like).

Examples of the ethylenically unsaturated compound also include a urethane (meth)acrylate compound.

Examples of the urethane (meth)acrylate include urethane di(meth)acrylate, and examples thereof include propylene oxide-modified urethane di(meth)acrylate and ethylene oxide and propylene oxide-modified urethane di(meth)acrylate.

In addition, examples of the urethane (meth)acrylate also include tri-or higher functional urethane (meth)acrylate. The lower limit of the number of functional groups is more preferably 6 or more and still more preferably 8 or more. The upper limit of the number of functional groups is preferably 20 or less. Examples of the tri-or higher functional urethane (meth)acrylate include 8UX-015A (manufactured by Taisei Fine Chemical Co., Ltd.), UA-32P (manufactured by Shin-Nakamura Chemical Co., Ltd.), U-15HA (manufactured by Shin-Nakamura Chemical Co., Ltd.), UA-1100H (manufactured by Shin-Nakamura Chemical Co., Ltd.), AH-600 (product name) manufactured by KYOEISHA CHEMICAL Co., LTD, UA-306H, UA-306T, UA-306I, UA-510H, and UX-5000 (all manufactured by Nippon Kayaku Co., Ltd.).

Examples of one suitable aspect of the ethylenically unsaturated compound include an ethylenically unsaturated compound having an acid group.

Examples of the acid group include a phosphoric acid group, a sulfo group, and a carboxy group.

Among these, as the acid group, a carboxy group is preferable.

Examples of the ethylenically unsaturated compound having an acid group include a tri-or tetra-functional ethylenically unsaturated compound having an acid group [component obtained by introducing a carboxy group to pentaerythritol tri- and tetra-acrylate (PETA) skeleton (acid value: 80 mgKOH/g to 120 mgKOH/g)), and a penta-to hexa-functional ethylenically unsaturated compound having an acid group [component obtained by introducing a carboxy group to dipentaerythritol penta- and hexa-acrylate (DPHA) skeleton (acid value: 25 mgKOH/g to 70 mgKOH/g)].

The tri-or higher functional ethylenically unsaturated compound having an acid group may be used in combination with the bifunctional ethylenically unsaturated compound having an acid group, as necessary.

As the ethylenically unsaturated compound having an acid group, at least one selected from the group consisting of bi-or higher functional ethylenically unsaturated compound having a carboxy group and a carboxylic acid anhydride thereof is preferable.

In a case where the ethylenically unsaturated compound having an acid group is at least one selected from the group consisting of bi-or higher functional ethylenically unsaturated compound having a carboxy group and a carboxylic acid anhydride thereof, developability and film hardness are further enhanced.

The bi-or higher functional ethylenically unsaturated compound having a carboxy group is not particularly limited and can be appropriately selected from a known compound.

Examples of the bi-or higher functional ethylenically unsaturated compound having a carboxy group include ARONIX (registered trademark) TO-2349 manufactured by Toagosei Co., Ltd., ARONIX (registered trademark) M-520 manufactured by Toagosei Co., Ltd., and ARONIX (registered trademark) M-510 manufactured by Toagosei Co., Ltd.

As the ethylenically unsaturated compound having an acid group, polymerizable compounds having an acid group, which are described in paragraphs 0025 to 0030 of JP2004-239942A, are preferable, and the contents described in this publication are incorporated in the present specification.

Examples of the ethylenically unsaturated compound also include a compound obtained by reacting a polyhydric alcohol with an α,β-unsaturated carboxylic acid, a compound obtained by reacting a glycidyl group-containing compound with an α,β-unsaturated carboxylic acid, urethane monomer such as a (meth)acrylate compound having a urethane bond, phthalate compounds such as γ-chloro-β-hydroxypropyl-β'-(meth)acryloyloxyethyl-o-phthalate, β-hydroxyethyl-β'-(meth)acryloyloxyethyl-o-phthalate, and β-hydroxypropyl-β'-(meth)acryloyloxyethyl-o-phthalate, and (meth)acrylic acid alkyl esters.

These compounds may be used alone or in combination of two or more kinds thereof.

Examples of the compound obtained by reacting a polyhydric alcohol with an α,β-unsaturated carboxylic acid include bisphenol A-based (meth)acrylate compounds such as 2,2-bis(4-((meth)acryloxypolyethoxy)phenyl) propane, 2,2-bis(4-((meth)acryloxypolypropoxy)phenyl) propane, and 2,2-bis(4-((meth)acryloxypolyethoxypolypropoxy)phenyl) propane, polyethylene glycol di(meth)acrylate having 2 to 14 ethylene oxide groups, polypropylene glycol di(meth) acrylate having 2 to 14 propylene oxide groups, polyethylene polypropylene glycol di(meth)acrylate having 2 to 14 ethylene oxide groups and 2 to 14 propylene oxide groups, trimethylolpropane di(meth)acrylate, trimethylolpropane tri (meth)acrylate, trimethylolpropane ethoxy tri(meth)acrylate, trimethylolpropane diethoxy tri(meth)acrylate, trimethylolpropane triethoxy tri(meth)acrylate, trimethylolpropane tetraethoxy tri(meth)acrylate, trimethylolpropane pentaethoxy tri(meth)acrylate, di(trimethylolpropane)tetraacrylate, tetramethylolmethane tri(meth)acrylate, tetramethylolmethane tetra(meth)acrylate, dipentaerythritol tetra(meth) acrylate, dipentaerythritol penta(meth)acrylate, and dipentaerythritol hexa(meth)acrylate.

Among these, an ethylenically unsaturated compound having a tetramethylolmethane structure or a trimethylolpropane structure is preferable, and tetramethylolmethane tri(meth)acrylate, tetramethylolmethane tetra(meth)acrylate, trimethylolpropane tri(meth)acrylate, or di(trimethylolpropane)tetraacrylate is more preferable.

Examples of the ethylenically unsaturated compound also include a caprolactone-modified compound of ethylenically unsaturated compound (for example, KAYARAD (registered trademark) DPCA-20 manufactured by Nippon Kayaku Co., Ltd., A-9300-1CL manufactured by Shin-Nakamura Chemical Co., Ltd., and the like), an alkylene oxide-modified compound of ethylenically unsaturated compound (for example, KAYARAD RP-1040 manufactured by Nippon Kayaku Co., Ltd., ATM-35E or A-9300 manufactured by Shin-Nakamura Chemical Co., Ltd., EBECRYL (registered trademark) 135 manufactured by Daicel-Allnex Ltd., and the like), and ethoxylated glycerin triacrylate (A-GLY-9E manufactured by Shin-Nakamura Chemical Co., Ltd., and the like).

Among these, as the ethylenically unsaturated compound, from the viewpoint of excellent developability of the photosensitive layer after transfer, an ethylenically unsaturated compound including an ester bond is also preferable.

The ethylenically unsaturated compound including an ester bond is not particularly limited as long as it includes an ester bond in the molecule, but from the viewpoint that the effects in the present disclosure are excellent, an ethylenically unsaturated compound having a tetramethylolmethane structure or a trimethylolpropane structure is preferable, and tetramethylolmethane tri(meth)acrylate, tetramethylolmethane tetra(meth)acrylate, trimethylolpropane tri(meth)acrylate, or di(trimethylolpropane)tetraacrylate is more preferable.

As the ethylenically unsaturated compound, from the viewpoint of imparting reliability, it is preferable to include an ethylenically unsaturated compound having an aliphatic group having 6 to 20 carbon atoms and the above-described ethylenically unsaturated compound having a tetramethylolmethane structure or a trimethylolpropane structure.

Examples of the ethylenically unsaturated compound having an aliphatic group having 6 to 20 carbon atoms include 1,9-nonanediol di(meth)acrylate, 1,10-decanediol di(meth) acrylate, and tricyclodecane dimethanol di(meth)acrylate.

Examples of one suitable aspect of the ethylenically unsaturated compound include an ethylenically unsaturated compound (preferably, a bifunctional ethylenically unsaturated compound) having an aliphatic hydrocarbon ring structure.

As the above-described ethylenically unsaturated compound, an ethylenically unsaturated compound having a ring structure in which two or more aliphatic hydrocarbon rings are fused (preferably, a structure selected from the group consisting of a tricyclodecane structure and a tricyclodecene structure) is preferable, a bifunctional ethylenically unsaturated compound having a ring structure in which two or more aliphatic hydrocarbon rings are fused is more preferable, and tricyclodecane dimethanol di(meth)acrylate is still more preferable.

As the above-described aliphatic hydrocarbon ring structure, from the viewpoint that the effects in the present disclosure are more excellent, a cyclopentane structure, a cyclohexane structure, a tricyclodecane structure, a tricyclodecene structure, a norbornane structure, or an isophorone structure is preferable.

Ethylenically Unsaturated Compound B1

The photosensitive layer preferably contains an ethylenically unsaturated compound B1 having an aromatic ring and two ethylenically unsaturated groups. The ethylenically unsaturated compound B1 is a bifunctional ethylenically unsaturated compound having one or more aromatic rings in one molecule among the above-described ethylenically unsaturated compounds.

In the photosensitive layer, from the viewpoint that the resolution is more excellent, a mass ratio of a content of the ethylenically unsaturated compound B1 to the content of the polymerizable compound is preferably 40% by mass or more, more preferably 50% by mass or more, still more preferably 55% by mass or more, and particularly preferably 60% by mass or more. The upper limit is not particularly limited, but from the viewpoint of peelability, preferably 99% by mass or less and more preferably 95% by mass or less.

Examples of the aromatic ring included in the ethylenically unsaturated compound B1 include aromatic hydrocarbon rings such as a benzene ring, a naphthalene ring, and an anthracene ring, aromatic heterocyclic rings such as a thiophene ring, a furan ring, a pyrrole ring, an imidazole ring, a triazole ring, and a pyridine ring, and a fused ring thereof, and an aromatic hydrocarbon ring is preferable and a benzene ring is more preferable. The above-described aromatic ring may have a substituent.

The ethylenically unsaturated compound B1 may have only one aromatic ring or may have two or more aromatic rings.

From the viewpoint that the resolution is improved by suppressing swelling of the photosensitive layer due to a developer, the ethylenically unsaturated compound B1 preferably has a bisphenol structure.

Examples of the bisphenol structure include a bisphenol A structure derived from bisphenol A (2,2-bis(4-hydroxyphenyl) propane), a bisphenol F structure derived from bisphenol F (2,2-bis(4-hydroxyphenyl) methane), and a bisphenol B structure derived from bisphenol B (2,2-bis(4-hydroxyphenyl) butane), and a bisphenol A structure is preferable.

Examples of the ethylenically unsaturated compound B1 having a bisphenol structure include a compound having a bisphenol structure and two polymerizable groups (preferably, (meth)acryloyl groups) bonded to both ends of the bisphenol structure.

The two polymerizable groups bonded to both ends of the bisphenol structure may be directly bonded or may be bonded through one or more alkyleneoxy groups. As the alkyleneoxy group added to both ends of the bisphenol structure, an ethyleneoxy group or a propyleneoxy group is preferable, and an ethyleneoxy group is more preferable. The number of alkyleneoxy groups added to the bisphenol structure is not particularly limited, but is preferably 4 to 16 and more preferably 6 to 14 per one molecule.

The ethylenically unsaturated compound B1 having a bisphenol structure is described in paragraphs 0072 to 0080 of JP2016-224162A, and the contents described in this publication are incorporated in the present specification.

As the ethylenically unsaturated compound B1, a bifunctional ethylenically unsaturated compound having a bisphenol A structure is preferable, and 2,2-bis(4-((meth)acryloxypolyalkoxy)phenyl) propane is more preferable.

Examples of 2,2-bis(4-((meth)acryloxypolyalkoxy)phenyl) propane include 2,2-bis(4-(methacryloxydiethoxy)phenyl) propane (FA-324M, manufactured by Hitachi Chemical Co., Ltd.), 2,2-bis(4-(methacryloxyethoxypropoxy)phenyl) propane, 2,2-bis(4-(methacryloxypentethoxy)phenyl) propane (BPE-500, manufactured by Shin-Nakamura Chemical Co., Ltd.), 2,2-bis(4-(methacryloxydodecaethoxytetrapropoxy)phenyl) propane (FA-3200MY, manufactured by Hitachi Chemical Co., Ltd.), 2,2-bis(4-(methacryloxypentadecaethoxy)phenyl) propane (BPE-1300, manufactured by Shin-Nakamura Chemical Co., Ltd.), 2,2-bis(4-(methacryloxydiethoxy)phenyl) propane (BPE-200, manufactured by Shin-Nakamura Chemical Co., Ltd.), and ethoxylated (10) bisphenol A diacrylate (NK ESTER A-BPE-10, manufactured by Shin-Nakamura Chemical Co., Ltd.).

From the viewpoint of line width change with placing time, line width change with developing temperature, and sensitivity, the ethylenically unsaturated compound B1 preferably includes a compound represented by Formula (Bis).

(Bis)

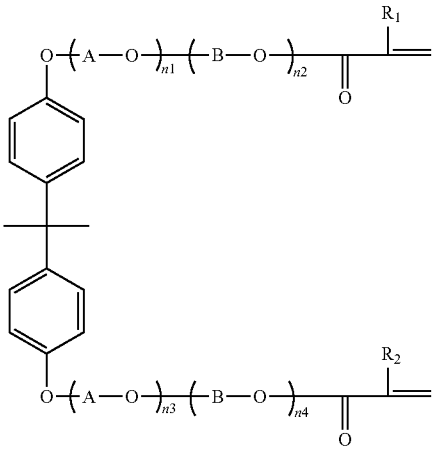

In Formula (Bis), $R^1$ and $R^2$ each independently represent a hydrogen atom or a methyl group, A is $C_2H_4$, B is $C_3H_6$, $n_1$ and $n_3$ are each independently an integer of 1 to 39, $n_1+n_3$ is an integer of 2 to 40, $n_2$ and $n_4$ are each independently an integer of 0 to 29, $n_2+n_4$ is an integer of 0 to 30, and a sequence of repeating units of -(A-O)— and —(B—O)— may be random or block. In a case of a block, either -(A-O)— or —(B—O)— may be on the bisphenol structure side.

In one aspect, $n_1+n_2+n_3+na$ is preferably an integer of 2 to 20, more preferably an integer of 2 to 16, and still more preferably an integer of 4 to 12. In addition, $n_2+n_4$ is preferably an integer of 0 to 10, more preferably an integer of 0 to 4, still more preferably an integer of 0 to 2, and particularly preferably 0.

Among these, from the viewpoint of dense black appearance, patterning properties, and rectangularity of the obtained pattern, the polymerizable compound preferably includes a monomer having a bisphenol A skeleton, and more preferably includes a bifunctional monomer having a bisphenol A skeleton.

The ethylenically unsaturated compound B1 may be used alone or in combination of two or more thereof.

From the viewpoint that the resolution is more excellent, a content of the ethylenically unsaturated compound B1 in the photosensitive layer is preferably 10% by mass or more and more preferably 20% by mass or more with respect to the total mass of the photosensitive layer. The upper limit is not particularly limited, but from the viewpoint of transferability and edge fusion (phenomenon in which the components in the photosensitive layer exude from the edge of the photosensitive transfer material), is preferably 70% by mass or less and more preferably 60% by mass or less.

A molecular weight of the ethylenically unsaturated compound is preferably 200 to 3,000, more preferably 250 to 2,600, still more preferably 280 to 2,200, and particularly preferably 300 to 2,200.

A proportion of the content of the ethylenically unsaturated compound having a molecular weight of 300 or less to ethylenically unsaturated compounds included in the photosensitive layer is preferably 30% by mass or less, more preferably 25% by mass or less, and even more preferably 20% by mass or less with respect to all ethylenically unsaturated compounds included in the photosensitive layer.

As one suitable aspect of the photosensitive layer, the photosensitive layer preferably includes the bi-or higher functional ethylenically unsaturated compound, more preferably includes the tri-or higher functional ethylenically unsaturated compound, and still more preferably includes a tri-or tetrafunctional ethylenically unsaturated compound.

In addition, as one suitable aspect of the photosensitive layer, the photosensitive layer preferably includes the bifunctional ethylenically unsaturated compound having an aliphatic hydrocarbon ring structure and the alkali-soluble resin having the constitutional unit having an aliphatic hydrocarbon ring.

In addition, as one suitable aspect of the photosensitive layer, the photosensitive layer preferably includes the compound represented by Formula (M) and the ethylenically unsaturated compound having an acid group, more preferably includes 1,9-nonanediol diacrylate, tricyclodecane dimethanol diacrylate, and a polyfunctional ethylenically unsaturated compound having a carboxylic acid group, and still more preferably includes 1,9-nonanediol diacrylate, tricyclodecane dimethanol diacrylate, and a succinic acid-modified form of dipentaerythritol pentaacrylate.

In addition, as one suitable aspect of the photosensitive layer, the photosensitive layer preferably includes the compound represented by Formula (M), the ethylenically unsaturated compound having an acid group, and a thermal crosslinking compound described later, and more preferably includes the compound represented by Formula (M), the ethylenically unsaturated compound having an acid group, and a blocked isocyanate compound described later.

In addition, as one suitable aspect of the photosensitive layer, the photosensitive layer preferably includes the bifunctional ethylenically unsaturated compound (preferably, a bifunctional (meth)acrylate compound) and the tri-or higher functional ethylenically unsaturated compound (preferably, a tri-or higher functional (meth)acrylate compound).

From the viewpoint of dense black appearance and rectangularity of the obtained pattern, the above-described polymerizable compound preferably includes a bifunctional polymerizable compound.

In addition, from the viewpoint of dense black appearance and rectangularity of the obtained pattern, a content of the above-described bifunctional polymerizable compound is preferably 50% by mass or more, more preferably 50% by mass to 100% by mass, and particularly preferably 50% by mass to 90% by mass with respect to the total mass of the polymerizable compound.

In addition, as one suitable aspect of the photosensitive layer, from the viewpoint of rust preventive property, the photosensitive layer preferably includes the compound M and the bifunctional ethylenically unsaturated compound having an aliphatic hydrocarbon ring structure.

In addition, as one suitable aspect of the photosensitive layer, from the viewpoint of substrate adhesiveness, suppression of development residue, and rust preventive property, the photosensitive layer preferably includes the compound M and the ethylenically unsaturated compound having an acid group, more preferably includes the compound M, the bifunctional ethylenically unsaturated compound having an aliphatic hydrocarbon ring structure, and the ethylenically unsaturated compound having an acid group, still more preferably includes the compound M, the bifunctional ethylenically unsaturated compound having an aliphatic hydrocarbon ring structure, the tri-or higher functional ethylenically unsaturated compound, and the ethylenically unsaturated compound having an acid group, and particularly preferably includes the compound M, the bifunctional ethylenically unsaturated compound having an aliphatic hydrocarbon ring structure, the tri-or higher functional ethylenically unsaturated compound, the ethylenically unsaturated compound having an acid group, and the urethane (meth)acrylate compound.

In addition, as one suitable aspect of the photosensitive layer, from the viewpoint of substrate adhesiveness, suppression of development residue, and rust preventive property, the photosensitive layer preferably includes 1,9-nonanediol diacrylate and the polyfunctional ethylenically unsaturated compound having a carboxylic acid group, more preferably includes 1,9-nonanediol diacrylate, tricyclodecane dimethanol diacrylate, and the polyfunctional ethylenically unsaturated compound having a carboxylic acid group, still more preferably includes 1,9-nonanediol diacrylate, tricyclodecane dimethanol diacrylate, dipentaerythritol hexaacrylate, and an ethylenically unsaturated compound having a carboxylic acid group, and particularly preferably includes 1,9-nonanediol diacrylate, tricyclodecane dimethanol diacrylate, an ethylenically unsaturated compound having a carboxylic acid group, and a urethane acrylate compound.

The photosensitive layer may include a monofunctional ethylenically unsaturated compound as the ethylenically unsaturated compound.

The content of the bi-or higher functional ethylenically unsaturated compound in the above-described ethylenically unsaturated compound is preferably 60% by mass to 100% by mass, more preferably 80% by mass to 100% by mass, and still more preferably 90% by mass to 100% by mass with respect to the total content of all ethylenically unsaturated compounds included in the photosensitive layer.

In the photosensitive layer, from the viewpoint of dense black appearance, rectangularity of the obtained pattern, resolution, and cover film peelability of the transfer film, a value of ratio Mm/Mb of a content Mm of the polymerizable compound and a content Mb of the alkali-soluble resin is preferably less than 1.0, more preferably less than 0.8, still more preferably 0.05 to 0.75, and particularly preferably 0.10 to 0.50.

In addition, from the viewpoint of curing properties and resolution, the ethylenically unsaturated compound in the photosensitive layer preferably includes a (meth)acrylic compound.

Further, from the viewpoint of curing properties, resolution, and linearity, it is more preferable that the polymerizable compound in the photosensitive layer includes a (meth) acrylic compound and a content of an acrylic compound is 60% by mass or less with respect to the total mass of the above-described (meth)acrylic compound included in the photosensitive layer.

The polymerizable compound may be used alone or in combination of two or more kinds thereof.

From the viewpoint of dense black appearance, rectangularity of the obtained pattern, resolution, and cover film peelability of the transfer film, a content of the polymerizable compound in the photosensitive layer is preferably 1% by mass to 50% by mass and more preferably 5% by mass to 40% by mass with respect to the total mass of the photosensitive layer.

Heterocyclic Compound

The photosensitive layer may include a heterocyclic compound.

A heterocyclic ring included in the heterocyclic compound may be either a monocyclic or polycyclic heterocyclic ring.

Examples of a heteroatom included in the heterocyclic compound include an oxygen atom, a nitrogen atom, and a sulfur atom. The heterocyclic compound preferably has at least one atom selected from the group consisting of a nitrogen atom, an oxygen atom, and a sulfur atom, and more preferably has a nitrogen atom.

Examples of the heterocyclic compound include an imidazole compound, a triazole compound, a benzotriazole compound, a tetrazole compound, a thiadiazole compound, a triazine compound, a rhodanine compound, a thiazole compound, a benzothiazole compound, a benzimidazole compound, a benzoxazole compound, and a pyrimidine compound.

Among the above-described compounds, from the viewpoint of dense black appearance and rectangularity of the obtained pattern, the heterocyclic compound is preferably at least one compound selected from the group consisting of a triazole compound, a benzotriazole compound, a tetrazole compound, a thiadiazole compound, a triazine compound, a rhodanine compound, a thiazole compound, a benzimidazole compounds, and a benzoxazole compound, and more preferably at least one compound selected from the group consisting of an imidazole compound, a triazole compound, and a tetrazole compound, and particularly preferably a triazole compound.

Preferred specific examples of the heterocyclic compound are shown below.

Examples of the imidazole compound include imidazole, 2-methylimidazole, 2-phenylimidazole, 2-ethyl-4-methylimidazole, 2-phenyl-4-methylimidazole, 2-heptadecylimidazole, and 2,4,5-triphenylimidazole.

Examples of the triazole compound and the benzotriazole compound include the following compounds.

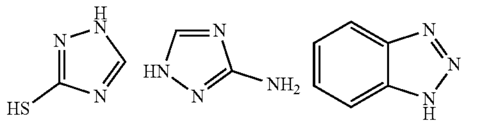

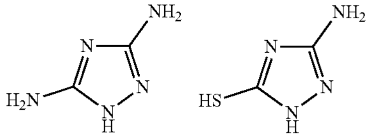

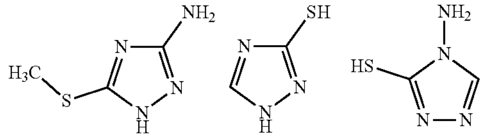

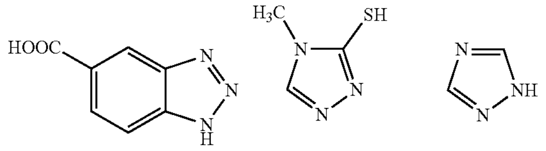

Examples of the tetrazole compound include the following compounds.

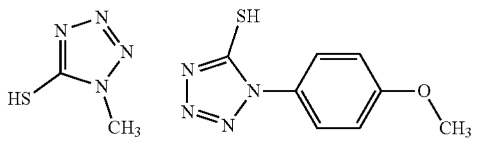

-continued

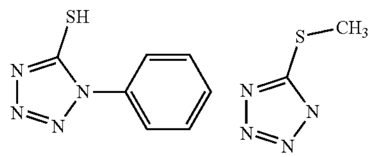

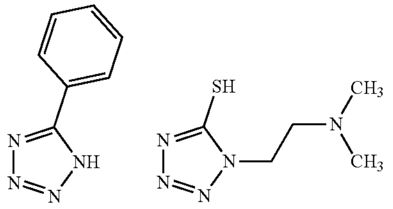

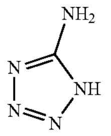

Examples of the thiadiazole compound include the following compounds.

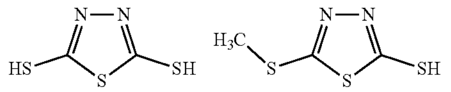

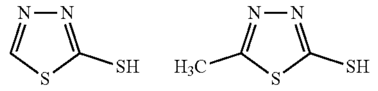

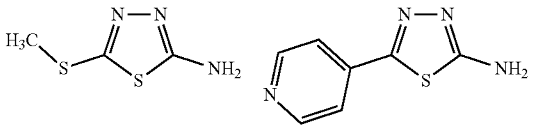

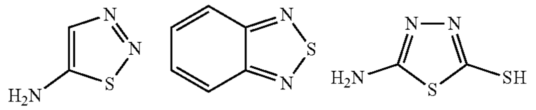

Examples of the triazine compound include the following compounds.

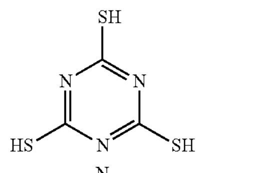

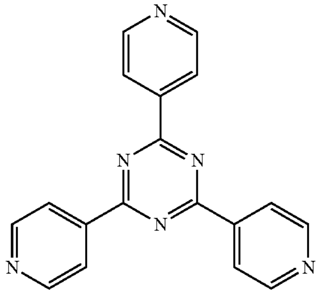

-continued

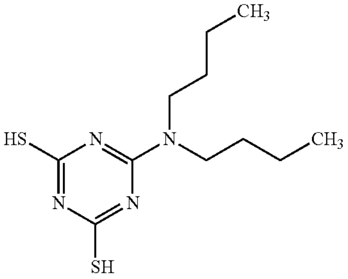

Examples of the rhodanine compound include the following compounds.

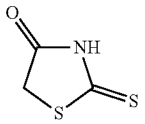

Examples of the thiazole compound include the following compounds.

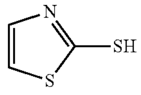
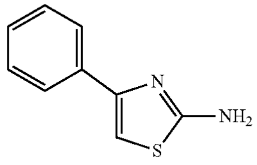

Examples of the benzothiazole compound include the following compounds.

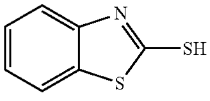
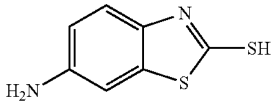
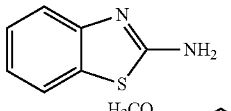
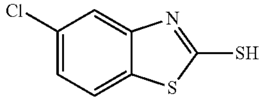
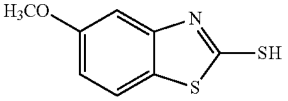

Examples of the benzimidazole compound include the following compounds.

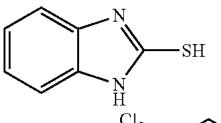
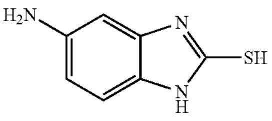
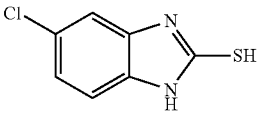

-continued

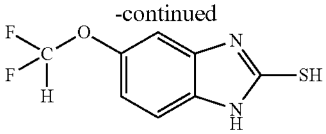
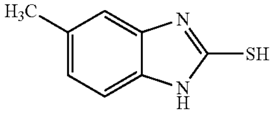
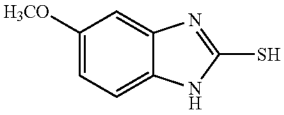
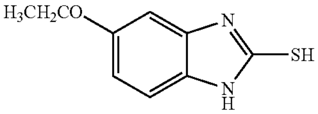
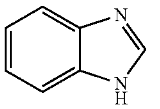
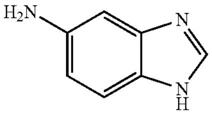
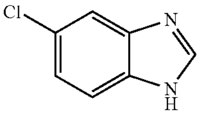
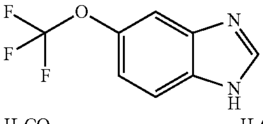
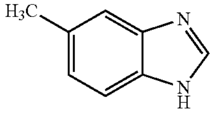
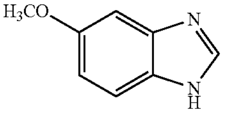
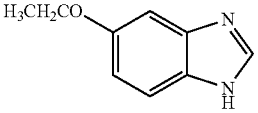

Examples of the benzoxazole compound include the following compounds.

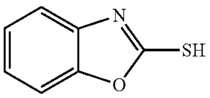
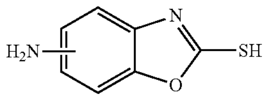

The heterocyclic compound may be used alone or in combination of two or more kinds thereof.

In a case where the photosensitive layer includes the heterocyclic compound, a content of the heterocyclic compound is preferably 0.01% by mass to 20.0% by mass, more preferably 0.02% by mass to 10.0% by mass, still more preferably 0.05% by mass to 8.0% by mass, and particularly preferably 0.10% by mass to 5.0% by mass with respect to the total mass of the photosensitive layer.

Aliphatic Thiol Compound

The photosensitive layer may include an aliphatic thiol compound.

In a case where the photosensitive layer includes an aliphatic thiol compound, an ene-thiol reaction of the aliphatic thiol compound with the ethylenically unsaturated compound suppresses a curing contraction of the formed film and relieves stress.

As the aliphatic thiol compound, a monofunctional aliphatic thiol compound or a polyfunctional aliphatic thiol compound (that is, bi-or higher functional aliphatic thiol compound) is preferable.

Among the above-described compounds, as the aliphatic thiol compound, from the viewpoint of adhesiveness of the formed pattern (particularly, adhesiveness after exposure), a polyfunctional aliphatic thiol compound is more preferable.

In the present specification, the "polyfunctional aliphatic thiol compound" refers to an aliphatic compound having two or more thiol groups (also referred to as "mercapto groups") in a molecule.

As the polyfunctional aliphatic thiol compound, a low-molecular-weight compound having a molecular weight of 100 or more is preferable. Specifically, the molecular weight of the polyfunctional aliphatic thiol compound is more preferably 100 to 1,500 and still more preferably 150 to 1,000.

From the viewpoint of adhesiveness of the formed pattern, for example, the number of functional groups in the polyfunctional aliphatic thiol compound is preferably 2 to 10, more preferably 2 to 8, and still more preferably 2 to 6.

Examples of the polyfunctional aliphatic thiol compound include trimethylolpropane tris(3-mercaptobutyrate), 1,4-bis(3-mercaptobutyryloxy) butane, pentaerythritol tetrakis(3-mercaptobutyrate), 1,3,5-tris(3-mercaptobutyryloxyethyl)-1,3,5-triazine-2,4,6 (1H,3H,5H)-trione, trimethylolethane tris(3-mercaptobutyrate), tris[(3-mercaptopropionyloxy) ethyl]isocyanurate, trimethylolpropane tris(3-mercaptopropionate), pentaerythritol tetrakis(3-mercaptopropionate), tetraethylene glycol bis(3-mercaptopropionate), dipentaerythritol hexakis (3-mercaptopropionate), ethylene glycol bisthiopropionate, 1,2-ethanedithiol, 1,3-propanedithiol, 1,6-hexamethylenedithiol, 2,2'-(ethylenedithio) diethanethiol, meso-2,3-dimercaptosuccinic acid, and di(mercaptoethyl) ether.

Among the above-described compounds, the polyfunctional aliphatic thiol compound is preferably at least one compound selected from the group consisting of trimethylolpropane tris(3-mercaptobutyrate), 1,4-bis(3-mercaptobutyryloxy) butane, and 1,3,5-tris(3-mercaptobutyryloxyethyl)-1,3,5-triazine-2,4,6 (1H,3H,5H)-trione.

Examples of the monofunctional aliphatic thiol compound include 1-octanethiol, 1-dodecanethiol, β-mercaptopropionic acid, methyl-3-mercaptopropionate, 2-ethylhexyl-3-mercaptopropionate, n-octyl-3-mercaptopropionate, methoxybutyl-3-mercaptopropionate, and stearyl-3-mercaptopropionate.

The photosensitive layer may include only one kind of the aliphatic thiol compound, or may include two or more kinds of the aliphatic thiol compounds.

In a case where the photosensitive layer includes the aliphatic thiol compound, a content of the aliphatic thiol compound is preferably 5% by mass or more, more preferably 5% by mass to 50% by mass, still more preferably 5% by mass to 30% by mass, and particularly preferably 8% by mass to 20% by mass with respect to the total mass of the photosensitive layer.

Thermal Crosslinking Compound

From the viewpoint of hardness of a cured film to be obtained and pressure-sensitive adhesiveness of an uncured film to be obtained, the photosensitive layer preferably includes a thermal crosslinking compound. In the present specification, a thermal crosslinking compound having an ethylenically unsaturated group, which will be described later, is not treated as the ethylenically unsaturated compound, but is treated as the thermal crosslinking compound.

Examples of the thermal crosslinking compound include a methylol compound and a blocked isocyanate compound. Among these, from the viewpoint of hardness of a cured film to be obtained and pressure-sensitive adhesiveness of an uncured film to be obtained, a blocked isocyanate compound is preferable.

Since the blocked isocyanate compound reacts with a hydroxy group and a carboxy group, for example, in a case where the alkali-soluble resin, the ethylenically unsaturated compound, and/or the like has at least one of a hydroxy group or a carboxy group, hydrophilicity of the formed film tends to decrease, and the function tends to be enhanced in a case where a film obtained by curing the photosensitive layer is used as the protective film.

The blocked isocyanate compound refers to a "compound having a structure in which the isocyanate group of isocyanate is protected (so-called masked) with a blocking agent".

A dissociation temperature of the blocked isocyanate compound is not particularly limited, but is preferably 100° C. to 160° C. and more preferably 130° C. to 150° C.

The dissociation temperature of blocked isocyanate means "temperature at an endothermic peak accompanied with a deprotection reaction of blocked isocyanate, in a case where the measurement is performed by differential scanning calorimetry (DSC) analysis using a differential scanning calorimeter".

As the differential scanning calorimeter, for example, a differential scanning calorimeter (model: DSC6200) manufactured by Seiko Instruments Inc. can be suitably used. However, the differential scanning calorimeter is not limited thereto.

Examples of the blocking agent having a dissociation temperature of 100° C. to 160° C. include an active methylene compound [diester malonates (dimethyl malonate, diethyl malonate, di-n-butyl malonate, di-2-ethylhexyl malonate, and the like)], and an oxime compound (compound having a structure represented by —C(═N—OH)— in a molecule, such as formaldoxime, acetoaldoxime, acetoxime, methyl ethyl ketoxime, and cyclohexanoneoxime).

Among these, from the viewpoint of storage stability, the blocking agent having a dissociation temperature of 100° C. to 160° C. preferably includes, for example, an oxime compound.

From the viewpoint of improving brittleness of the film and improving the adhesion to an object to be transferred, for example, the blocked isocyanate compound preferably has an isocyanurate structure.

The blocked isocyanate compound having an isocyanurate structure can be obtained, for example, by isocyanurate-forming and protecting hexamethylene diisocyanate.

Among the blocked isocyanate compounds having an isocyanurate structure, a compound having an oxime structure using an oxime compound as a blocking agent is preferable from the viewpoint that the dissociation temperature can be easily set in a preferred range and the development residue can be easily reduced, as compared with a compound having no oxime structure.

The blocked isocyanate compound may have a polymerizable group.

The polymerizable group is not particularly limited, and a known polymerizable group can be used, and a radically polymerizable group is preferable.

Examples of the polymerizable group include a (meth) acryloxy group, a (meth)acrylamide group, an ethylenically unsaturated group such as styryl group, and an epoxy group such as a glycidyl group.

Among these, as the polymerizable group, an ethylenically unsaturated group is preferable, a (meth)acryloxy group is more preferable, and an acryloxy group still more preferable.

As the blocked isocyanate compound, a commercially available product can be used.

Examples of the commercially available product of the blocked isocyanate compound include Karenz (registered trademark) AOI-BM, Karenz (registered trademark) MOI-BM, Karenz (registered trademark) MOI-BP, and the like (all of which are manufactured by SHOWA DENKO K.K.), and block-type DURANATE series (for example, DURAN- ATE (registered trademark) TPA-B80E, DURANATE (registered trademark) WT32-B75P, and the like manufactured by Asahi Kasei Corporation).

In addition, as the blocked isocyanate compound, a compound having the following structure can also be used.

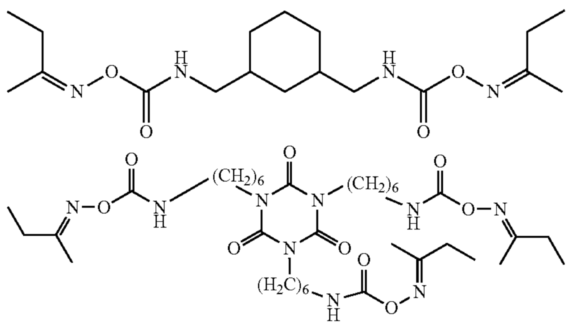

The thermal crosslinking compound may be used alone, or in combination of two or more kinds thereof.

In a case where the photosensitive layer includes the thermal crosslinking compound, a content of the thermal crosslinking compound is preferably 1% by mass to 50% by mass and more preferably 5% by mass to 30% by mass with respect to the total mass of the photosensitive layer.

Surfactant

The photosensitive layer may include a surfactant.

Examples of the surfactant include an anionic surfactant, a cationic surfactant, a nonionic surfactant, and an amphoteric surfactant, and a nonionic surfactant is preferable.

Examples of the surfactant include surfactants described in paragraph 0017 of JP4502784B and paragraphs 0060 to 0071 of JP2009-237362A.

As the surfactant, a fluorine-based surfactant or a silicone-based surfactant is preferable.

Examples of a commercially available product of the fluorine-based surfactant include: MEGAFACE F-171, F-172, F-173, F-176, F-177, F-141, F-142, F-143, F-144, F-437, F-444, F-475, F-477, F-479, F-482, F-551-A, F-552, F-554, F-555-A, F-556, F-557, F-558, F-559, F-560, F-561, F-565, F-563, F-568, F-575, F-780, EXP, MFS-330, MFS-578, MFS-579, MFS-586, MFS-587, R-41, R-41-LM, R-01, R-40, R-40-LM, RS-43, TF-1956, RS-90, R-94, RS-72-K, and DS-21 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.); FTERGENT 710FL, 710FM, 610FM, 601AD, 601ADH2, 602A, 215M, 245F, 251, 212M, 250, 209F, 222F, 208G, 710LA, 710FS, 730 LM, 650AC, 681, and 683 (manufactured by NEOS COMPANY LIMITED).

In addition, as the fluorine-based surfactant, a polymer of a fluorine atom-containing vinyl ether compound having a fluorinated alkyl group or a fluorinated alkylene ether group, and a hydrophilic vinyl ether compound is also preferably used.

A block polymer can also be used as the fluorine-based surfactant. As the fluorine-based surfactant, a fluorine-containing polymer compound including a constitutional unit derived from a (meth)acrylate compound having a fluorine atom and a constitutional unit derived from a (meth)acrylate compound having 2 or more (preferably 5 or more) alkyleneoxy groups (preferably ethyleneoxy groups or propyleneoxy groups) can also be preferably used.

As the fluorine-based surfactant, a fluorine-containing polymer having an ethylenically unsaturated group in the side chain can be used.fluorine-based surfactant. Examples thereof include MEGAFACE (product name) RS-101, RS-102, RS-718K, and RS-72-K (all of which are manufactured by DIC Corporation).

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC (product name) L10, L31, L61, L62, 10R5, 17R2, and 25R2 (all of which are manufactured by BASF SE), TETRONIC (product name) 304, 701, 704, 901, 904, and 150R1 (all of which are manufactured by BASF SE), SOLSPERSE (product name) 20000 (manufactured by Lubrizol Corporation), NCW-101, NCW-1001, and NCW-1002 (all of which are manufactured by FUJIFILM Wako Pure Chemical Corporation), PIONIN (product name) D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

In addition, in recent years, since a compound having a linear perfluoroalkyl group having 7 or more carbon atoms is concerned about environmental suitability, the use of perfluorooctanoic acid (PFOA) and perfluorooctanesulfonic acid (PFOS) has been limited. Therefore, it is preferable to use a surfactant using an alternative material of PFOA and PFOS.

Examples of the silicone-based surfactant include a linear polymer consisting of a siloxane bond and a modified siloxane polymer with an organic group introduced in the side chain or the terminal.

Specific examples of the silicone-based surfactant include DOWSIL (product name) 8032 ADDITIVE, TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Toray Co., Ltd.), X-22-4952, X-22-4272, X-22-6266, KF-351A, K354L, KF-355A, KF-945, KF-640, KF-642, KF-643, X-22-6191, X-22-4515, KF-6004, KP-341, KF-6001, and KF-6002 (all of which are manufactured by Shin-Etsu Chemical Co., Ltd.), F-4440, TSF-4300, TSF-4445, TSF-4460, and TSF-4452 (all of which are manufactured by Momentive Performance Materials Co., Ltd.), and BYK307, BYK323, and BYK330 (all of which are manufactured by BYK Chemie).

The surfactant may be used alone or in combination of two or more kinds thereof.

In a case where the photosensitive layer includes the surfactant, a content of the surfactant is preferably 0.01% by mass to 3.0% by mass, more preferably 0.01% by mass to 1.0% by mass, and still more preferably 0.05% by mass to 0.80% by mass with respect to the total mass of the photosensitive layer.

Polymerization Inhibitor

The photosensitive layer may include a polymerization inhibitor.

The polymerization inhibitor means a compound having a function of delaying or prohibiting a polymerization reaction. As the polymerization inhibitor, for example, a known compound used as a polymerization inhibitor can be used.

Examples of the polymerization inhibitor include phenothiazine compounds such as phenothiazine, bis(1-dimethylbenzyl) phenothiazine, and 3,7-dioctylphenothiazine; hindered phenolic compounds such as bis[3-(3-tert-butyl-4-hydroxy-5-methylphenyl) propionic acid][ethylene bis (oxyethylene)], 2,4-bis[(laurylthio)methyl]-o-cresol, 1,3,5-tris(3,5-di-t-butyl-4-hydroxybenzyl), 1,3,5-tris(4-t-butyl-3-hydroxy-2,6-dimethylbenzyl), 2,4-bis-(n-octylthio)-6-(4-hydroxy-3,5-di-t-butylanilino)-1,3,5-triazine, and pentaerythritol tetrakis3-(3,5-di-tert-butyl-4-hydroxyphenyl) propionate; nitroso compounds or a salt thereof, such as 4-nitrosophenol, N-nitrosodiphenylamine, N-nitrosocyclohexylhydroxylamine, and N-nitrosophenylhydroxylamine; quinone compounds such as methylhydroquinone, t-butylhydroquinone, 2,5-di-t-butylhydroquinone, and 4-benzoquinone; phenolic compounds such as 4-methoxyphenol, 4-methoxy-1-naphthol, and t-butylcatechol; and metal salt compounds such as copper dibutyldithiocarbamate, copper diethyldithiocarbamate, manganese diethyldithiocarbamate, and manganese diphenyldithiocarbamate.

Among these, as the polymerization inhibitor, from the viewpoint that the effects in the present disclosure are more excellent, at least one selected from the group consisting of a phenothiazine compound, a nitroso compound or a salt thereof, and a hindered phenolic compound is preferable, and phenothiazine, bis[3-(3-tert-butyl-4-hydroxy-5-methylphenyl) propionic acid][ethylene bis(oxyethylene)], 2,4-bis[(laurylthio)methyl]-o-cresol, 1,3,5-tris(3,5-di-t-butyl-4-hydroxybenzyl), or an aluminum salt of N-nitrosophenylhydroxylamine is more preferable.

The polymerization inhibitor may be used alone or in combination of two or more kinds thereof.

In a case where the photosensitive layer includes the polymerization inhibitor, a content of the polymerization inhibitor is preferably 0.01% by mass to 10.0% by mass, more preferably 0.01% by mass to 5.0% by mass, and still more preferably 0.04% by mass to 3.0% by mass with respect to the total mass of the photosensitive layer.

Hydrogen Donating Compound

The photosensitive layer may include a hydrogen donating compound.

The hydrogen donating compound has a function of further improving sensitivity of the photopolymerization initiator to actinic ray, suppressing inhibition of polymerization of the ethylenically unsaturated compound by oxygen, or the like.

Examples of the hydrogen donating compound include amines and an amino acid compound.

Examples of the amines include compounds described in M. R. Sander et al., "Journal of Polymer Society," Vol. 10, page 3173 (1972), JP1969-020189B (JP-S44-020189B), JP1976-082102A (JP-S51-082102A), JP1977-134692A (JP-S52-134692A), JP1984-138205A (JP-S59-138205A), JP1985-084305A (JP-S60-084305A), JP1987-018537A (JP-S62-018537A), JP1989-033104A (JP-S64-033104A), and Research Disclosure 33825. More specific examples thereof include 4,4'-bis(diethylamino)benzophenone, tris(4-dimethylaminophenyl) methane (another name: Leucocrystal Violet), triethanolamine, p-dimethylaminobenzoic acid ethyl ester, p-formyldimethylaniline, and p-methylthiodimethylaniline.

Among these, as the amines, from the viewpoint that the effects in the present disclosure are more excellent, at least one selected from the group consisting of 4,4'-bis(diethylamino)benzophenone and tris(4-dimethylaminophenyl) methane is preferable.

Examples of the amino acid compound include N-phenylglycine, N-methyl-N-phenylglycine, and N-ethyl-N-phenylglycine.

Among these, as the amino acid compound, from the viewpoint that the effects in the present disclosure are more excellent, N-phenylglycine is preferable.

In addition, examples of the hydrogen donating compound also include an organic metal compound described in JP1973-042965B (JP-S48-042965B) (tributyl tin acetate and the like), a hydrogen donor described in JP1980-034414B (JP-S55-034414B), and a sulfur compound described in JP1994-308727A (JP-H6-308727A) (trithiane and the like).

The hydrogen donating compound may be used alone or in combination of two or more kinds thereof.

In a case where the photosensitive layer includes the hydrogen donating compound, from the viewpoint of improving a curing rate by balancing the polymerization growth rate and chain transfer, a content of the hydrogen donating compound is preferably 0.01% by mass to 10.0% by mass, more preferably 0.01% by mass to 8.0% by mass, and still more preferably 0.03% by mass to 5.0% by mass with respect to the total mass of the photosensitive layer.

Other Components

The photosensitive layer may include a component other than the above-mentioned components (hereinafter also referred to as "other components"). Examples of the other components include an antioxidant, and particles (for example, metal oxide particles). In addition, examples of the other components also include other additives described in paragraphs 0058 to 0071 of JP2000-310706A.

Antioxidant

Examples of the antioxidant include 3-pyrazolidones such as 1-phenyl-3-pyrazolidone (another name; phenidone), 1-phenyl-4,4-dimethyl-3-pyrazolidone, and 1-phenyl-4-methyl-4-hydroxymethyl-3-pyrazolidone; polyhydroxybenzenes such as hydroquinone, catechol, pyrogallol, methylhydroquinone, and chlorohydroquinone; paramethylaminophenol, paraaminophenol, parahydroxyphenylglycine, and paraphenylenediamine.

Among these, as the antioxidant, 3-pyrazolidones are preferable, and 1-phenyl-3-pyrazolidone is more preferable.

In a case where the photosensitive layer includes the antioxidant, a content of the antioxidant is preferably 0.001% by mass or more, more preferably 0.005% by mass or more, and still more preferably 0.01% by mass or more with respect to the total mass of the photosensitive layer. The upper limit is not particularly limited, and is preferably 1% by mass or less.

Particles

The particles are particles other than the above-described pigment, and metal oxide particles are preferable.

The metal of the metal oxide particles also includes semimetal such as B, Si, Ge, As, Sb, or Te.

From the viewpoint of transparency of the cured film, for example, an average primary particle diameter of the particles is preferably 1 nm to 200 nm and more preferably 3 nm to 80 nm.

The average primary particle diameter of the particles is calculated by measuring particle diameters of 200 random particles using an electron microscope and arithmetically averaging the measurement result. In a case where the shape of the particle is not a spherical shape, the longest side is set as the particle diameter.

In a case where the photosensitive layer includes the particles, the photosensitive layer may include only one kind of particles, or may include two or more kinds of particles having different metal types, sizes, and the like.

It is preferable that the photosensitive layer does not include the particles, or in a case where the photosensitive layer includes the particles, a content of the particles is more than 0% by mass and 35% by mass or less with respect to the total mass of the photosensitive layer; it is more preferable that the photosensitive layer does not include the particles, or in a case where the photosensitive layer includes the particles, a content of the particles is more than 0% by mass and 10% by mass or less with respect to the total mass of the photosensitive layer; it is still more preferable that the photosensitive layer does not include the particles, or in a case where the photosensitive layer includes the particles, a content of the particles is more than 0% by mass and 5% by mass or less with respect to the total mass of the photosensitive layer; it is even more preferable that the photosensitive layer does not include the particles, or in a case where the photosensitive layer includes the particles, a content of the particles is more than 0% by mass and 1% by mass or less with respect to the total mass of the photosensitive layer; and it is particularly preferable that the photosensitive layer does not include the particles.

Impurities and the Like

The photosensitive layer may include a predetermined amount of impurities.

Examples of the impurities include sodium, potassium, magnesium, calcium, iron, manganese, copper, aluminum, titanium, chromium, cobalt, nickel, zinc, tin, halogen, and ions of these. Among these, halide ion, sodium ion, and potassium ion are easily mixed as impurities, so that the following content is preferable.

The content of impurities in the photosensitive layer is preferably 80 ppm or less, more preferably 10 ppm or less, and particularly preferably 2 ppm or less on a mass basis. The content of impurities may be 1 ppb or more, or may be 0.1 ppm or more on a mass basis.

Examples of a method of setting the impurities in the above-described range include selecting a raw material having a low content of impurities as a raw material for the composition, preventing the impurities from entering in a case of manufacturing the photosensitive layer, and washing and removing the impurities. By such a method, the amount of impurities can be kept within the above-described range.

The impurities can be quantified by a known method such as inductively coupled plasma (ICP) emission spectroscopy, atomic absorption spectroscopy, and ion chromatography.

In the photosensitive layer, it is preferable that the content of compounds such as benzene, formaldehyde, trichloroethylene, 1,3-butadiene, carbon tetrachloride, chloroform, N,N-dimethylformamide, N,N-dimethylacetamide, and hexane is low in each layer. The content of these compounds is preferably 100 ppm or less, more preferably 20 ppm or less, and particularly preferably 4 ppm or less on a mass basis with respect to the total mass of the photosensitive layer.

The lower limit thereof may be 10 ppb or more or 100 ppb or more on a mass basis with respect to the total mass of the photosensitive layer. The content of these compounds can be suppressed in the same manner as in the above-described metal as impurities. In addition, the compounds can be quantified by a known measurement method.

From the viewpoint of reliability and laminating property, the content of water in the photosensitive layer is preferably 0.01% by mass to 1.0% by mass and more preferably 0.05% by mass to 0.5% by mass.

Residual Monomer

The photosensitive layer may include a residual monomer corresponding to each constitutional unit of the above-described alkali-soluble resin.

From the viewpoint of patterning properties and reliability, a content of the residual monomer is preferably 5,000 ppm by mass or less, more preferably 2,000 ppm by mass or less, and still more preferably 500 ppm by mass or less with respect to the total mass of the alkali-soluble resin. The lower limit is not particularly limited, but is preferably 1 ppm by mass or more and more preferably 10 ppm by mass or more.

From the viewpoint of patterning properties and reliability, the residual monomer of each constitutional unit in the alkali-soluble resin is preferably 3,000 ppm by mass or less, more preferably 600 ppm by mass or less, and still more preferably 100 ppm by mass or less with respect to the total mass of the photosensitive layer. The lower limit is not particularly limited, but is preferably 0.1 ppm by mass or more and more preferably 1 ppm by mass or more.

It is preferable that the amount of residual monomer of the monomer in a case of synthesizing the alkali-soluble resin by the polymer reaction is also within the above-described range. For example, in a case where glycidyl acrylate is reacted with a carboxylic acid side chain to synthesize the alkali-soluble resin, the content of glycidyl acrylate is preferably within the above-described range.

The amount of residual monomers can be measured by a known method such as liquid chromatography and gas chromatography.

Layer Thickness of Photosensitive Layer

A layer thickness of the photosensitive layer is not particularly limited, but from the viewpoint that the effects in the present disclosure are more excellent, is often 30 μm or less, preferably 20 μm or less, more preferably 15 μm or less, and particularly preferably 10 μm or less. From the viewpoint that hardness of a film obtained by curing the photosensitive layer is excellent, the lower limit is preferably 0.60 μm or more and more preferably 1.5 μm or more.

For example, the thickness of the photosensitive layer is obtained as an average value of 5 random points measured by cross-sectional observation with a scanning electron microscope (SEM).

Forming Method

A forming method of the photosensitive layer is not particularly limited as long as it is a method capable of forming a layer containing the above-described components.

Examples of the forming method of the photosensitive layer include a method in which a photosensitive resin composition containing the pigment, the alkali-soluble resin, the polymerizable compound, the photopolymerization initiator, a solvent, and the like is prepared, the photosensitive resin composition is applied to a surface of the temporary support or the like, and a coating film of the photosensitive resin composition is dried to form the photosensitive layer.

Examples of the photosensitive resin composition used for forming the photosensitive layer include a composition containing the pigment, the alkali-soluble resin, the polymerizable compound, the photopolymerization initiator, the above-described optional components, and a solvent.

In order to adjust a viscosity of the photosensitive resin composition and facilitate the formation of the photosensitive layer, the photosensitive resin composition preferably contains a solvent.

Solvent

The solvent contained in the photosensitive resin composition is not particularly limited as long as it can dissolve or disperse the pigment, the alkali-soluble resin, the polymerizable compound, the photopolymerization initiator, and the above-described optional components, and a known solvent can be used.

Examples of the solvent include an alkylene glycol ether solvent, an alkylene glycol ether acetate solvent, an alcohol solvent (methanol, ethanol, and the like), a ketone solvent (acetone, methyl ethyl ketone, and the like), an aromatic hydrocarbon solvent (toluene and the like), an aprotic polar solvent (N,N-dimethylformamide and the like), a cyclic ether solvent (tetrahydrofuran and the like), an ester solvent, an amide solvent, a lactone solvent, and a mixed solvent including two or more of these solvents.

In a case of manufacturing a photosensitive transfer material including the temporary support, the thermoplastic resin layer, the functional layer, and the photosensitive layer, the photosensitive resin composition preferably contains at least one selected from the group consisting of an alkylene glycol ether solvent and an alkylene glycol ether acetate solvent. Among these, a mixed solvent including at least one selected from the group consisting of the alkylene glycol ether solvent and the alkylene glycol ether acetate solvent and at least one selected from the group consisting of the ketone solvent and the cyclic ether solvent is more preferable, and a mixed solvent including at least one selected from the group consisting of an alkylene glycol ether solvent and an alkylene glycol ether acetate solvent and at least two ketone solvents is still more preferable.

Examples of the alkylene glycol ether solvent include ethylene glycol monoalkyl ether, ethylene glycol dialkyl ether, propylene glycol monoalkyl ether, propylene glycol dialkyl ether, diethylene glycol dialkyl ether, dipropylene glycol monoalkyl ether, and dipropylene glycol dialkyl ether.

Examples of the alkylene glycol ether acetate solvent include ethylene glycol monoalkyl ether acetate, propylene glycol monoalkyl ether acetate, diethylene glycol monoalkyl ether acetate, and dipropylene glycol monoalkyl ether acetate.

As the solvent, solvents described in paragraphs 0092 to 0094 of WO2018/179640A and solvents described in paragraph 0014 of JP2018-177889A may be used, the contents of which are incorporated herein by reference.

The photosensitive resin composition may contain one kind of solvent alone or two or more kinds thereof.

A content of the solvent in a case of applying the photosensitive resin composition is preferably 50 parts by mass to 1,900 parts by mass and more preferably 100 parts by mass to 900 parts by mass with respect to 100 parts by mass of the total solid content in the photosensitive resin composition.

A preparing method of the photosensitive resin composition is not particularly limited, and examples thereof include a method for preparing the photosensitive resin composition by preparing a solution in which each component is dissolved in the above-described solvent in advance and mixing the obtained solution in a predetermined ratio.

It is preferable that the photosensitive resin composition is filtered using a filter having a pore diameter of 0.2 μm to 30 μm before forming the photosensitive layer.

A method for applying the photosensitive resin composition is not particularly limited, and the photosensitive resin composition may be applied by a known method. Examples of the applying method include a printing method, a spray coating method, a roll coating method, a bar coating method, a curtain coating method, a spin coating method, and a die coating method (that is, a slit coating method).

In addition, the photosensitive layer may be formed by applying the photosensitive resin composition to a protective film described later and drying the photosensitive resin composition.

As a method for drying the coating film of the photosensitive resin composition, heat drying or vacuum drying is preferable.

The drying temperature is preferably 80° C. or higher and more preferably 90° C. or higher. In addition, the upper limit value thereof is preferably 130° C. or lower and more preferably 120° C. or lower. The drying can be performed by continuously changing the temperature.

In addition, the drying time is preferably 20 seconds or more, more preferably 40 seconds or more, and still more preferably 60 seconds or more. In addition, the upper limit value thereof is not particularly limited, but is preferably 600 seconds or less, and more preferably 300 seconds or less.

Thermoplastic Resin Layer

The photosensitive transfer material may include a thermoplastic resin layer.

The photosensitive transfer material preferably includes the thermoplastic resin layer between the temporary support and the photosensitive layer. By providing the thermoplastic resin layer between the temporary support and the photosensitive layer, followability to the substrate is improved and mixing of air bubbles between the substrate and the photosensitive transfer material is suppressed, so that adhesiveness to the adjacent layer (for example, the temporary support) is improved.

Alkali-Soluble Resin

The thermoplastic resin layer preferably contains an alkali-soluble resin as the thermoplastic resin.

Examples of the alkali-soluble resin include an acrylic resin, a polystyrene resin, a styrene-acrylic copolymer, a polyurethane resin, polyvinyl alcohol, polyvinyl formal, a polyamide resin, a polyester resin, a polyamide resin, an epoxy resin, a polyacetal resin, a polyhydroxystyrene resin, a polyimide resin, a polybenzoxazole resin, a polysiloxane resin, a polyethyleneimine, a polyallylamine, and a polyalkylene glycol.

As the alkali-soluble resin, from the viewpoint of developability and adhesiveness to an adjacent layer, an acrylic resin is preferable.

Here, the acrylic resin means a resin having at least one constitutional unit selected from the group consisting of a constitutional unit derived from (meth)acrylic acid, a constitutional unit derived from (meth)acrylic acid ester, and a constitutional unit derived from (meth)acrylic acid amide.

As the acrylic resin, it is preferable that the total content of the constitutional unit derived from (meth)acrylic acid, the constitutional unit derived from (meth)acrylic acid ester, and the constitutional unit derived from (meth)acrylic acid amide is 50% by mass or more with respect to the total mass of the acrylic resin.

Among these, the total content of the constitutional unit derived from (meth)acrylic acid and the constitutional unit derived from (meth)acrylic acid ester is preferably 30% by mass to 100% by mass and more preferably 50% by mass to 100% by mass with respect to the total mass of the acrylic resin.

In addition, the alkali-soluble resin is preferably a polymer having an acid group.

Examples of the acid group include a carboxy group, a sulfo group, a phosphonic acid group, and a phosphoric acid group, and a carboxy group is preferable.

As the alkali-soluble resin, from the viewpoint of developability, an alkali-soluble resin having an acid value of 60 mgKOH/g or more is more preferable, and a carboxy group-containing acrylic resin having an acid value of 60 mgKOH/g or more is still more preferable.

The upper limit of the acid value of the alkali-soluble resin is not particularly limited, but is preferably 200 mgKOH/g or less and more preferably 150 mgKOH/g or less.

The carboxy group-containing acrylic resin having an acid value of 60 mgKOH/g or more is not particularly limited, and can be appropriately selected and used from a known resin.

Examples thereof include an alkali-soluble resin which is a carboxy group-containing acrylic resin having an acid value of 60 mgKOH/g or more among polymers described in paragraph 0025 of JP2011-95716A, a carboxy group-containing acrylic resin having an acid value of 60 mgKOH/g or more among polymers described in paragraphs 0033 to 0052 of JP2010-237589A, and a carboxy group-containing acrylic resin having an acid value of 60 mgKOH/g or more among alkali-soluble resins described in paragraphs 0053 to 0068 of JP2016-224162A.

A copolymerization ratio of the constitutional unit having a carboxy group in the above-described carboxy group-containing acrylic resin is preferably 5% by mass to 50% by mass, more preferably 10% by mass to 40% by mass, and still more preferably 12% by mass to 30% by mass with respect to the total mass of the acrylic resin.

As the alkali-soluble resin, from the viewpoint of developability and adhesiveness to an adjacent layer, an acrylic resin having a constitutional unit derived from (meth)acrylic acid is particularly preferable.

The alkali-soluble resin may have a crosslinkable group. The crosslinkable group may be any addition-polymerizable group, and examples thereof include an ethylenically unsaturated group; a polycondensable group such as a hydroxy group and a carboxy group; and a polyaddition reactive group such as an epoxy group and a (blocked) isocyanate group.

A weight-average molecular weight (Mw) of the alkali-soluble resin is preferably 1,000 or more, more preferably 10,000 to 100,000, and still more preferably 20,000 to 50,000.

The thermoplastic resin layer may contain one kind of alkali-soluble resin alone or two or more kinds thereof.

From the viewpoint of developability and adhesiveness to an adjacent layer, a content of the alkali-soluble resin is preferably 10% by mass to 99% by mass, more preferably 20% by mass to 90% by mass, still more preferably 40% by mass to 80% by mass, and particularly preferably 50% by mass to 70% by mass with respect to the total mass of the thermoplastic resin layer.

Coloring Agent

The thermoplastic resin layer preferably contains a coloring agent (also simply referred to as a "coloring agent B") in which a maximal absorption wavelength in a wavelength range of 400 nm to 780 nm during color development is 450 nm or more, and the maximal absorption wavelength changes depending on an acid, a base, or a radical.

As the coloring agent B, from the viewpoint of visibility and resolution of the exposed portion and non-exposed portion, a coloring agent in which the maximal absorption wavelength changes by an acid or a radical is preferable, and a coloring agent in which the maximal absorption wavelength changes by an acid is more preferable.

From the viewpoint of visibility and resolution of the exposed portion and non-exposed portion, it is preferable that the thermoplastic resin layer includes, as the coloring agent B, a coloring agent in which the maximal absorption wavelength changes by an acid, and contains a compound which generates an acid with light, which will be described later.

In the present specification, the fact that the coloring agent has "maximal absorption wavelength changed depending on an acid, a base, or a radical" may mean any aspect of an aspect in which a coloring agent in a color developing state is decolorized by the acid, the base, or the radical, an aspect in which a coloring agent in a decolorized state develops color by the acid, the base, or the radical, or an aspect in which a coloring agent in a color developing state changes to a color developing state of another color tone.

Specifically, the coloring agent B may be a compound which develops color by changing a state from the decolorized state due to exposure, or may be a compound which is decolorized by changing a state from the color developing state due to exposure. In this case, a coloring agent in which the color developing or decolorized state changes due to the generation and action of acid, base, or radical in the photosensitive layer by exposure may be used, or a coloring agent in which the color developing or decolorized state changes by changing a condition (for example, pH) in the photosensitive layer due to the acid, the base, or the radical may be used. In addition, a coloring agent in which the color developing or decolorized state changes by directly receiving the acid, the base, or the radical as a stimulus without exposure.

Among these, as the coloring agent B, from the viewpoint of visibility and resolution of the exposed portion and non-exposed portion, a coloring agent in which the maximal absorption wavelength changes by an acid or a radical is preferable, and a coloring agent in which the maximal absorption wavelength changes by a radical is more preferable.

From the viewpoint of visibility and resolution of the exposed portion and non-exposed portion, it is preferable that the photosensitive layer includes, as the coloring agent B, a coloring agent in which the maximal absorption wavelength changes by a radical, and contains the photoradical polymerization initiator.

In addition, from the viewpoint of visibility of the exposed portion and non-exposed portion, the coloring agent B is preferably a coloring agent which develops color by an acid, a base, or a radical.

Examples of a color development mechanism of the coloring agent B in the present disclosure include an aspect in which the photoradical polymerization initiator, the photocationic polymerization initiator (photoacid generator), or the photobase generator is added in the photosensitive layer, a radical-reactive coloring agent, an acid-reactive coloring agent, or a base-reactive coloring agent (for example, a leuco coloring agent) develops color by a radical, an acid, or a base generated from the photoradical polymerization initiator, the photocationic polymerization initiator, or the photobase generator after exposure.

In the coloring agent B, from the viewpoint of visibility of the exposed portion and non-exposed portion, the maximal absorption wavelength in a wavelength range of 400 nm to 780 nm during color development is preferably 550 nm or more, more preferably 550 nm to 700 nm, and still more preferably 550 nm to 650 nm.

In addition, the coloring agent B may have only one maximal absorption wavelength in the wavelength range of 400 nm to 780 nm during color development, or may have two or more thereof. In a case where the coloring agent B has two or more maximal absorption wavelengths in the wavelength range of 400 nm to 780 nm during color development, it is sufficient that the maximal absorption wavelength having the highest absorbance in the two or more maximal absorption wavelengths is 450 nm or more.

The maximal absorption wavelength of the coloring agent B is obtained by measuring a transmission spectrum of a solution containing the coloring agent B (solution temperature: 25° C.) in a range of 400 nm to 780 nm using a spectrophotometer UV3100 (manufactured by Shimadzu Corporation), and detecting a wavelength (maximal absorption wavelength) at which the intensity of light is minimal.

Examples of the coloring agent which develops or is decolorized by exposure include a leuco compound.

Examples of the coloring agent which is decolorized by exposure include a leuco compound, a diarylmethane-based coloring agent, an oxazine-based coloring agent, a xanthene-based coloring agent, an iminonaphthoquinone-based coloring agent, an azomethine-based coloring agent, and an anthraquinone-based coloring agent.

As the coloring agent B, from the viewpoint of visibility of the exposed portion and non-exposed portion, a leuco compound is preferable.

Examples of the leuco compound include a leuco compound having a triarylmethane skeleton (triarylmethane-based coloring agent), a leuco compound having a spiropyran skeleton (spiropyran-based coloring agent), a leuco compound having a fluorane skeleton (fluorane-based coloring agent), a leuco compound having a diarylmethane skeleton (diarylmethane-based coloring agent), a leuco compound having a lodamine lactam skeleton (lodamine lactam-based coloring agent), a leuco compound having an indolylphthalide skeleton (indolylphthalide-based coloring agent), and a leuco compound having a leuco auramine skeleton (leuco auramine-based coloring agent).

Among these, a triarylmethane-based coloring agent or a fluorane-based coloring agent is preferable, and a leuco compound having a triarylmethane skeleton (triarylmethane-based coloring agent) or a fluorane-based coloring agent is more preferable.

As the leuco compound, from the viewpoint of visibility of the exposed portion and non-exposed portion, it is preferable to have a lactone ring, a sultine ring, or a sultone ring. As a result, by reacting the lactone ring, sultine ring, or sultone ring included in the leuco compound with the radical generated from the photoradical polymerization initiator or the acid generated with the photocationic polymerization initiator, the leuco compound can be changed to a ring-linked state to be decolorized, or the leuco compound can be changed to a ring-opening state to be colored. As the leuco compound, a compound which has a lactone ring, a sultine ring, or a sultone ring, in which the lactone ring, sultine ring, or sultone ring is opened by a radical or an acid to develop color, is preferable, and a compound which has a lactone ring, in which the lactone ring is opened by a radical or an acid to develop color, is more preferable.

Examples of the coloring agent B include the following dyes and leuco compounds.

In the coloring agent B, specific examples of the dye include Brilliant Green, Ethyl Violet, Methyl Green, Crystal Violet, Basic Fuchsin, Methyl Violet 2B, Quinaldine Red, Rose Bengale, Metanil Yellow, Thymolsulfonphthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsin, Victoria Pure Blue-naphthalene sulfonate, Victoria Pure Blue BOH (manufactured by Hodogaya Chemical Co., Ltd.), Oil Blue #603 (manufactured by Orient Chemical Industry Co., Ltd.), Oil Pink #312 (manufactured by Orient Chemical Industry Co., Ltd.), Oil Red 5B (manufactured by Orient Chemical Industry Co., Ltd.), Oil Scarlet #308 (manufactured by Orient Chemical Industry Co., Ltd.), Oil Red OG (manufactured by Orient Chemical Industry Co., Ltd.), Oil Red RR) manufactured by Orient Chemical Industry Co., Ltd.), Oil Green #502 (manufactured by Orient Chemical Industry Co., Ltd.), Spiron Red BEH Special (manufactured by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone, and 1-β-naphthyl-4-p-diethylaminophenylimino-5-pyrazolone.

In the coloring agent B, specific examples of the leuco compound include p,p',p"-hexamethyltriaminotriphenylmethane (Leuco Crystal Violet), Pergascript Blue SRB (manufactured by Ciba Geigy), Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino) fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino) fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl) phthalide, 3,3-bis(1-n-butyl-2-methylindol-3-yl) phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, 3-(4-diethylaminophenyl)-3-(1-ethyl-2-methylindol-3-yl) phthalide, 3',6'-bis(diphenylamino) spiroisobenzofuran-1 (3H), and 9'-[9H]xanthen-3-one.

As the coloring agent B, from the viewpoint of visibility of the exposed portion and non-exposed portion, pattern visibility after development, and resolution, a coloring agent in which the maximal absorption wavelength changes by a radical is preferable, and a coloring agent which develops color by a radical is more preferable.

As the coloring agent B, Leuco Crystal Violet, Crystal Violet Lactone, Brilliant Green, or Victoria Pure Blue-naphthalene sulfonate is preferable.

The coloring agent B may be used alone, or in combination of two or more kinds thereof.

From the viewpoint of visibility of the exposed portion and non-exposed portion, a content of the coloring agent B is preferably 0.2% by mass or more, more preferably 0.2% by mass to 6% by mass, still more preferably 0.2% by mass to 5% by mass, and particularly preferably 0.25% by mass to 3.0% by mass with respect to the total mass of the thermoplastic resin layer.

Here, the content of the coloring agent B means the content of coloring agent in a case where all of the coloring agents B included in the thermoplastic resin layer is in a color developing state. Hereinafter, a method for quantifying the content of the coloring agent B will be described by taking a coloring agent which develops color by a radical as an example.

A solution in which 0.001 g of the coloring agent is dissolved in 100 mL of methyl ethyl ketone and a solution in which 0.01 g of the coloring agent is dissolved in 100 mL of methyl ethyl ketone are prepared. A photoradical polymerization initiator Irgacure OXE01 (product name, BASF Japan) is added to each of the obtained solutions, and radicals are generated by irradiating the solutions with light of 365 nm to bring all the coloring agents into a color developing state. Thereafter, in an atmospheric atmosphere, an absorbance of each solution having a solution temperature of 25° C. is measured using a spectrophotometer (UV3100, manufactured by Shimadzu Corporation) to create a calibration curve.

Next, in the same manner as described above except that, instead of the coloring agent, 0.1 g of thermoplastic resin layer is dissolved in methyl ethyl ketone, an absorbance of the solution in which all the coloring agents develop color is measured. From the absorbance of the obtained solution containing the thermoplastic resin layer, the amount of the coloring agent included in the thermoplastic resin layer is calculated based on the calibration curve.

Compound which Generates Acid, Base, or Radical with Light

The thermoplastic resin layer may contain a compound (also simply referred to as a "compound C") which generates an acid, a base, or a radical with light.

As the compound C, a compound which receives an actinic ray such as ultraviolet rays and visible rays to generate an acid, a base, or a radical is preferable.

As the compound C, a known photoacid generator, photobase generator, or photoradical polymerization initiator (photoradical generator) can be used. Among these, a photoacid generator is preferable.

Photoacid Generator

From the viewpoint of resolution, the thermoplastic resin layer preferably contains a photoacid generator.

Examples of the photoacid generator include the photocationic polymerization initiator which may be contained in the above-described photosensitive layer, and a preferred aspect thereof is the same except for the points described later.

From the viewpoint of sensitivity and resolution, the photoacid generator preferably contains at least one compound selected from the group consisting of an onium salt compound and an oxime sulfonate compound, and from the viewpoint of sensitivity, resolution, and adhesiveness, more preferably contains an oxime sulfonate compound.

In addition, as the photoacid generator, a photoacid generator having the following structure is also preferable.

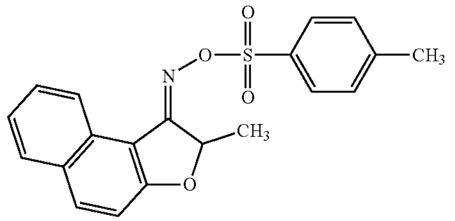

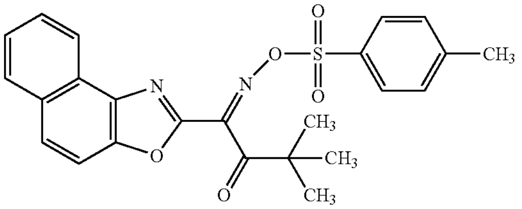

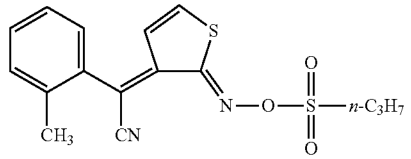

Photoradical Polymerization Initiator

The thermoplastic resin layer may contain a photoradical polymerization initiator (photoradical generator).

Examples of the photoradical polymerization initiator include the photoradical polymerization initiator which may be contained in the above-described photosensitive layer, and a preferred aspect thereof is the same.

Photobase Generator

The thermoplastic resin layer may contain a photobase generator.

The photobase generator is not particularly limited as long as it is a known photobase generator, and examples thereof include 2-nitrobenzylcyclohexylcarbamate, triphenylmethanol, O-carbamoylhydroxylamide, O-carbamoyloxime, {[(2,6-dinitrobenzyl)oxy]carbonyl}cyclohexylamine, bis {[(2-nitrobenzyl)oxy]carbonyl}hexane-1,6-diamine, 4-(methylthiobenzoyl)-1-methyl-1-morpholinoethane, (4-morpholinobenzoyl)-1-benzyl-1-dimethylaminopropane, N-(2-nitrobenzyloxycarbonyl) pyrrolidine, hexaamminecobalt (III) tris(triphenylmethylborate), 2-benzyl-2-dimethylamino-1-(4-morpholinophenyl) butanone, 2,6-dimethyl-3,5-diacetyl-4-(2-nitrophenyl)-1,4-dihydropyridine, and 2,6-dimethyl-3,5-diacetyl-4-(2,4-dinitrophenyl)-1,4-dihydropyridine.

The thermoplastic resin layer may contain one kind of compound C alone or two or more kinds thereof.

From the viewpoint of visibility and resolution of the exposed portion and non-exposed portion, a content of the compound C is preferably 0.1% by mass to 10% by mass and more preferably 0.5% by mass to 5% by mass with respect to the total mass of the thermoplastic resin layer.

Plasticizer

From the viewpoint of resolution, adhesiveness to an adjacent layer, and developability, the thermoplastic resin layer preferably contains a plasticizer.

The plasticizer preferably has a smaller molecular weight (in a case of being an oligomer or polymer, weight-average molecular weight (Mw)) than the alkali-soluble resin. The molecular weight (weight-average molecular weight (Mw)) of the plasticizer is preferably 200 to 2,000.

The plasticizer is not particularly limited as long as it is compatible with the alkali-soluble resin and exhibits plasticity, but from the viewpoint of applying plasticity, the plasticizer preferably has an alkyleneoxy group in the molecule, and is more preferably a polyalkylene glycol compound. It is more preferable that the alkyleneoxy group included in the plasticizer has a polyethyleneoxy structure or a polypropyleneoxy structure.

In addition, from the viewpoint of resolution and storage stability, the plasticizer preferably contains a (meth)acrylate compound. From the viewpoint of compatibility, resolution, and adhesiveness to an adjacent layer, it is more preferable that the alkali-soluble resin is an acrylic resin and the plasticizer contains a (meth)acrylate compound.

Examples of the (meth)acrylate compound used as the plasticizer include the (meth)acrylate compound described as the ethylenically unsaturated compound contained in the above-described photosensitive layer.

In the photosensitive transfer material, in a case where the thermoplastic resin layer and the photosensitive layer are directly contacted and laminated, it is preferable that both the thermoplastic resin layer and the photosensitive layer contain the same (meth)acrylate compound. In a case where the thermoplastic resin layer and the photosensitive layer each contain the same (meth)acrylate compound, diffusion of components between layers is suppressed, so that storage stability is improved.

In a case where the thermoplastic resin layer contains a (meth)acrylate compound as the plasticizer, from the viewpoint of adhesiveness to an adjacent layer, it is preferable that the (meth)acrylate compound does not polymerize even in the exposed portion after exposure.

In addition, as the (meth)acrylate compound used as the plasticizer, from the viewpoint of resolution, adhesiveness to an adjacent layer, and developability, a polyfunctional (meth)acrylate compound having two or more (meth)acryloyl groups in one molecule is preferable.

Further, as the (meth)acrylate compound used as the plasticizer, a (meth)acrylate compound having an acid group or a urethane (meth)acrylate compound is also preferable.

The thermoplastic resin layer may contain one kind of plasticizer alone or two or more kinds thereof.

From the viewpoint of resolution, adhesiveness to an adjacent layer, and developability, a content of the plasticizer is preferably 1% by mass to 70% by mass, more preferably 10% by mass to 60% by mass, and particularly preferably 20% by mass to 50% by mass with respect to the total mass of the thermoplastic resin layer.

Surfactant

From the viewpoint of thickness uniformity, the thermoplastic resin layer preferably contains a surfactant.

Examples of the surfactant include the surfactant which may be contained in the above-described photosensitive layer, and a preferred aspect thereof is the same.

The thermoplastic resin layer may contain one kind of surfactant alone or two or more kinds thereof.

A content of the surfactant is preferably 0.001% by mass to 10% by mass and more preferably 0.01% by mass to 3% by mass with respect to the total mass of the thermoplastic resin layer.

Sensitizer

The thermoplastic resin layer may contain a sensitizer.

The sensitizer is not particularly limited, and examples thereof include the sensitizer which may be contained in the above-descried photosensitive layer.

The thermoplastic resin layer may contain one kind of sensitizer alone or two or more kinds thereof.

A content of the sensitizer can be appropriately selected according to the purpose, but from the viewpoint of improvement of sensitivity to the light source and visibility of the exposed portion and non-exposed portion, the content is preferably in a range of 0.01% by mass to 5% by mass and more preferably in a range of 0.05% by mass to 1% by mass with respect to the total mass of the thermoplastic resin layer.

Additive and the Like

In addition to the above-described components, the thermoplastic resin layer may contain a known additive as necessary.

In addition, the thermoplastic resin layer is described in paragraphs 0189 to 0193 of JP2014-85643A, and the contents described in this publication are incorporated herein by reference.

Physical Properties and the Like

A layer thickness of the thermoplastic resin layer is not particularly limited, but from the viewpoint of adhesiveness to an adjacent layer, is preferably 1 μm or more and more preferably 2 μm or more. The upper limit is not particularly limited, but from the viewpoint of developability and resolution, 20 μm or less is preferable, 10 μm or less is more preferable, and 5 μm or less is still more preferable.

Forming Method

A forming method of the thermoplastic resin layer is not particularly limited as long as it is a method capable of forming a layer containing the above-described components.

Examples of the forming method of the thermoplastic resin layer include a method in which a thermoplastic resin composition containing the above-described components and a solvent is prepared, the thermoplastic resin composition is applied to a surface of the temporary support or the like, and a coating film of the thermoplastic resin composition is dried to form the thermoplastic resin layer.

In order to adjust a viscosity of the thermoplastic resin composition and facilitate the formation of the thermoplastic resin layer, the thermoplastic resin composition preferably contains a solvent.

Solvent

The solvent contained in the thermoplastic resin composition is not particularly limited as long as it can dissolve or disperse the above-described components contained in the thermoplastic resin layer.

Examples of the solvent contained in the thermoplastic resin composition include the solvent which may be contained in the above-described photosensitive resin composition, and a preferred aspect thereof is the same.

The solvent contained in the thermoplastic resin composition may be one kind alone or two or more kinds.

A content of the solvent in a case of applying the thermoplastic resin composition is preferably 50 parts by mass to 1,900 parts by mass and more preferably 100 parts by mass to 900 parts by mass with respect to 100 parts by mass of the total solid content in the thermoplastic resin composition.

The preparation of the thermoplastic resin composition and the formation of the thermoplastic resin layer may be carried out according to the preparing method of the photosensitive resin composition and the forming method of the photosensitive layer described above.

For example, a solution in which each component contained in the thermoplastic resin layer is dissolved in the above-described solvent is prepared in advance, the obtained solution is mixed in a predetermined ratio to prepare a thermoplastic resin composition. Thereafter, the obtained thermoplastic resin composition is applied to a surface of the temporary support, and a coating film of the thermoplastic resin composition is dried to form the thermoplastic resin layer.

In addition, after forming the photosensitive layer and a water-soluble resin layer on a protective film described later, the thermoplastic resin layer may be formed on a surface of the water-soluble resin layer.

Water-Soluble Resin Layer

The photosensitive transfer material preferably includes a water-soluble resin layer between the thermoplastic resin layer and the photosensitive layer. By providing the water-soluble resin layer, it is possible to suppress mixing of the components in a case where a plurality of layers are applied and the layers are stored after application.

From the viewpoint of developability and viewpoint of suppressing the mixing of the components in a case where a plurality of layers are applied and the layers are stored after application, the water-soluble resin layer is preferably a water-soluble layer.

In the present specification, "water-soluble" means that the solubility in 100 g of water with a pH of 7.0 at a liquid temperature of 22° C. is 0.1 g or more.

Examples of the water-soluble resin layer include an oxygen blocking layer having an oxygen blocking function, which is described as a "separation layer" in JP1993-72724A (JP-H5-72724A). In a case where the water-soluble resin layer is an oxygen blocking layer, the sensitivity during exposure is improved, the time load of the exposure machine is reduced, so that the productivity is improved, which is preferable.

The oxygen blocking layer used as the water-soluble resin layer may be appropriately selected from a known layer described in the above-described publication and the like. Among these, an oxygen blocking layer which exhibits low oxygen permeability and dispersed and is dispersed or dissolved in water or an alkali aqueous solution (1% by mass aqueous solution of sodium carbonate at 22° C.) is preferable.

The water-soluble resin layer preferably contains a resin.

Examples of the resin contained in the water-soluble resin layer include resins such as a polyvinyl alcohol-based resin, a polyvinylpyrrolidone-based resin, a cellulose-based resin, an acrylamide-based resin, a polyethylene oxide-based resin, gelatin, a vinyl ether-based resin, a polyamide resin, and a copolymer thereof.

As the resin contained in the water-soluble resin layer, a water-soluble resin is preferable.

In addition, from the viewpoint of suppressing the mixing of components between the plurality of layers, it is preferable that the resin contained in the water-soluble resin layer is a resin different from both the resin contained in the photosensitive layer and the thermoplastic resin (for example, the alkali-soluble resin) contained in the thermoplastic resin layer.

From the viewpoint of oxygen blocking property and viewpoint of suppressing the mixing of the components in a case where a plurality of layers are applied and the layers are stored after application, the water-soluble resin layer preferably contains polyvinyl alcohol, and more preferably contains both polyvinyl alcohol and polyvinylpyrrolidone.

The water-soluble resin layer may contain one kind of the above-descried resin alone or two or more kinds thereof.

A content of the resin in the water-soluble resin layer is not particularly limited, but from the viewpoint of oxygen blocking property and viewpoint of suppressing the mixing of the components in a case where a plurality of layers are applied and the layers are stored after application, the content of the resin is preferably 50% by mass to 100% by mass, more preferably 70% by mass to 100% by mass, still more preferably 80% by mass to 100% by mass, and particularly preferably 90% by mass to 100% by mass with respect to the total mass of the water-soluble resin layer.

In addition, the water-soluble resin layer may include an additive such as a surfactant as necessary.

A layer thickness of the water-soluble resin layer is not particularly limited, but is preferably 0.1 μm to 5 μm and more preferably 0.5 μm to 3 μm.

In a case where the thickness of the water-soluble resin layer is within the above-described range, the mixing of the components in a case where a plurality of layers are applied and the layers are stored after application can be suppressed without deteriorating the oxygen blocking property, and it is possible to suppress an increase in water-soluble resin layer removal time during development.

A forming method of the water-soluble resin layer is not particularly limited, and examples thereof include a method in which a water-soluble resin layer composition containing the above-described resin and an optional additive is prepared, the water-soluble resin layer composition is applied to a surface of the thermoplastic resin layer or the photosensitive layer, and a coating film of the water-soluble resin layer composition is dried to form the water-soluble resin layer.

In order to adjust a viscosity of the water-soluble resin layer composition and facilitate the formation of the water-soluble resin layer, the water-soluble resin layer composition preferably contains a solvent.

The solvent contained in the water-soluble resin layer composition is not particularly limited as long as it can dissolve or disperse the above-described resin, and at least one selected from the group consisting of water and a water-miscible organic solvent is preferable, water or a mixed solvent of water and a water-miscible organic solvent is more preferable.

Examples of the water-miscible organic solvent include an alcohol having 1 to 3 carbon atoms, acetone, ethylene glycol, and glycerin, and an alcohol having 1 to 3 carbon atoms is preferable and methanol or ethanol is more preferable.

Functional Layer

The photosensitive transfer material may include a functional layer between the temporary support or the thermoplastic resin layer and the photosensitive layer.

Examples of the functional layer include an oxygen-blocking film having an oxygen blocking function, which is described in paragraph 0027 of JP4502784B.

The oxygen-blocking film is preferably a film which exhibits low oxygen permeability and is dispersed or dissolved in water or an alkali aqueous solution, and is appropriately selected from a known oxygen-blocking film. Among these, an oxygen-blocking film including a combination of polyvinyl alcohol and polyvinylpyrrolidone is preferable.

A dry thickness of the functional layer is preferably 0.2 μm to 5 μm, more preferably 0.5 μm to 3 μm, and still more preferably 1 μm to 2.5 μm.

Protective Film

The photosensitive transfer material preferably includes a protective film which is in contact with a surface of the photosensitive layer not facing the temporary support.

Examples of a material constituting the protective film include a resin film and paper, and from the viewpoint of strength and flexibility, a resin film is preferable.

Examples of the resin film include a polyethylene film, a polypropylene film, a polyethylene terephthalate film, a cellulose triacetate film, a polystyrene film, and a polycarbonate film. Among these, a polyethylene film, a polypropylene film, or a polyethylene terephthalate film is preferable.

A thickness (layer thickness) of the protective film is not particularly limited, but is preferably 5 μm to 100 μm and more preferably 10 to 50 μm.

In addition, from the viewpoint that the resolution is more excellent, an arithmetic average roughness Ra value of the surface of the protective film facing the photosensitive layer (hereinafter, also simply referred to as a "surface of the protective film") is preferably 0.3 μm or less, more preferably 0.1 μm or less, and still more preferably 0.05 μm or less. In a case where the Ra value of the surface of the protective film is within the above-described range, it is considered that uniformity of the layer thickness of the photosensitive layer and the formed resin pattern is improved.

The lower limit of the Ra value of the surface of the protective film is not particularly limited, but is preferably 0.001 μm or more.

The Ra value of the surface of the protective film is measured by the following method.

Using a three-dimensional optical profiler (New View7300 manufactured by Zygo Corporation), the surface of the protective film is measured under the following conditions to obtain a surface profile of the optical film.

As a measurement/analysis software, Microscope Application of MetroPro ver. 8.3.2 is used. Next, a Surface Map screen is displayed by the above-described analysis software, and a histogram data is obtained in the Surface Map screen. From the obtained histogram data, an arithmetic average roughness is calculated to obtain the Ra value of the surface of the protective film.

In a case where the protective film is bonded to the photosensitive transfer material, the protective film may be peeled off from the photosensitive transfer material and the Ra value of the surface on the peeled side may be measured.

A method of bonding the protective film to the photosensitive layer or the like is not particularly limited, and a known method can be mentioned.

Examples of an apparatus for bonding the protective film to the photosensitive layer and the like include known laminators such as a vacuum laminator and an auto-cut laminator.

It is preferable that the laminator is equipped with any heatable roller such as a rubber roller and can perform pressing and heating.

The photosensitive transfer material may include a layer other than the above-described layers (hereinafter, also referred to as "other layers"). Examples of the other layers include a contrast enhancement layer.

The contrast enhancement layer is described in paragraph 0134 of WO2018/179640A. In addition, the other layers are described in paragraphs 0194 to 0196 of JP2014-85643A. The contents of these publications are incorporated in this specification.

From the viewpoint of exerting the effect in the present disclosure more, a total thickness of each layer in the photosensitive transfer material excluding the temporary support and the protective film is preferably 20 μm or less, more preferably 10 μm or less, still more preferably 8 μm or less, and particularly preferably 2 μm to 8 μm.

In addition, from the viewpoint of exerting the effect in the present disclosure more, a total thickness of the photosensitive layer, the water-soluble resin layer, and the thermoplastic resin layer in the photosensitive transfer material is preferably 20 μm or less, more preferably 10 μm or less, still more preferably 8 μm or less, and particularly preferably 2 μm to 8 μm.

The photosensitive transfer material according to the embodiment of the present disclosure can be suitably used for various applications requiring precision microfabrication by photolithography. After patterning the photosensitive layer, etching may be performed using the photosensitive layer as a film, or electroforming may be performed mainly by electroplating. In addition, a cured film obtained by patterning may be used as a permanent film, or may be used, for example, an interlayer insulating film, a wiring protective film, a wiring protective film having an index matching layer, or the like. In addition, the photosensitive transfer material according to the embodiment of the present disclosure can be suitably used for various wiring formation applications for semiconductor packages, printed circuit boards, and sensor boards; conductive films such as LED arrays, touch panels, electromagnetic shielding materials, and film heaters; and applications of structures in liquid crystal sealing materials, micromachines, and microelectronics fields.

Manufacturing Method of Photosensitive Transfer Material

A manufacturing method of the photosensitive transfer material used in the present disclosure is not particularly limited, and a known manufacturing method, for example, known forming methods of each layer can be used.

Hereinafter, the manufacturing method of the photosensitive transfer material according to the embodiment of the present disclosure will be described with reference to FIG. 1. However, the photosensitive transfer material according to the embodiment of the present disclosure is not limited to the photosensitive transfer material having a configuration shown in FIG. 1.

FIG. 1 is a schematic cross-sectional view showing an example of a layer structure in one embodiment of the photosensitive transfer material according to the present disclosure. The photosensitive transfer material 20 shown in FIG. 1 has a configuration in which the temporary support 11, the thermoplastic resin layer 13, the functional layer 15, the photosensitive layer 17, and the protective film 19 are laminated in this order.

Examples of the manufacturing method of the above-described photosensitive transfer material 20 include a step of applying the thermoplastic resin composition to a surface of the temporary support 11 and then drying a coating film of the thermoplastic resin composition to form the thermoplastic resin layer 13, a step of applying a composition for forming the functional layer to a surface of the thermoplastic resin layer 13 and then drying a coating film of the composition for forming the functional layer to form the functional layer 15, and a step of applying the photosensitive resin composition to a surface of the functional layer 15 and then drying a coating film of the photosensitive resin composition to form the photosensitive layer 17.

In the above-described manufacturing method, it is preferable to use a thermoplastic resin composition containing at least one selected from the group consisting of an alkylene glycol ether solvent and an alkylene glycol ether acetate solvent, a composition for forming the functional layer containing at least one selected from the group consisting of water and a water-miscible organic solvent, and a photosensitive resin composition containing at least one selected from the group consisting of an alkylene glycol ether solvent and an alkylene glycol ether acetate solvent. As a result, during the application of the composition for forming the functional layer to the surface of the thermoplastic resin layer 13 and/or the storage period of the laminate having the coating film of the composition for forming the functional layer, the mixing of components contained in the thermoplastic resin layer 13 and components contained in the functional layer 15 can be suppressed. In addition, during the application of the photosensitive resin composition to the surface of the functional layer 15 and/or the storage period of the laminate having the coating film of the photosensitive resin composition, the mixing of components contained in the functional layer 15 and components contained in the photosensitive layer 17 can be suppressed.

The photosensitive transfer material 20 is manufactured by pressing the protective film 19 onto the photosensitive layer 17 of the laminate manufactured by the above-described manufacturing method.

In the manufacturing method of the photosensitive transfer material used in the present disclosure, it is preferable to manufacture the photosensitive transfer material 20 including the temporary support 11, the thermoplastic resin layer 13, the functional layer 15, the photosensitive layer 17, and the protective film 19 by including a step of providing the protective film 19 so as to be in contact with a second surface of the photosensitive layer 17.

After the photosensitive transfer material 20 is manufactured by the above-described manufacturing method, the photosensitive transfer material 20 may be wound up to produce and store the photosensitive transfer material in a form of a roll. The roll-shaped photosensitive transfer material is provided as it is in a bonding step described later with the substrate in a roll-to-roll method.

The photosensitive transfer material according to the embodiment of the present disclosure can be suitably used for manufacturing a light shielding material for an LED array.

Light Shielding Material

A light shielding material according to an embodiment of the present disclosure includes a resin layer having a first surface, a second surface which is a surface opposite to the first surface, and through-holes which extend from the first surface to the second surface, in which a transmittance of the resin layer to light having a wavelength of 830 nm is 0.1% or more.

The light shielding material according to the embodiment of the present disclosure can be suitably used as a light shielding material for an LED array.

Base Material

The light shielding material according to the embodiment of the present disclosure includes a base material.

As the base material used for the light shielding material according to the embodiment of the present disclosure, a known base material or a known substrate may be used.

Examples of the base material include glass, silicon, and a film.

The base material is preferably transparent. In the present specification, "transparent" means that a transmittance of light having a wavelength of 400 nm to 700 nm is 80% or more.

In addition, a refractive index of the substrate constituting the base material is preferably 1.50 to 1.52.

Examples of the transparent glass substrate include tempered glass represented by Gorilla glass of Corning. In addition, as the transparent glass substrate, materials used in JP2010-86684A, JP2010-152809A, and JP2010-257492A can be used.

In a case where a film is used as the base material, it is preferable to use a film having low optical distortion and/or high transparency. Examples of a material of such a film include polyethylene terephthalate (PET), polyethylene naphthalate, polycarbonate, triacetyl cellulose, polyimide, and a cycloolefin polymer.

In a case of being manufactured by the roll-to-roll method, as the base material, a film is preferable.

In a case where a substrate is used, as the base material, a substrate having a conductive layer is preferable, and it is more preferable to have a conductive layer on a surface of the substrate.

The substrate may have optional layer other than the conductive layer as necessary.

Examples of the substrate include a resin substrate, a glass substrate, and a semiconductor substrate.

Examples of the conductive layer included in the substrate include a conductive layer such as a circuit wiring.

As the conductive layer, from the viewpoint of conductivity and fine line formability, at least one layer selected from the group consisting of a metal layer, a conductive metal oxide layer, a graphene layer, a carbon nanotube layer, and a conductive polymer layer is preferable, a metal layer is more preferable, and a copper layer or a silver layer is still more preferable.

The substrate may include one kind of conductive layer alone or two or more kinds thereof. In a case of having two or more conductive layers, it is preferable to have conductive layers formed of different materials.

Examples of a material of the conductive layer include metals and conductive metal oxides.

Examples of the metal include Al, Zn, Cu, Fe, Ni, Cr, Mo, Ag, and Au.

Examples of the conductive metal oxide include indium tin oxide (ITO), indium zinc oxide (IZO), and $SiO_2$.

In the present specification, the "conductive" means that a volume resistivity is less than $1\times10^6\Omega\cdot cm$. The volume resistivity of the conductive metal oxide is preferably less than $1\times10^4\Omega\cdot cm$.

In a case where the light shielding material is manufactured using the substrate having a plurality of conductive layers, it is preferable that at least one of the plurality of conductive layers contains the conductive metal oxide.

The substrate having a conductive layer may have a transparent electrode.

The transparent electrode can function suitably as an electrode for a touch panel. The transparent electrode is preferably composed of a metal oxide film such as indium tin oxide (ITO) and indium zinc oxide (IZO), a metal mesh, and a fine metal wire such as a silver nanowire.

Examples of the fine metal wire include thin wire of silver and copper. Among these, silver conductive materials such as silver mesh and silver nanowire are preferable.

Resin Layer

The light shielding material according to the embodiment of the present disclosure includes a resin layer on the above-described base material.

The above-described resin layer in the light shielding material according to the embodiment of the present disclosure is preferably a layer obtained by curing the above-described photosensitive layer in the photosensitive transfer material according to the embodiment of the present disclosure according to the embodiment of the present disclosure. In addition, the above-described resin layer preferably has a patterned shape having a desired shape.

Preferred aspects of each component of the above-described resin layer are the same as the preferred aspects of each component of the above-described photosensitive layer in the photosensitive transfer material according to the embodiment of the present disclosure, except as described below, and except components in which a chemical structure changes before and after curing.

From the viewpoint of dense black appearance and strength, a content of the resin included in the above-described resin layer is preferably 30% by mass to 90% by mass, more preferably 40% by mass to 80% by mass, and particularly preferably 55% by mass to 80% by mass with respect to the total mass of the above-described resin layer.

Transmittance to Light Having Wavelength of 830 nm

In the light shielding material according to the embodiment of the present disclosure, the transmittance of the above-described resin layer to light having a wavelength of 830 nm is 0.1% or more, and from the viewpoint of dense black appearance and rectangularity of the pattern, the transmittance is preferably 0.15% to 30% and more preferably 0.20% to 20%.

Optical Density in Light Having Wavelength of 550 nm

In the light shielding material according to the embodiment of the present disclosure, from the viewpoint of dense black appearance and rectangularity of the pattern, an optical density of the above-described resin layer in light having a wavelength of 550 nm is preferably 1.5 or more, more preferably 2.5 or more, still more preferably 3.0 or more, and particularly preferably 3.0 to 5.0.

The above-described resin layer has a first surface, a second surface which is a surface opposite to the first surface, and through-holes which extend from the first surface to the second surface. A shape of the through-hole is not particularly limited, and examples thereof include cylindrical, polygonal, elliptical, conical, inverted cone, polygonal frustum, inverted polygonal frustum, elliptical frustum, inverted elliptical frustum. In addition, a cross-sectional shape of the surface perpendicular to the thickness direction of the above-described resin layer may be irregular.

In addition, from the viewpoint of rectangularity of the obtained pattern, tilt angles formed by side surfaces of the through-holes and the surface of the base material is preferably 60° or more, more preferably 70° to 110°, and particularly preferably 80° to 100°.

From the viewpoint of rectangularity of the obtained pattern, brightness of LED, and luminous efficacy of LED, an average value of sizes of the above-described through-holes on the surface in contact with the base material is preferably 100 μm, more preferably 60 μm or less, still more preferably 50 μm or less, and particularly preferably 1 μm or more and 50 μm or less.

A layer thickness of the above-described resin layer is not particularly limited, but from the viewpoint that the effects in the present disclosure are more excellent, is often 30 μm or less, preferably 20 μm or less, more preferably 15 μm or less, and particularly preferably 10 μm or less. From the viewpoint that hardness is excellent, the lower limit is preferably 0.60 μm or more and more preferably 1.5 μm or more.

For example, the thickness of the above-described resin layer, the above-described tilt angles, and the above-described average value of the sizes of the through-holes are obtained as an average value of 5 random points measured by cross-sectional observation with a scanning electron microscope (SEM).

Manufacturing Method of Light Shielding Material

A manufacturing method of the light shielding material according to the embodiment of the present disclosure is not particularly limited, and a manufacturing method for forming the resin layer on the substrate using the photosensitive transfer material according to the embodiment of the present disclosure is preferable.

As the manufacturing method of the light shielding material, a method including, in the following order, a step (hereinafter, also referred to as a "bonding step") of bringing an outermost layer of the photosensitive transfer material according to the embodiment of the present disclosure on a side having the photosensitive layer to the above-described temporary support in contact with the substrate and bonding them together, a step (hereinafter, also referred to as an "exposing step") of exposing the photosensitive layer in a patterned manner, and a step (hereinafter, also referred to as a "developing step") of developing the exposed photosensitive layer to form the resin layer.

In addition, in the manufacturing method of the light shielding material according to the embodiment of the present disclosure, from the viewpoint of exerting the effect in the present disclosure more, it is preferable that at least a part of the above-described resin layer includes a hole pattern (through-holes), and it is more preferable that at least a part of the above-described resin pattern includes a hole pattern (through-holes) having a maximum diameter of an opening portion of 100 μm or less.

Bonding Step

The manufacturing method of the light shielding material preferably includes the bonding step.

In the bonding step, it is preferable that the base material (in a case where the conductive layer is provided on the surface of the base material, the conductive layer) is brought into contact with the outermost layer of the photosensitive transfer material on the side having the photosensitive layer to the above-described temporary support, and the photosensitive transfer material and the base material are pressure-bonded together. In the above-described aspect, adhesiveness between the outermost layer of the photosensitive transfer material on the side having the photosensitive layer to the above-described temporary support and the substrate is improved.

In a case where the photosensitive transfer material includes a protective film, it is sufficient that the bonding is performed after removing the protective film from the surface of the photosensitive layer.

In addition, in the bonding step, in a case where the photosensitive transfer material is further provided with a layer (for example, a layer of high refractive index and/or a layer of low refractive index) other than the protective film on the surface of the photosensitive on the side not facing the temporary support, the surface of the photosensitive layer on the side which does not have the temporary support and the substrate are bonded together through the layer.

A method for pressure-bonding the base material and the photosensitive transfer material is not particularly limited, and a known transfer method or laminating method can be used.

The bonding of the photosensitive transfer material to the base material is preferably performed by superimposing the outermost layer of the photosensitive transfer material on the side having the photosensitive layer to the above-described temporary support and the base material, and then applying pressure and heating by a unit such a roll. For the bonding, it is possible to use a known laminator such as a laminator, a vacuum laminator, and an auto-cut laminator capable of further improving productivity.

A laminating temperature is not particularly limited, but is preferably, for example, 70° C. to 130° C.

The manufacturing method of the light shielding material, which includes the bonding step, is preferably performed by a roll-to-roll method.

Hereinafter, the roll-to-roll method will be described.

The roll-to-roll method refers to a method in which, as the substrate, a substrate which can be wound up and unwound is used, a step (also referred to as a "unwinding step") of unwinding the substrate or a structure including the substrate is included before any of the steps included in the manufacturing method of the resin pattern or the manufacturing method of the circuit wiring, a step (also referred to as a "winding step") of winding the substrate or the structure including the substrate is included after any of the steps, and at least one of the steps (preferably, all steps or all steps other than the heating step) is performed while transporting the substrate or the structure including the substrate.

A unwinding method in the unwinding step and a winding method in the winding step are not particularly limited, and a known method may be used in the manufacturing method to which the roll-to-roll method is adopted.

Exposing Step

The manufacturing method of the light shielding material preferably includes a step (exposing step) of exposing the photosensitive layer in a patterned manner after the above-described bonding step.

Here, the "exposure in a patterned manner" refers to exposure in a form of performing the exposure in a patterned manner, that is, a form in which an exposed portion and a non-exposed portion are present.

A positional relationship between the exposed portion and the non-exposed portion in the exposure in a patterned manner is not particularly limited and is appropriately adjusted.

Detailed arrangement and specific size of the pattern in the pattern exposure are not particularly limited. For example, in order to improve display quality of a display device (for example, a touch panel) equipped with an input device having a circuit wiring manufactured by the manufacturing method of the circuit wiring and to reduce an area occupied by a take-out wiring, at least a part of the pattern (preferably, a part of the electrode pattern of the touch panel and/or the take-out wiring) preferably includes a thin line having a width of 20 μm or less, and more preferably includes a thin line having a width of 10 μm or less.

Exposing Step

The production method of the light shielding material according to the embodiment of the present disclosure preferably includes an exposing step of image-wise exposing the photosensitive transfer material according to the embodiment of the present disclosure, which has been transferred to the base material, to form an exposed portion and a non-exposed portion. It is preferable that the photosensitive transfer material according to the embodiment of the present disclosure is exposed with laser through a transparent original image having a line image, a halftone image, or the like, or image-wise exposed by laser beam scanning according to digital data.

A wavelength of a light source is preferably 750 nm to 1,400 nm. As the light source having a wavelength of 750 nm to 1,400 nm, a solid-state laser or a semiconductor laser, which radiates infrared rays, is suitable. In a case where an infrared laser is used, an output is preferably 100 mW or more, an exposure time per pixel is preferably 20 microseconds or less, and an amount of irradiation energy is preferably 10 $mJ/cm^2$ to 300 $mJ/cm^2$. In addition, for the purpose of reducing the exposure time, it is preferable to use a multi-beam laser device. The exposure mechanism may be any one of an internal drum system, an external drum system, a flat bed system, or the like.

In the exposing step, the temporary support may be peeled off from the photosensitive layer and then the pattern exposure may be performed, or before peeling off the temporary support, the pattern exposure may be performed through the temporary support and then the temporary support may be peeled off. In a case where the temporary support is peeled off before the exposure, the mask may be exposed in contact with the photosensitive layer, or may be exposed in close proximity without contact. In a case where the temporary support is exposed without being peeled off, the mask may be exposed in contact with the temporary support, or may be exposed in close without contact. In order to prevent mask contamination due to contact between the photosensitive layer and the mask and to avoid an influence of foreign matter adhering to the mask on the exposure, it is preferable to perform the pattern exposure without peeling off the temporary support. As the exposure method, in a case of a contact exposure, a contact exposure method can be appropriately selected and used, and in a case of a noncontact exposure, a proximity exposure method, a lens-based or mirror-based projection exposure method, a direct exposure method using an exposure laser, or the like can be appropriately selected and used. In a case of the lens-based or mirror-based projection exposure, an exposure machine having an appropriate numerical aperture (NA) of the lens can be used depending on the required resolution and focal depth. In a case of the direct exposure method, drawing may be performed directly on the photosensitive layer, or reduced projection exposure may be performed on the photosensitive layer through a lens. In addition, the exposure may be performed not only in an atmosphere but also under reduced pressure or vacuum, and the exposure may be exposed by interposing a liquid such as water between the light source and the photosensitive layer.

Peeling Step

The manufacturing method of the light shielding material may include a peeling step of peeling off the temporary support between the bonding step and the exposing step or between the exposing step and the developing step.

The peeling method of the temporary support is not particularly limited, and the same mechanism as the cover film peeling mechanism described in paragraphs 0161 and 0162 of JP2010-072589A can be used.

Developing Step

The manufacturing method of the light shielding material preferably includes, after the above-described exposing step, a step (developing step) of developing the exposed photosensitive layer to form the resin layer.

In a case where the photosensitive transfer material includes the thermoplastic resin layer and the functional layer or the water-soluble resin layer, in the developing step, the thermoplastic resin layer and the functional layer or the water-soluble resin layer in the non-exposed portion are also removed together with the photosensitive layer in the non-exposed portion. In addition, in the developing step, the thermoplastic resin layer and the functional layer or the water-soluble resin layer of the exposed portion may also be removed in a form of being dissolved or dispersed in a developer.

The exposed photosensitive layer in the developing step can be developed by using a developer.

The developer is not particularly limited as long as it can remove the non-image area (non-exposed portion) of the photosensitive layer, and for example, a known developer such as developers described in JP1993-72724A (JP-H5-72724A) can be used.

As the developer, an alkali aqueous solution-based developer including a compound having a pKa of 7 to 13 at a concentration of 0.05 mol/liter (L) to 5 mol/L is preferable. The developer may contain a water-soluble organic solvent and/or a surfactant.

Examples of an alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

Preferred examples of the developer also include developers described in paragraph 0194 of WO2015/093271A. Examples of a development method suitably used include development methods described in paragraph 0195 of WO2015/093271A.

The developing method is not particularly limited, and may be any of puddle development, shower development, shower and spin development, or dip development. The shower development is a development treatment for removing the non-exposed portion by spraying the developer on the photosensitive layer after exposure with a shower.

After the developing step, it is preferable to spray a washing agent with a shower and rub with a brush to remove the developing residue.

A liquid temperature of the developer is not particularly limited, but is preferably 20° C. to 40° C.

Protective Film Peeling Step

In a case where the photosensitive transfer material includes a protective film, the manufacturing method of the light shielding material preferably includes a step of peeling off the protective film from the photosensitive transfer material. A method of peeling off the protective film is not particularly limited, and a known method can be adopted.

Post-Exposing Step and Post-Baking Step

The manufacturing method of the light shielding material may include a step (post-exposing step) of exposing the resin layer obtained by the above-described developing step and/or a step (post-baking step) of heating the resin layer.

In a case where both of the post-exposing step and the post-baking step are included, it is preferable that the post-baking is performed after the post-exposure.

Other Steps

The manufacturing method of the light shielding material may include any step (other steps) other than the above-described steps. Examples thereof include the following steps, but the other steps are not limited to these steps.

In addition, examples of the exposing step, developing step, and other steps adoptable to the manufacturing method of the circuit wiring include steps described in paragraphs 0035 to 0051 of JP2006-23696A.

Further, examples of the other steps include a step of reducing a visible light reflectivity, which is described in paragraph 0172 of WO2019/022089A, and a step of forming a new conductive layer on an insulating film, which is described in paragraph 0172 of WO2019/022089A, but the other steps are not limited to these steps.

Step of Reducing Visible Light Reflectivity

The manufacturing method of the light shielding material may include a step of performing a treatment for reducing visible light reflectivity of a part or all of a plurality of conductive layers of the base material.

Examples of the treatment for reducing the visible light reflectivity include an oxidation treatment. In a case where the substrate has a conductive layer containing copper, the visible light reflectivity of the conductive layer can be reduced by oxidizing copper to copper oxide and blackening the conductive layer.

The treatment for reducing the visible light reflectivity is described in paragraphs 0017 to 0025 of JP2014-150118A, and paragraphs 0041, 0042, 0048, and 0058 of JP2013-206315A, and the contents of these publications are incorporated in the present specification.

Step of Forming Insulating Film and Step of Forming New Conductive Layer on Surface of Insulating Film The manufacturing method of the light shielding material also preferably includes a step of forming an insulating film on the surface of the circuit wiring and a step of forming a new conductive layer on the surface of the insulating film.

By the above-described steps, a second electrode pattern insulated from the first electrode pattern can be formed.

Examples of the step of forming the insulating film is not particularly limited, and examples thereof include a known method of forming a permanent film. In addition, an insulating film having a desired pattern may be formed by photolithography using a photosensitive material having an insulating property.

The step of forming a new conductive layer on the insulating film is not particularly limited, and for example, a new conductive layer having a desired pattern may be formed by photolithography using a photosensitive material having a conductivity.

As the manufacturing method of the light shielding material, it is also preferable to use a substrate having a plurality of conductive layers on both surfaces of the substrate and sequentially or simultaneously form a circuit on the conductive layers formed on both surfaces of the substrate. With such a configuration, it is possible to form a circuit wiring in which a first conductive pattern is formed on one surface of the substrate and a second conductive pattern is formed on the other surface. In addition, it is also preferable to form the circuit wiring having such a configuration from both surfaces of the substrate by the roll-to-roll.

LED Array

An LED array according to an embodiment of the present disclosure includes the light shielding material according to the embodiment of the present disclosure.

In addition, the LED array according to the embodiment of the present disclosure may be an array of two or more LEDs or LED elements.

A shape of the array of LEDs or LED elements in the LED array according to the embodiment of the present disclosure is not particularly limited, and LEDs or LED elements can be arranged in any shape as desired, such as a linear shape, a curved shape, a cross shape, a lattice shape, a circular shape, an elliptical shape, a star shape, and an indefinite shape.

It is sufficient that he number of LEDs or LED elements in the LED array according to the embodiment of the present disclosure is 2 or more, and may be appropriately selected as desired, for example, 10 to 1,000,000.

In addition, a size and shape of the LED array according to the embodiment of the present disclosure are not particularly limited, and can be appropriately selected as desired.

Further, a size and shape of the LEDs or the LED elements in the LED array according to the embodiment of the present disclosure are not particularly limited, and can be appropriately selected as desired.

A color of the LEDs or the LEDs elements in the LED array according to the embodiment of the present disclosure is not particularly limited, and examples thereof include red, blue, and green. The LED array according to the embodiment of the present disclosure may be a monochromatic LED array, an LED array having two or more colors, or a white LED array having red, blue, and green LEDs or LED elements.

Electronic Apparatus

An electronic apparatus according to an embodiment of the present disclosure includes the LED array according to the embodiment of the present disclosure.

The electronic apparatus according to the embodiment of the present disclosure is not particularly limited and can be used for a known electronic apparatus using an LED array, and examples thereof include a lighting device, an exposure light source, a sensor, and a display.

EXAMPLES

Hereinafter, the embodiments of the present invention will be more specifically described with reference to Examples. The materials, amounts to be used, proportions, treatment contents, treatment procedures, and the like shown in Examples can be appropriately modified as long as the modifications do not depart from the spirit of the embodiments of the present invention. Therefore, the scope of the embodiments of the present invention is not limited to the following specific examples. "part" and "%" are based on mass unless otherwise specified.

Examples 1 to 27 and Comparative Example 1

Preparation of Composition for Forming Photosensitive Layer

Photosensitive layer coating liquids 1 to 18 (compositions for forming a photosensitive layer) were prepared by stirring and mixing components according to formulations shown in Table 1 below. Details of compounds shown in Table 1 and contents thereof are shown below.

TABLE 1

| | | Photosensitive layer coating liquid 1 | Photosensitive layer coating liquid 2 | Photosensitive layer coating liquid 3 | Photosensitive layer coating liquid 4 | Photosensitive layer coating liquid 5 |
|---|---|---|---|---|---|---|
| Pigment dispersion liquid | Red pigment dispersion liquid 1 | 4.80 | 6.60 | 9.90 | 13.20 | 16.50 |
| | Blue pigment dispersion liquid 1 | 4.80 | 6.60 | 9.90 | 13.20 | 16.50 |
| | Green pigment dispersion liquid 1 | — | — | — | — | — |
| | Black pigment dispersion liquid 1 | — | — | — | — | — |
| | Black pigment dispersion liquid 2 | — | — | — | — | — |
| Polymerizable compound | BPE-500 | 3.18 | 2.95 | 2.53 | 2.11 | 1.69 |
| | DPHA | — | — | — | — | — |
| | A-DCP | — | — | — | — | — |
| Alkali-soluble resin | Polymer 1 | 21.71 | 18.96 | 13.93 | 8.89 | 3.86 |
| | Polymer 2 | — | — | — | — | — |
| Polymerization initiator | [OI-5] | 0.96 | 0.89 | 0.76 | 0.63 | 0.51 |
| | [OS-4] | — | — | — | — | — |
| Infrared absorber | IR-8 | 0.32 | 0.30 | 0.25 | 0.21 | 0.17 |
| | IR-786 Perchlorate | — | — | — | — | — |
| Additive | N-Phenylglycine | 0.02 | 0.02 | 0.02 | 0.02 | 0.02 |
| | TDP-G | 0.04 | 0.04 | 0.04 | 0.04 | 0.04 |
| | Leuco Crystal Violet | 0.06 | 0.06 | 0.06 | 0.06 | 0.06 |
| Solvent | MMPG-Ac | 24.72 | 24.19 | 23.22 | 22.25 | 21.26 |
| | MEK | 39.27 | 39.27 | 39.27 | 39.27 | 39.27 |
| Surfactant | F-552 | 0.12 | 0.12 | 0.12 | 0.12 | 0.12 |
| Total (part by mass) | | 100.00 | 100.00 | 100.00 | 100.00 | 100.00 |
| Pigment concentration (% by mass) | | 12% | 16% | 25% | 33% | 41% |

| | | Photosensitive layer coating liquid 6 | Photosensitive layer coating liquid 7 | Photosensitive layer coating liquid 8 | Photosensitive layer coating liquid 9 | Photosensitive layer coating liquid 10 |
|---|---|---|---|---|---|---|
| Pigment dispersion liquid | Red pigment dispersion liquid 1 | 13.20 | 13.20 | 13.20 | 13.20 | 11.90 |
| | Blue pigment dispersion liquid 1 | 13.20 | 13.20 | 13.20 | 13.20 | 11.90 |
| | Green pigment dispersion liquid 1 | — | — | — | — | 2.60 |
| | Black pigment dispersion liquid 1 | — | — | — | — | — |
| | Black pigment dispersion liquid 2 | — | — | — | — | — |
| Polymerizable compound | BPE-500 | 2.11 | 2.11 | — | 2.11 | 2.11 |
| | DPHA | — | — | 2.11 | — | — |
| | A-DCP | — | — | — | — | — |

TABLE 1-continued

| | | | | | | |
|---|---|---|---|---|---|---|
| Alkali-soluble | Polymer 1 | 8.89 | 8.89 | 8.89 | — | 8.89 |
| resin | Polymer 2 | — | — | — | 10.76 | — |
| Polymerization | [OI-5] | — | 0.63 | 0.63 | 0.63 | 0.63 |
| initiator | [OS-4] | 0.63 | — | — | — | — |
| Infrared | IR-8 | 0.21 | — | 0.21 | 0.21 | 0.21 |
| absorber | IR-786 Perchlorate | — | 0.21 | — | — | — |
| Additive | N-Phenylglycine | 0.02 | 0.02 | 0.02 | 0.02 | 0.02 |
| | TDP-G | 0.04 | 0.04 | 0.04 | 0.04 | 0.04 |
| | Leuco Crystal Violet | 0.06 | 0.06 | 0.06 | 0.06 | 0.06 |
| Solvent | MMPG-Ac | 22.25 | 22.25 | 22.25 | 20.38 | 22.25 |
| | MEK | 39.27 | 39.27 | 39.27 | 39.27 | 39.27 |
| Surfactant | F-552 | 0.12 | 0.12 | 0.12 | 0.12 | 0.12 |
| Total (part by mass) | | 100.00 | 100.00 | 100.00 | 100.00 | 100.00 |
| Pigment concentration (% by mass) | | 33% | 33% | 33% | 33% | 33% |

| Photosensitive layer coating liquid 11 | Photosensitive layer coating liquid 12 | Photosensitive layer coating liquid 13 | Photosensitive layer coating liquid 14 | Photosensitive layer coating liquid 15 | Photosensitive layer coating liquid 16 | Photosensitive layer coating liquid 17 | Photosensitive layer coating liquid 18 |
|---|---|---|---|---|---|---|---|
| 10.00 | 16.40 | 13.20 | 13.20 | 13.20 | 13.20 | — | — |
| 16.40 | 10.00 | 13.20 | 13.20 | 13.20 | 13.20 | — | — |
| — | — | — | — | — | — | — | — |
| — | — | — | — | — | — | 33.00 | — |
| — | — | — | — | — | — | — | 16.00 |
| 2.11 | 2.11 | 2.11 | 2.11 | 1.52 | — | 2.13 | 3.03 |
| — | — | — | — | 1.01 | 1.01 | — | — |
| — | — | — | — | — | 1.52 | — | — |
| 8.89 | 8.89 | 8.89 | 8.89 | 8.89 | 8.89 | 16.33 | 20.08 |
| — | — | — | — | — | — | — | — |
| 0.63 | 0.63 | 0.32 | 0.16 | 0.63 | 0.63 | 0.63 | 0.91 |
| — | — | — | — | — | — | — | — |
| 0.21 | 0.21 | 0.11 | 0.06 | 0.21 | 0.21 | 0.21 | 0.30 |
| — | — | — | — | — | — | — | — |
| 0.02 | 0.02 | 0.02 | 0.02 | 0.02 | 0.02 | 0.02 | 0.02 |
| 0.04 | 0.04 | 0.04 | 0.04 | 0.04 | 0.04 | 0.04 | 0.04 |
| 0.06 | 0.06 | 0.06 | 0.06 | 0.06 | 0.06 | 0.06 | 0.06 |
| 22.25 | 22.25 | 22.66 | 22.87 | 22.25 | 22.25 | 8.19 | 20.02 |
| 39.27 | 39.27 | 39.27 | 39.27 | 39.27 | 39.27 | 39.27 | 39.27 |
| 0.12 | 0.12 | 0.12 | 0.12 | 0.12 | 0.12 | 0.12 | 0.12 |
| 100.00 | 100.00 | 100.00 | 100.00 | 100.00 | 100.00 | 100.00 | 99.85 |
| 33% | 33% | 33% | 33% | 33% | 33% | 34% | 20% |

In addition, the details of the compounds shown in Table 1 are shown below.

Red pigment dispersion liquid 1: red pigment dispersion liquid 1 prepared by the following method Blue pigment dispersion liquid 1: blue pigment dispersion liquid 1 prepared by the following method Green pigment dispersion liquid 1: green pigment dispersion liquid 1 prepared by the following method Black pigment dispersion liquid 1: IRBK-0001 (manufactured by TOKUSHIKI CO., Ltd., containing near-infrared light transmitting organic pigment, pigment concentration: 16%, additive: 5%, PGMEA solution)

Black pigment dispersion liquid 2: FDK-017 (manufactured by TOKYO PRINTING INK MFG CO., LTD., containing carbon black, pigment concentration: 20%, additive: 7%, PGMEA solution); primary particle diameter of black pigment: 35 nm BPE-500:2,2-bis(4-(methacryloxypentethoxy)phenyl) propane, manufactured by Shin-Nakamura Chemical Co., Ltd.

DPHA: dipentaerythritol hexaacrylate, KAYARAD DPHA manufactured by Nippon Kayaku Co., Ltd.

A-DCP: tricyclodecane dimethanol diacrylate, manufactured by Shin-Nakamura Chemical Co., Ltd.

Polymer 1: PGMEA solution of benzyl methacrylate/methacrylic acid copolymer (70 mol %/30 mol %, Mw: 12,000, acid value: 113 mgKOH/g, concentration of solid contents: 37.8%)

Polymer 2: P-3 shown below

[OI-5]: [OI-5] described above

[OS-4]: [OS-4] described above

IR-8: IR-8 described above (oxidation potential: 0.35 V vs. SCE)

IR-786 Perchlorate: compound shown below (oxidation potential: 0.53 V vs. SCE)

N-phenylglycine: manufactured by Tokyo Chemical Industry Co., Ltd.

TDP-G: phenothiazine, manufactured by Kawaguchi Chemical Industry Co., LTD.

Leuco Crystal Violet: manufactured by Tokyo Chemical Industry Co., Ltd.

MMPG-Ac: propylene glycol monomethyl ether acetate (manufactured by Showa: Denko K.K.)

MEK: methyl ethyl ketone (manufactured by SANKYO CHEMICAL CO., LTD.)

F-552: fluorine-based surfactant, MEGAFACE F552, manufactured by DIC Corporation IR-786 perchlorate

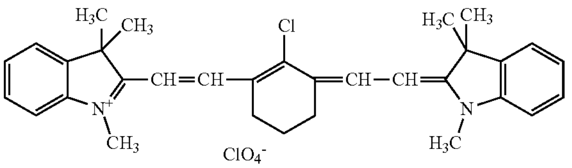

Preparation of Red Pigment Dispersion Liquid 1

A pigment, a dispersing agent, a dispersion aid, a binder resin, and a solvent described below were mixed. After mixing 80% of the volume of the dispersion container thereto with zirconia beads (average particle diameter: 0.3 mm), the mixture was filled in a picomill dispersion container and dispersed at a retention time (RT) of 6 min to prepare the red pigment dispersion liquid 1.

Composition of Red Pigment Dispersion Liquid 1

C. I. Pigment Red 254:100 parts by mass

DisperBYK-2000 (dispersing agent manufactured by BYK): 33 parts by mass

Acrylic resin (copolymer of benzyl methacrylate/methacrylic acid in a molar ratio of 70/30, weight-average molecular weight (Mw): 12,000, acid value: 113 mgKOH/g, propylene glycol monomethyl ether acetate (PGMEA) solution having a concentration of solid contents of 40%): 125 parts by mass PGMEA: 242 parts by mass Preparation of Blue Pigment Dispersion Liquid 1

The blue pigment dispersion liquid 1 was prepared in the same manner as the preparation of the red pigment dispersion liquid 1, except that C. I. Pigment Blue 15:6 was used instead of C. I. Pigment Red 254.

Preparation of Green Pigment Dispersion Liquid 1

The green pigment dispersion liquid 1 was prepared in the same manner as the preparation of the red pigment dispersion liquid 1, except that C. I. Pigment Green 58 was used instead of C. I. Pigment Red 254.

Production of P-3

According to the following method, a solution in which a solid content of a polymer P-3 was 36.2% by mass was prepared as a P-3 solution. The polymer P-3 is a resin shown below, and is also an alkali-soluble resin. 113.5 g of propylene glycol monomethyl ether was charged into a flask and heated to 90° C. under a nitrogen stream. To this liquid, a solution in which 172 g of styrene, 4.7 g of methyl methacrylate, and 112.1 g of methacrylic acid had been dissolved in 30 g of propylene glycol monomethyl ether and a solution in which 27.6 g of a polymerization initiator V-601 (manufactured by FUJIFILM Wako Pure Chemical Corporation) had been dissolved in 57.7 g of propylene glycol monomethyl ether was simultaneously added dropwise over 3 hours. After the dropwise addition, 2.5 g of V-601 was added three times every hour. Thereafter, the reaction was continued for another 3 hours. Thereafter, the reaction solution was diluted with 160.7 g of propylene glycol monomethyl ether acetate and 233.3 g of propylene glycol monomethyl ether. The reaction solution was heated to 100° C. under an air stream, and 1.8 g of tetraethylammonium bromide and 0.86 g of p-methoxyphenol were added thereto. 71.9 g of glycidyl methacrylate (Blemmer GH manufactured by NOF Corporation) was added dropwise thereto over 20 minutes. The reaction was continued at 100° C. for 7 hours to obtain a solution of the polymer P-3. The concentration of solid contents of the obtained solution was 36.3%. For the polymer P-3, the weight-average molecular weight in terms of standard polystyrene in GPC was 18000, the dispersity was 2.3, and the acid value was 124 mgKOH/g. The amount of residual monomer measured by gas chromatography was less than 0.1% by mass with respect to the solid content of the polymer P-3 in any of the monomers. The structure of the polymer P-3 is shown below. The molar ratio of the repeating units in the formula was 55.1:26.5:1.6:16.8 in the order from the repeating unit on the left side.

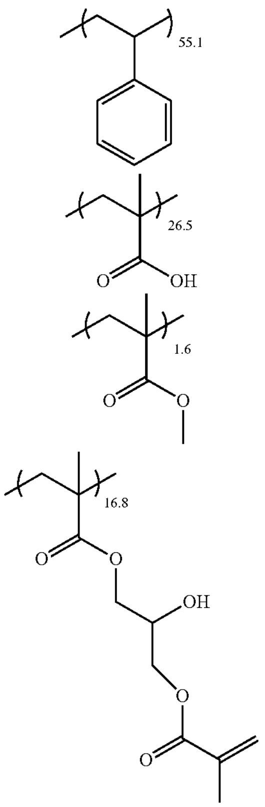

Production 1 of Photosensitive Transfer Material (Examples 1 to 23 and Comparative Example 1)

A coating liquid for a thermoplastic (non-photosensitive) resin layer consisting of the following formulation H1 was applied to a temporary support of a polyethylene terephthalate film having a thickness of 25 μm using a slit-shaped nozzle, and dried to form a thermoplastic (non-photosensitive) resin layer.

Next, a coating liquid for a functional layer consisting of the following formulation P1 was applied to the thermoplastic (non-photosensitive) resin layer, and dried to obtain a functional layer. Further, the above-described composition for forming a photosensitive layer was applied to the functional layer, and dried to form a photosensitive layer.

By the method described above, a thermoplastic (non-photosensitive) resin layer having a dry film thickness of 6.0 μm, a functional layer having a dry film thickness of 1.3 μm, and a photosensitive layer having a thickness after drying described in Table 2 were provided on the temporary support, and finally, a protective film (polypropylene film having a thickness of 12 μm) was pressure-bonded to the surface of the photosensitive layer. In this way, each photosensitive transfer material having the temporary support, the thermoplastic (non-photosensitive) resin layer, the functional layer (oxygen-blocking film), the photosensitive layer, and the protective film was produced.

Production 2 of Photosensitive Transfer Material (Examples 24 and 25)

The above-described composition for forming a photosensitive layer was applied to a temporary support of a polyethylene terephthalate film having a thickness of 14 μm using a slit-shaped nozzle, and dried to form a photosensitive layer. Finally, a protective film (polypropylene film having a thickness of 12 μm) was pressure-bonded to the surface of the photosensitive layer. In this way, each photosensitive transfer material having the temporary support, the photosensitive layer including the photosensitive resin composition, and the protective film was produced.

Coating Liquid for Thermoplastic (Non-Photosensitive) Resin Layer: Formulation H1

Methanol: 11.1 parts

Propylene glycol monomethyl ether acetate: 6.36 parts

Methyl ethyl ketone: 52.4 parts

Methyl methacrylate/2-ethylhexyl acrylate/benzyl methacrylate/methacrylic acid copolymer (copolymerization compositional ratio (molar ratio)=55/11.7/4.5/28.8, weight-average molecular weight=100,000, glass transition temperature (Tg)≈70° C.): 5.83 parts Styrene/acrylic acid copolymer (copolymerization compositional ratio (molar ratio)=63/37, weight-average molecular weight=10,000, Tg≈100° C.): 13.6 parts 2,2-Bis[4-(methacryloxypolyethoxy)phenyl]propane (manufactured by Shin-Nakamura Chemical Co., Ltd.): 9.1 parts Fluorine-based surfactant (methyl ethyl ketone solution having a solid content of 30% by mass, DIC Corporation, MEGAFACE (registered trademark) F780F): 0.54 parts Coating liquid for functional layer: formulation P1

PVA 205 (polyvinyl alcohol, manufactured by Kuraray Co., Ltd., saponification degree=88%, polymerization degree 550): 32.2 parts Polyvinylpyrrolidone (manufactured by Ashland Japan., Co., Ltd., K-30): 14.9 parts Distilled water: 524 parts Methanol: 429 parts Measurement of Optical Performance The optical density, transmittance, and reflectivity were measured by the methods described above.

Evaluation of Dense Black Appearance (1) A photosensitive transfer film from which the protective film had been peeled off was bonded to a polyethylene terephthalate (PET) film having a thickness of 100 μm by a laminator (roll temperature: 100° C., linear pressure: 1.0 MPa, linear velocity: 0.5 m/min).

(2) The obtained laminate was pressure-defoamed for 30 minutes under the conditions of 0.6 MPa and 60° C. using an autoclave device.

(3) The transfer base material was fixed to a 0.3 mm-thick aluminum plate without peeling off the temporary support, and then using Trendsetter 3244VFS manufactured by CREO CO., LTD., which was equipped with a water-cooled 40 W infrared semiconductor laser, the photosensitive resin layer was exposed through a square hole pattern mask (changing stepwise from 10 μm to 100 μm on each side at 10 μm intervals) with an exposure amount at the condition of an output of 10 W.

(4) The temporary support was peeled off and the developed. As the development, a shower development was performed using a 1.0% by mass sodium carbonate aqueous solution at 25° C. The development time was 1.5 times the dissolution time of the non-exposed portion of the 1.0% by mass sodium carbonate aqueous solution at 25° C.

By the above-described method, (3) and (4) were repeated until one side of the resin pattern of the photosensitive resin composition corresponding to a 50 μm square hole pattern of the mask was exactly 50 μm.

(5) Thereafter, an exposure was performed at 400 mJ/cm$^2$ using a high pressure mercury lamp. Further, an oven treatment was performed at 150° C. for 30 minutes.

In the resist patterns obtained above, a black appearance of a portion without the square hole in a case where light of a three-wavelength fluorescent lamp was reflected from various directions and visually observed was evaluated according to the following standard.

A: black appeared at any angle.

B: there was an angle at which the light reflection could be seen faintly around the reflection of the fluorescent lamp.

Evaluation of Resist Shape

Angle with Base Material

In the resin patterns obtained in the evaluation of dense black appearance, a cross-sectional shape of the resin pattern of the square hole at a position of 50 μm on a side was observed using a scanning electron microscope (SEM), a curve constituting a tilt surface of a tilt portion was approximated to a straight line, and this straight line was defined as a tilt angle θ. As θ is closer to 90°, a rectangularity is excellent.

A: tilt angle was 80° or more and less than 100°.

B: tilt angle was 70° or more and less than 80°.

C: tilt angle was 60° or more and less than 70°.

D: tilt angle was less than 60°.

Evaluation of Patterning Properties

Development Residue

Among the resin patterns obtained by the evaluation of dense black appearance, the cross-sectional shape of the resin pattern of the square hole at a position where one side was 50 μm was observed using a scanning electron microscope (SEM), and a state of a residue near the base material was evaluated according to the following standard.

A: no development residue was found.

B: among 10 holes confirmed, 1 or 2 residues were confirmed.

C: among 10 holes confirmed, 3 or more residues were confirmed.

Linearity

To a polyethylene terephthalate (PET) film having a thickness of 100 μm, the photosensitive transfer material and a PET substrate with a copper layer were bonded by a vacuum laminator (manufactured by MCK, roll temperature: 110° C., linear pressure: 1.0 MPa, linear velocity: 0.5 m/min). The obtained laminate included at least the PET film, the photosensitive layer, and the temporary support in this order. The obtained laminate was pressure-defoamed for 0.5 hours under the conditions of 0.6 MPa and 60° C. using an autoclave device.

The transfer base material was fixed to a 0.3 mm-thick aluminum plate without peeling off the temporary support, and then using Trendsetter 3244VFS manufactured by CREO CO., LTD., which was equipped with a water-cooled 40 W infrared semiconductor laser, the photosensitive resin layer was exposed through a line-and-space pattern (Duty ratio was 1:1 and line width changed stepwise from 10 μm to 200 μm at 10 μm intervals) with an exposure amount at the condition of an output of 9 W.

The temporary support was peeled off and the developed. As the development, a shower development was performed using a 1.0% by mass sodium carbonate aqueous solution at 25° C. The development time was 1.5 times the dissolution time of the non-exposed portion of the 1.0% by mass sodium carbonate aqueous solution at 25° C.

By the above-described method, an exposure amount (hereinafter, referred to as a "standard exposure amount") at which the line width of the resin pattern corresponding to the 100 μm line-and-space pattern was exactly 100 μm was determined.

Next, with a sample obtained by exposing the photosensitive resin layer with the standard exposure amount, the resin pattern was observed using a scanning electron microscope (SEM), and a maximum value-minimum value of the line width (hereinafter, referred to as a "fluctuation value of the line width") was measured in a range of a length of 1,000 μm. Based on the fluctuation value of the line width, a linearity of the resin pattern was evaluated according to the following standard.

A: fluctuation value of the line width was less than 5 μm.

B: fluctuation value of the line width was 5 μm or more and less than 15 μm.

C: fluctuation value of the line width was 15 μm or more.

The evaluation results are summarized in Table 2.

TABLE 2

| | Photosensitive transfer material | Photosensitive layer: Coating liquid | Photosensitive layer: Layer thickness (μm) | Optical performance: 550 nm optical density | Optical performance: 830 nm transmittance | Resist shape: Angle with base material | Patterning properties: Linearity | Patterning properties: Development residue | Patterning properties: Dense black appearance |
|---|---|---|---|---|---|---|---|---|---|
| Example 1 | Photosensitive transfer material 1 | Photosensitive layer coating liquid 1 | 8.0 | 3.0 | 1.30% | A | B | A | A |
| Example 2 | Photosensitive transfer material 2 | Photosensitive layer coating liquid 1 | 12.0 | 4.5 | 0.14% | B | B | A | A |
| Example 3 | Photosensitive transfer material 3 | Photosensitive layer coating liquid 2 | 4.0 | 2.0 | 5.47% | A | A | A | B |
| Example 4 | Photosensitive transfer material 4 | Photosensitive layer coating liquid 2 | 8.0 | 4.0 | 0.28% | A | B | A | A |
| Example 6 | Photosensitive transfer material 6 | Photosensitive layer coating liquid 3 | 4.0 | 3.0 | 1.30% | A | A | A | A |
| Example 7 | Photosensitive transfer material 7 | Photosensitive layer coating liquid 4 | 2.0 | 2.0 | 5.50% | A | A | A | B |
| Example 8 | Photosensitive transfer material 8 | Photosensitive layer coating liquid 4 | 3.0 | 3.0 | 1.30% | A | A | A | A |
| Example 9 | Photosensitive transfer material 9 | Photosensitive layer coating liquid 4 | 4.0 | 4.0 | 0.30% | A | A | A | A |
| Example 10 | Photosensitive transfer material 10 | Photosensitive layer coating liquid 4 | 4.5 | 4.5 | 0.15% | A | A | A | A |
| Example 11 | Photosensitive transfer material 11 | Photosensitive layer coating liquid 4 | 4.7 | 4.7 | 0.12% | B | A | A | A |
| Example 12 | Photosensitive transfer material 12 | Photosensitive layer coating liquid 4 | 4.9 | 4.9 | 0.10% | C | A | A | A |
| Example 13 | Photosensitive transfer material 13 | Photosensitive layer coating liquid 5 | 3.0 | 4.5 | 0.45% | A | A | A | A |
| Example 14 | Photosensitive transfer material 14 | Photosensitive layer coating liquid 6 | 4.0 | 4.0 | 0.30% | B | A | A | A |
| Example 15 | Photosensitive transfer material 15 | Photosensitive layer coating liquid 7 | 4.0 | 4.0 | 0.30% | B | A | A | A |
| Example 16 | Photosensitive transfer material 16 | Photosensitive layer coating liquid 8 | 4.0 | 4.0 | 0.30% | A | B | B | A |
| Example 17 | Photosensitive transfer material 17 | Photosensitive layer coating liquid 9 | 4.0 | 4.0 | 0.30% | B | A | A | A |
| Example 18 | Photosensitive transfer material 18 | Photosensitive layer coating liquid 10 | 4.0 | 4.1 | 0.35% | A | A | A | A |
| Example 19 | Photosensitive transfer material 19 | Photosensitive layer coating liquid 11 | 4.0 | 4.0 | 0.42% | A | A | A | A |
| Example 20 | Photosensitive transfer material 20 | Photosensitive layer coating liquid 12 | 4.0 | 4.0 | 0.21% | A | A | A | A |
| Example 21 | Photosensitive transfer material 21 | Photosensitive layer coating liquid 13 | 4.0 | 4.0 | 1.83% | A | A | A | A |
| Example 22 | Photosensitive transfer material 22 | Photosensitive layer coating liquid 14 | 4.0 | 4.0 | 10.98% | A | A | A | A |
| Example 23 | Photosensitive transfer material 23 | Photosensitive layer coating liquid 15 | 4.0 | 4.0 | 0.30% | A | A | A | A |
| Example 24 | Photosensitive transfer material 24 | Photosensitive layer coating liquid 16 | 4.0 | 4.0 | 0.30% | A | B | B | A |
| Example 25 | Photosensitive transfer material 25 | Photosensitive layer coating liquid 1 | 12.0 | 4.5 | 0.14% | B | B | A | A |

TABLE 2-continued

| | | Photosensitive layer | | Optical performance | | Resist shape | Patterning properties | | |
|---|---|---|---|---|---|---|---|---|---|
| | | | Layer | 550 nm | | Angle | | | |
| | Photosensitive transfer material | Coating liquid | thickness (μm) | optical density | 830 nm transmittance | with base material | Linearity | Development residue | Dense black appearance |
| Example 26 | Photosensitive transfer material 26 | Photosensitive layer coating liquid 4 | 4.0 | 4.0 | 0.30% | A | A | A | A |
| Example 27 | Photosensitive transfer material 27 | Photosensitive layer coating liquid 17 | 4.0 | 3.3 | 0.30% | A | A | A | A |
| Comparative Example 1 | Photosensitive transfer material 28 | Photosensitive layer coating liquid 18 | 4.0 | 4.8 | <0.1% | D | C | A | A |

The photosensitive transfer materials of Examples 24 and 25 were photosensitive transfer materials which did not have the thermoplastic resin layer and the functional layer, which are interlayers.

As shown in Table 2, with the photosensitive transfer materials of Examples 1 to 27, compared to the photosensitive transfer material of Comparative Example 1, a pattern having excellent rectangularity could be obtained.

In addition, in a case where the photosensitive transfer materials of Examples 1, 2, 4, 5, and 7 to 27 were used, since the dense black appearance was excellent, particularly, a multiple image around the through-hole could be suppressed, the photosensitive transfer material could be suitably used for an LED array.

EXPLANATION OF REFERENCES

All publications, patent applications, and technical standards mentioned in this specification are herein incorporated by reference to the same extent as if each individual publication, patent application, or technical standard was specifically and individually indicated to be incorporated by reference.

What is claimed is:

1. A photosensitive transfer material comprising:
a temporary support; and
a transfer layer including a photosensitive layer,
wherein the photosensitive layer has infrared curing properties,
wherein a transmittance of the photosensitive layer to light having a wavelength of 830 nm is 0.1% or more,
wherein the transfer layer further includes a non-photosensitive thermoplastic resin layer,
wherein the non-photosensitive thermoplastic resin layer is included between the temporary support and the photosensitive layer, and
wherein the non-photosensitive thermoplastic resin layer contains a coloring agent B in which a maximal absorption wavelength in a wavelength range of 400 nm to 780 nm during color development is 450 nm or more, and the maximal absorption wavelength changes depending on an acid, a base, or a radical.

2. The photosensitive transfer material according to claim 1,
wherein an optical density of the photosensitive layer to light having a wavelength of 550 nm is 3.0 or more.

3. The photosensitive transfer material according to claim 1,
wherein the photosensitive layer includes a colorant that may include an organic pigment.

4. The photosensitive transfer material according to claim 1,
wherein the photosensitive layer includes an infrared absorber and a polymerization initiator.

5. The photosensitive transfer material according to claim 4,
wherein the infrared absorber is an infrared absorbing dye or a polymethine coloring agent.

6. The photosensitive transfer material according to claim 4,
wherein an oxidation potential of the infrared absorber is 0.45 V (vs. SCE) or less.

7. The photosensitive transfer material according to claim 4,
wherein the polymerization initiator is an onium salt compound that may be at least one compound selected from the group consisting of a sulfonium salt compound and an iodonium salt compound.

8. The photosensitive transfer material according to claim 4,
wherein the photosensitive layer further includes a polymerizable compound that may include a bifunctional polymerizable compound.

9. The photosensitive transfer material according to claim 8,
wherein a content of the bifunctional polymerizable compound is 50% by mass or more with respect to a total mass of the polymerizable compound.

10. The photosensitive transfer material according to claim 8,
wherein the polymerizable compound includes a monomer having a bisphenol A skeleton.

11. The photosensitive transfer material according to claim 1,
wherein the photosensitive layer includes a polymer having a crosslinkable group.

12. The photosensitive transfer material according to claim 1,
wherein the photosensitive transfer material is a photosensitive transfer material for an LED array.

13. The photosensitive transfer material according to claim 1,
wherein a leuco compound is included as the coloring agent B.

14. The photosensitive transfer material according to claim 1, further includes a functional layer between the temporary support or the thermoplastic resin layer and the photosensitive layer, and wherein the functional layer includes an oxygen-blocking film having an oxygen blocking function.

15. The photosensitive transfer material according to claim 1, wherein the photosensitive layer includes a red pigment and a blue pigment in combination, and a mass ratio of a content of the red pigment and a content of the blue pigment in the photosensitive layer is 1.5:1 to 1:1.5.

16. A light shielding material comprising:

a resin layer having a first surface, a second surface which is a surface opposite to the first surface, and through-holes which extend from the first surface to the second surface, the resin layer being a layer obtained by curing the photosensitive layer in the photosensitive transfer material according to claim 1, wherein a transmittance of the resin layer to light having a wavelength of 830 nm is 0.1% or more.

17. The light shielding material according to claim 16, wherein the through-holes are tiled in a thickness direction of the resin layer, and tilt angles formed by side surfaces of the through-holes and the first surface is 60° or more.

18. The light shielding material according to claim 16, wherein an average value of sizes of the through-holes in the first surface is 50 μm or less.

19. The light shielding material according to claim 16, wherein an optical density of the resin layer to light having a wavelength of 550 nm is 3.0 or more.

20. The light shielding material according to claim 16, wherein the light shielding material is a light shielding material for an LED array.

21. An electronic apparatus comprising:

the light shielding material according to claim 16.

22. An LED array comprising:

the light shielding material according to claim 20.

23. An electronic apparatus comprising:

the LED array according to claim 22.

* * * * *